(12) United States Patent
McArdle et al.

(10) Patent No.: US 12,471,391 B2
(45) Date of Patent: Nov. 11, 2025

(54) TWO-TERMINAL DEVICE

(71) Applicant: POWER ROLL LIMITED, Sunderland (GB)

(72) Inventors: Trevor McArdle, Sunderland (GB); Alexander John Topping, Sunderland (GB); Nicholas Kasch, Sunderland (GB)

(73) Assignee: POWER ROLL LIMITED, Sunderland (GB)

(*) Notice: Subject to any disclaimer, the term of this patent is extended or adjusted under 35 U.S.C. 154(b) by 0 days.

(21) Appl. No.: 18/765,026

(22) Filed: Jul. 5, 2024

(65) Prior Publication Data
US 2024/0363778 A1 Oct. 31, 2024

Related U.S. Application Data

(62) Division of application No. 17/912,019, filed as application No. PCT/GB2021/050710 on Mar. 23, 2021.

(30) Foreign Application Priority Data

Mar. 27, 2020 (GB) ...................... 2004533

(51) Int. Cl.
*H10F 19/75* (2025.01)
*H10F 19/10* (2025.01)
*H10F 71/00* (2025.01)

(52) U.S. Cl.
CPC ............. *H10F 19/75* (2025.01); *H10F 19/10* (2025.01); *H10F 71/00* (2025.01)

(58) Field of Classification Search
CPC ...................................................... H01L 31/47
See application file for complete search history.

(56) References Cited

U.S. PATENT DOCUMENTS

| 4,110,122 A | 8/1978 | Kaplow et al. |
| 2010/0132759 A1 | 6/2010 | Jia et al. |

(Continued)

FOREIGN PATENT DOCUMENTS

| CN | 110047964 A | 7/2019 |
| CN | 110311626 B | 3/2021 |

(Continued)

OTHER PUBLICATIONS

Japanese Patent Office, Notification of Reasons for Refusal for Japanese Application No. 2022-558287, Mar. 31, 2023, 5 pages.

(Continued)

*Primary Examiner* — Ryan S Cannon
(74) *Attorney, Agent, or Firm* — Husch Blackwell LLP

(57) ABSTRACT

There is provided a two-terminal device, including a substrate comprising a first cell having a first characteristic resistance, and a second cell, spaced apart from the first cell along the web direction of the substrate, having a second characteristic resistance; a first terminal and a second terminal, each terminal being formed towards or at opposing edges of the substrate across the transverse direction, and each terminal being in electrical communication with the first cell and the second cell; and a connecting portion, between the first cell and the second cell, the connecting portion having a third characteristic resistance; wherein the third characteristic resistance is greater than or equal to at least one of the first characteristic resistance and the second characteristic resistance. There is also provided a method of forming such a two-terminal device).

18 Claims, 21 Drawing Sheets

(56) References Cited

U.S. PATENT DOCUMENTS

| | | |
|---|---|---|
| 2010/0263712 A1 | 10/2010 | Ludowise et al. |
| 2010/0263713 A1 | 10/2010 | Ludowise |
| 2014/0305504 A1 | 10/2014 | Masuda et al. |
| 2015/0372176 A1 | 12/2015 | Topping |
| 2016/0141535 A1 | 5/2016 | Snaith et al. |
| 2018/0182908 A1 | 6/2018 | Topping |
| 2019/0088803 A1 | 3/2019 | Topping |
| 2019/0088806 A1 | 3/2019 | Topping |
| 2019/0088807 A1 | 3/2019 | Topping |

FOREIGN PATENT DOCUMENTS

| | | |
|---|---|---|
| DE | 202014002666 U1 | 7/2014 |
| EP | 3123524 B1 | 2/2020 |
| GB | 2487419 B | 12/2012 |
| GB | 2549132 A | 10/2017 |
| GB | 2549133 B | 2/2020 |
| GB | 2549134 B | 2/2020 |
| JP | S57157579 A | 9/1982 |
| JP | 2013135236 A | 7/2013 |
| JP | 2016508672 A | 3/2016 |
| JP | 2020501337 A | 1/2020 |
| WO | 2012108767 A2 | 8/2012 |
| WO | 2015145166 A1 | 10/2015 |
| WO | 2019030528 A1 | 2/2019 |
| WO | 2021191600 A1 | 9/2021 |

OTHER PUBLICATIONS

Office Action for Japanese Patent Application No. 2022-558287, Dated Aug. 29, 2023, 5 pages.

Search Report for Chilean Application No. 202202595, Mar. 5, 2024, 6 pages, National Institute of Industrial Property.

International Search Report for PCT/GB2021/050710, European Patent Office, Jun. 11, 2021, 4 pages.

Patents Act 1977: Combined Search and Examination Report under Sections 17 and 18(3) for Application No. GB2004533.2, United Kingdom Intellectual Property Office, Aug. 18, 2020, 8 pages.

Wong-Stringer et al., A flexible back-contact perovskite solar micromodule, Energy & Environmental Science, May 3, 2019, pp. 1928-1937, vol. 12, No. 6.

Duong et al., Optimal Bypass Diode Configuration for PV Arrays under Shading Influence, 2017 IEEE International Conference on Environment and Electrical Engineering and 2017 IEEE Industrial and Commercial Power Systems Europe (EEEIC / I&CPS Europe), Jun. 2017, 6 pages.

Notification of Reasons for Refusal for Japanese Patent Application No. 2024-090555, Mar. 5, 2025, 9 pages.

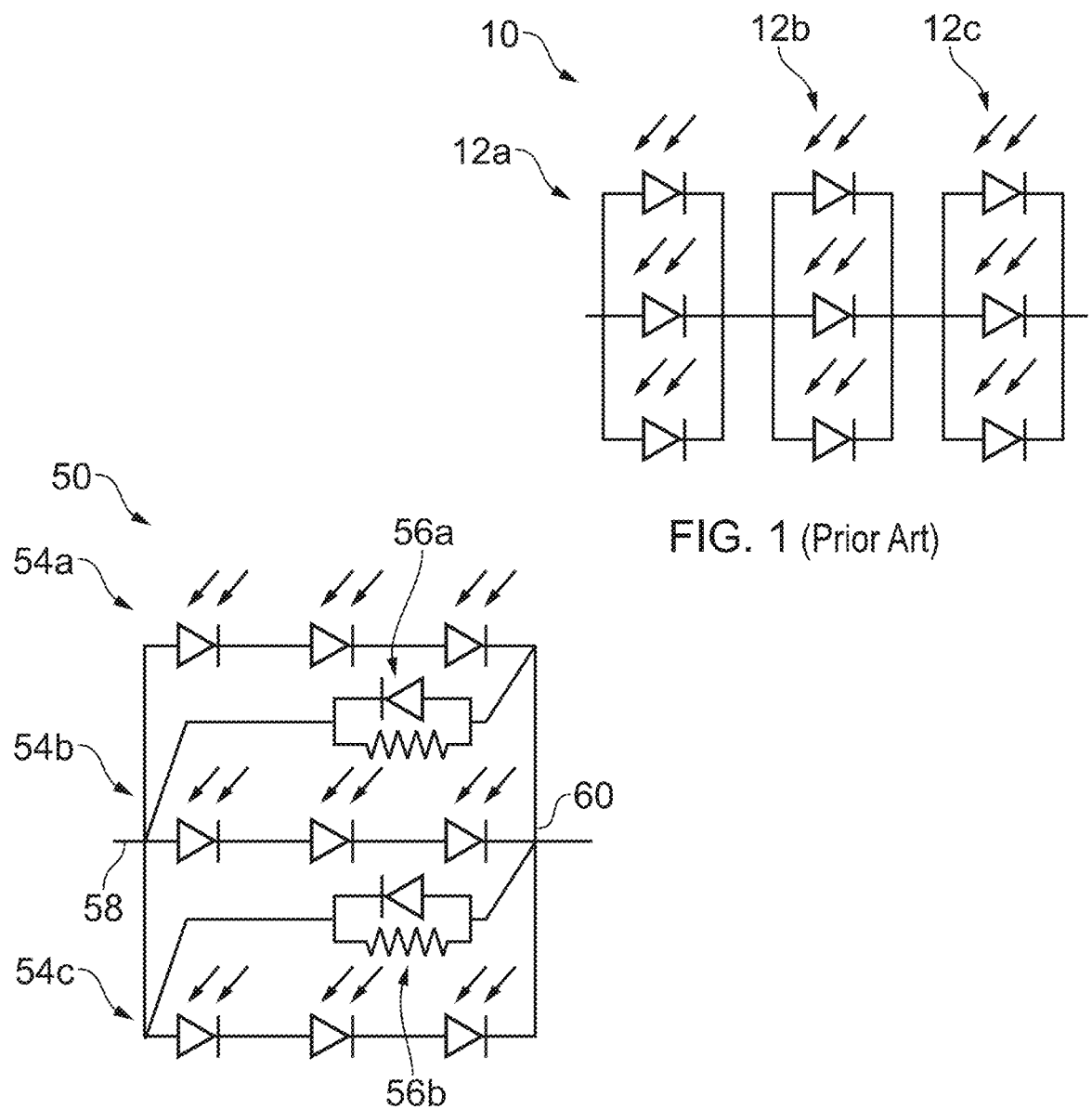
FIG. 1 (Prior Art)
FIG. 2(a)
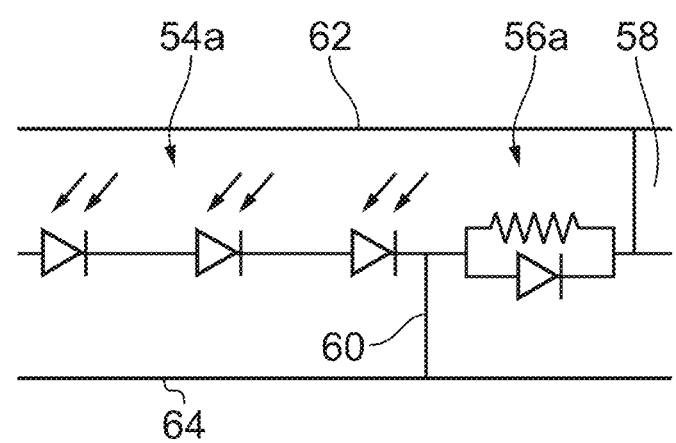
FIG. 2(b)

TWO-TERMINAL DEVICE

CROSS-REFERENCE TO RELATED APPLICATIONS

This application is a Divisional of and claims priority to U.S. patent application Ser. No. 17/912,019, filed on Sep. 15, 2022, to Trevor McArdle, entitled "A Two-Terminal Device," which is a national stage entry of PCT/GB2021/050710, filed on Mar. 23, 2021, to Trevor McArdle et al., entitled "A Two-Terminal Device," the entire disclosures of which are incorporated herein by reference.

FIELD OF INVENTION

The present invention relates to a two-terminal electronic device. In particular, the two-terminal device may be an optoelectronic device. The present invention also relates to a method of forming a two-terminal electronic device.

BACKGROUND OF INVENTION

A two-terminal device is an electrical component having two terminals, that is, a first terminal and a second terminal. A terminal is generally defined as an area, region or portion of the electrical component that allows the ingress or egress of electrical current to, or from, the electrical component. A two-terminal device includes devices such as a diode, for example a light-emitting diode (LED). A two-terminal device also includes devices such as an optoelectronic device, or photovoltaic device, a transistor, a phototransistor, a vertical-cavity surface-emitting laser (VCSEL), an energy storage device, or the like. As will be recognised by those skilled in the art, these are simply non-exhaustive examples of two-terminal devices.

In some examples, such as in optoelectronic technology, otherwise known as photovoltaics, an optoelectronic device produces electricity from light at the junction between two materials that are exposed to the light. Moreover, an optoelectronic device may produce light from the input of electricity. Typically, light used in optoelectronics is sunlight, and therefore photovoltaic is often referred to as solar photovoltaic. It is known to use semiconductors as the two materials. The semiconductor materials used exhibit a photovoltaic effect.

The semiconductor materials used are usually a p-type semiconductor material and an n-type semiconductor material. When these semiconductor materials are joined together, they form an interface therebetween often referred to as a p-n junction. Another known interface of semiconductor materials in known as a P-i-N, or PIN, junction. The p-n junction is found in most optoelectronic devices that use semiconductors. These optoelectronic devices include photovoltaic cells, solar photovoltaic cells, diodes, light-emitting diodes (LEDs) and transistors. The p-n junction can be thought of as the active site in which the generation or consumption of electrical energy occurs.

The optoelectronic device may be used as a device for generating electricity for immediate use or for storage purposes. Optoelectronic devices that are used for generating electricity for immediate use typically utilise a p-n junction having a semi-conductor therebetween. Optoelectronic devices that are used for generating electricity for storage are regarded as energy storage devices.

Existing two-terminal devices, specifically those used in optoelectronic technology, are currently relatively expensive methods of generating electricity. With increasing demands for sources of renewable energy, there is a drive to improve the efficiency of solar photovoltaic cells and to reduce costs associated with the manufacture and running of these devices. Also, existing solar photovoltaic cells remain relatively inefficient in comparison with other methods of generating electricity.

In an attempt to overcome such problems, grooved substrates have been developed for two-terminal devices, in particular, photovoltaic devices. A number of series of grooves are provided in parallel to one another, and each series of grooves is then connected in series. Such an example is illustrated in FIG. 1, which depicts a prior art device 10 including a first cell 12*a*, a second cell 12*b* and a third cell 12*c*. The first, second and third cells 12*a*, 12*b*, 12*c* may be photovoltaic cells as shown in FIG. 1. In this specific example, the first, second and third cells 12*a*, 12*b*, 12*c* comprise photodiodes. The photodiodes are first connected in parallel to one another, thus forming cells 12*a*, 12*b*, 12*c*, and then each photodiode, or each cell 12*a*, 12*b*, 12*c*, is connected in series to one another.

However, such a configuration provides the disadvantage that, in the event of an unintentional electrical short, a significant impact in the performance of the two-terminal device may be observed. Moreover, in conventional substrates, such as those illustrated in FIG. 1(*a*), a bypass diode (not shown) is typically needed to provide an electrical pathway around one or more of the cells 12*a*, 12*b*, 12*c*, in case a portion of the photodiodes are shaded, in use, such that the photodiodes in one or more cells 12*a*, 12*b*, 12*c* cannot convert light energy into electrical energy. That is, when a portion of the device is shaded, one or more cells 12*a*, 12*b*, 12*c* may be non-functional. If a portion of the device is shaded, the performance of the whole substrate is degraded and, in some examples, this may also cause damage to the substrate. Thus, bypass diodes are typically provided to mitigate these disadvantages by providing an alternative current path around any non-functional cells 12*a*, 12*b*, 12*c*.

One solution to this problem is to use an interdigitated grooved arrangement to connect sections of grooves in parallel with each other. However, such a configuration requires that each cell is to be wired together in series to provide a single module, which is commercially undesirable.

In an attempt to provide an improved solution, further grooved substrates for two-terminal devices have been developed. Such grooved substrates provide a number of series of grooves, each groove within a series of grooves being connected in series, and each series of grooves being connected in parallel or in series to one another. The adjacent series of grooves are electrically separated from one another by a delineation feature, such as a channel. The delineation feature typically transects, or intersects, one or more grooves of a first series of grooves at one end of the delineation feature, and one or more grooves of a second series of grooves at the other end of the delineation feature. In this way, once the grooves are coated and filled with appropriate materials to form a two-terminal device, the grooves within a series of grooves are electrically connected in series across the surface of the substrate, thereby allowing voltage addition across the machine direction of the substrate. Thus, by altering the number of grooves in a series of grooves, the output voltage of the two-terminal device can be controlled.

Moreover, the delineation feature electrically isolates adjacent series of grooves. First and second terminals of the two-terminal device are provided at opposing sides of the substrate, arranged to extract charge from each series of grooves. The first terminal is electrically connected to a first groove of a series of grooves and the second terminal in electrically connected to a last groove of the same series, Whilst such two-terminal devices having grooved substrates tend to be more efficient and less expensive to manufacture than other known two-terminal devices, such grooved substrates can be prone to manufacturing defects. In particular, during the manufacture of such grooved devices, the grooves are filled so that an electrical connection can be provided between each groove within a series of grooves. However, if such a step is carried out after the formation of the grooves the filling material also collects in the delineation feature, such as a channel. Oftentimes, unintentional collection of filling material in a channel occurs to such an extent that an electrical connection is provided across it, thus electrically connecting the adjacent series of grooves and causing an electrical short. This was previously thought of as being highly undesirable, as the efficiency of the device is often dramatically reduced. In an attempt to overcome such a problem, manufactures seek to mediate the amount of filling material collected within the delineation feature. However, this can be time consuming, expensive and, oftentimes, unsuccessful.

However, much to the surprise of the present inventors, it has been found that not only is it possible to commercially manufacture two-terminal devices having an electrical connection between adjacent parallel or series-connected cells, but in fact there are advantages of such two-terminal devices, as described further herein.

Therefore, it is an aim of the present invention to provide a two-terminal device that mitigates at least one or more of the aforementioned problems.

SUMMARY OF THE INVENTION

As used herein, the term "cell" is used to describe a component that provides electrical energy, and in particular converts one type of energy, for example light, chemical or the like, into electrical energy. The cell may include one or more grooves, optionally provided as series of grooves, as described herein. The cell may also include one or more connecting portion between grooves or series of grooves, as well as means to extract electrical charge from the grooves.

As used herein, the term "groove" is used to describe a depression, an indentation, an etch or the like in a substrate. The groove generally includes an elongated length, a width and a depth. The groove may be coated on its first and second face, and filled with a material, thereby providing an appropriate cell.

As used herein, the term "resistive element" is used to describe an element having a resistance. The resistance of the resistive element contributes to the third characteristic resistance. For example, a resistive element may impart an increased resistance to the connecting portion.

As used herein, the term "channel" is used to describe an example of a resistive element. The channel may take the form of a depression, an indentation, an etch or the like in a substrate. The channel generally includes an elongated length, a width and a depth, the width or the depth being greater than a depth of a groove.

As used herein, the term "aspect ratio" is used to describe a ratio between width and depth of a feature. The aspect ratio is presented as width:depth or width/depth.

In accordance with one aspect of the present invention, there is provided a two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges of the substrate across the transverse direction, and each terminal being in electrical communication with the first cell and the second cell;

a connecting portion, between the first cell and the second cell, the connecting portion having a third characteristic resistance;

wherein the third characteristic resistance is greater than or equal to at least one of the first characteristic resistance and the second characteristic resistance, such that an electrical charge from the first or second cell is extractable at the first terminal or the second terminal in preference to transferring between the first cell and the second cell across the connecting portion.

The two-terminal device may be any appropriate device having a first terminal and a second terminal. The two-terminal device may be an optoelectronic device. An optoelectronic device may be defined as a device that converts light energy into electrical energy and/or that converts electrical energy into light energy. The term light energy is used generally to define any wavelength of light within the electromagnetic spectrum. In some examples, the light energy may include UV light, visible light and/or infrared light. In some examples, the light energy may include electromagnetic radiation having a wavelength from 10 nm to 1 mm.

The substrate can be a flexible substrate. The flexible substrate can be composed of a web of flexible material. The substrate may have a transverse direction, that is a direction across the width of the substrate, and a web direction, that is a direction across an elongate length of the substrate. The web direction may be regarded as a longitudinal or a machine direction. The substrate may have a predetermined length, in the web direction, a predetermined width, in the transverse direction, and a predetermined depth.

The flexible substrate may be provided as a length of continuous flexible substrate. In some examples, the length of continuous flexible substrate is provided on a roll or a roll core. This provides roll-to-roll continuous manufacture, which provides a more cost and labour efficient manufacturing process. In some particular examples, the length of continuous flexible substrate is up to 6000 m, that is less than or equal to 6000 m.

The first cell and the second cell may be any appropriate electrical cell, that is, a device that is capable of converting one form of energy into electricity or electrical energy. The first cell and the second cell may be, independently, an optoelectronic cell, such as a solar photovoltaic cell. Alternatively, the first cell and the second cell may be, independently, a capacitor or a battery. The first cell, the second cell or both the first and second cell may include one or more grooves or series of grooves. Any combination thereof may be contemplated. The first cell and the second cell may be spaced apart along the web direction of the substrate or along the transverse direction of the substrate. The first terminal and the second terminal may be formed towards or at opposing edges of the substrate across the transverse direction, or may be formed across the web direction.

In some examples, the connecting portion may be formed across substantially all of, or all of, the region between the first cell and the second cell. That is, in some examples, the connecting portion may connect the first cell to the second cell along the web direction of the substrate. The connecting portion may provide electrical connectivity between the first cell and the second cell. Alternatively, the connecting portion may prevent electrical connectivity between the first cell and the second cell. In some examples, although the connecting portion may provide electrical connectivity between the first cell and the second cell, electrical charge preferably flows to the first terminal and the second terminal. That is, electrical charge is extracted or the like, in use, at the first terminal and the second terminal in preference to electrical charge transferring between the first cell and the second cell. This preference is generally a function of the third characteristic resistance with respect to the first characteristic resistance, the second characteristic resistance or both the first characteristic resistance and the second characteristic resistance.

Surprisingly, the inventors have found that the connecting portion, in particular resistive elements therein, acts as a reverse-biased diode in parallel with a resistor. In this way, although an electrical pathway is provided across the connecting portion, electrical charge from a cell is extractable at the terminals in preference to electrical charge transfer across the connecting portion.

The term characteristic resistance is used to define the resistance as a function of the voltage divided by the current at the maximum power point. The characteristic resistance may be defined as:

$$R_{Characteristic} = \frac{V_{Maximum\ Power}}{I_{Maximum\ Power}}$$

This provides the advantage that electrical shorts between the first cell and the second cell are prevented. In particular, manufacturing defects, such as the creation of electrical shorts between the first cell and the second cell, may be minimised. More particularly, since the third characteristic resistance is provided such that electrical charge is still extractable at the terminals, an improved manufacturing process may be provided, in which less attention may be taken to avoid creating electrical shorts during the manufacturing process. That is, providing the connecting portion to electrically connect the first and second cells may ensure that electrical shorts between the first cell and the second cell are prevented without the need for a user to intervene during the manufacturing process. Thus, a more efficient and/or reliable two-terminal device may be formed.

In certain embodiments, the third characteristic resistance is greater than at least one of the first characteristic resistance and the second characteristic resistance.

That is, the third characteristic resistance may be greater than the first characteristic resistance, the second characteristic resistance, or both the first and the second characteristic resistance.

In certain embodiments, the third characteristic resistance is at least two times, preferably at least five times, most preferably at least ten times, greater than at least one of the first characteristic resistance and the second characteristic resistance.

In some examples, the third characteristic resistance is from two times to one hundred times greater than at least one of the first characteristic resistance and the second characteristic resistance. In some examples, the third characteristic resistance is from two times to twenty times greater than at least one of the first characteristic resistance and the second characteristic resistance. In some examples, the third characteristic resistance is from five times to ten times greater than at least one of the first characteristic resistance and the second characteristic resistance. Any combination of ranges is contemplated herein. For example, the third characteristic resistance may be from two times, five times, ten times, or twenty times to five times, ten times, twenty times, or fifty times greater than at least one of the first characteristic resistance and the second characteristic resistance. Any integer therebetween is also contemplated. Moreover, the third characteristic resistance may be two times, five times, ten times, twenty times, fifty times or one hundred times greater than at least one of the first characteristic resistance and the second characteristic resistance.

That is, the third characteristic resistance may be at least two times greater than the first characteristic resistance, the second characteristic resistance, or both the first and the second characteristic resistance. In some examples, it may be preferable that the third characteristic resistance may be five times greater than the first characteristic resistance, the second characteristic resistance, or both the first and the second characteristic resistance. In some examples, it may be preferable that the third characteristic resistance may be ten times greater than the first characteristic resistance, the second characteristic resistance, or both the first and the second characteristic resistance. In some examples, it may be preferable that the third characteristic resistance may be twenty times greater than the first characteristic resistance, the second characteristic resistance, or both the first and the second characteristic resistance. In some examples, it may be preferable that the third characteristic resistance may be fifty times greater than the first characteristic resistance, the second characteristic resistance, or both the first and the second characteristic resistance. In some examples, it may be preferable that the third characteristic resistance may be one hundred times greater than the first characteristic resistance, the second characteristic resistance, or both the first and the second characteristic resistance.

This provides the advantage that the likelihood of providing an electrical short across the connecting portion during manufacturing is minimised. Thus, the performance of the two-terminal device may be improved. In particular, the two-terminal device may have a better efficiency and/or reliability.

In certain embodiments, the connecting portion comprises at least one resistive element.

That is, the substrate may comprise at least one resistive element between the first cell and the second cell, within the connecting portion.

In some embodiments, the at least one resistive element provides substantially some of, most of, or all of the third characteristic resistance. In some embodiments, each resistive element, in combination, provides substantially some of, most of, or all of the third characteristic resistance.

In some embodiments, an electron transfer path may be formed across the, or each of, or some of, the resistive element or elements within the connecting portion. In some embodiments, the electron transfer path is formed from between the first cell and the second cell across the, or each of, or all of, the resistive element or elements within the connecting portion.

This provides the advantage that the third characteristic resistance can be modified as a function of structural properties of the at least one resistive element. For example, the third characteristic resistance can be modified as a function of the number, the size of, the structure, or the like, of the at least one resistance element. That is, the third characteristic resistance can be tuned as a function of the at least one resistive element.

In certain embodiments, the at least one resistive element comprises a peak of the substrate, a discontinuous non-insulating coating of the substrate, and/or a rutted portion of the substrate.

That is, in certain embodiments, the at least one resistive element may comprise, may include or may be one or more peaks of the substrate, that is, one or more projections, protrusions or the like formed in the substrate.

Alternatively, or additionally, the at least one resistive element may comprise, may include or may be a discontinuous non-insulating coating of the substrate. That is, a non-insulating coating may be deposited on the substrate to provide one or more resistive elements. The non-insulating coating may be discontinuous in that there is discontinuity across the substrate in the web direction. The discontinuous non-insulating coating may be formed by etching, or removing, a portion of another coating of the substrate to expose a non-insulating coating. The non-insulating coating may be discontinuous in that there is discontinuity across the substrate in the web direction. In some embodiments, the discontinuous non-insulating coating may be formed by masking of a region of the connecting portion during manufacture. Thus, a region of the connecting portion may be devoid of conductive material.

Alternatively, or additionally, the at least one resistive element may comprise, may include or may be a rutted portion of the substrate. That is, in certain embodiments, the connecting portion may have one or more rutted portions or regions. A rutted-potion may be defined as a jagged, uneven, undulated surface or the like.

In certain embodiments, the at least one resistive element comprises a channel in the substrate.

That is, the at least one resistive element may comprise, may include or may be formed as a channel in the substrate. A channel may be regarded as an indentation or etch or the like in the substrate.

This provides the advantage that the first cell and the second cell may be, or may substantially be, electrically separated from one another. In other words, the first cell and second cell are connected in series across the third characteristic resistance.

In certain embodiments, the channel comprises a rutted-base, a rutted-wall and/or a non-conductive electrical insulator material therein.

That is, in some examples, the channel may include a rutted-bottom or a rutted-base. That is, the bottom, or the base, of the channel may be rutted in that the bottom, or the base, is jagged, uneven, undulated or the like.

Additionally or alternatively, the channel may include a rutted-wall. That is, the wall of the channel may be rutted in that the wall is jagged, uneven, undulated or the like.

This provides the advantage that the electron transfer path between the first cell and the second cell may be increased, thus increasing the third characteristic resistance and preventing the creation of electrical shorts during the manufacturing process. Furthermore, the third characteristic resistance can be modified as a function of structural properties of the rutted-wall or rutted-bottom. For example, the third characteristic resistance can be modified as a function of the number, the size of, the structure, or the like, of the rutted-wall or the rutted-bottom. That is, the third characteristic resistance can be tuned as a function of the rutted-wall or rutted-bottom.

Additionally or alternatively, the channel may include a non-conductive electrical insulator material within the channel. The non-conductive electrical insulator may partially, mostly, or entirely fill the channel.

This provides the advantage that the electron transfer path between the first cell and the second cell may be increased, thus increasing the third characteristic resistance and preventing the creation of electrical shorts during the manufacturing process. Furthermore, the third characteristic resistance can be modified as a function of structural properties of the non-conductive electrical insulator material. For example, the third characteristic resistance can be modified as a function of the amount, the size, the structure, or the like, of the non-conductive electrical insulator material. That is, the third characteristic resistance can be tuned as a function of the non-conductive electrical insulator material.

In certain embodiments, the channel has an aspect ratio of at least 1:1.6.

That is, in certain embodiments, the channel has an aspect ratio that may be 1:1.6 or greater than 1:1.6, for example, 1:1.8, 1:1.9, 1:2.0 or the like. The term aspect ratio is used to define a ratio between the width and the depth. Thus, an aspect ratio of at least 1:1.6 may be regarded as a ratio of 1:1.6, referring to the width:depth of the channel, or greater. That is, the depth of the channel may be greater than the width of the channel.

This provides the advantage that the electron transfer path, from the first cell to the second cell, is lengthened, thus increasing the third characteristic resistance of the substrate. Thus, the third characteristic resistance of the substrate may be tuned.

In certain embodiments, the channel has an aspect ratio of at least 1.6:1.

This provides the advantage that the electron transfer path, across the width of the channel, is increased, thus reducing the likelihood that an electron may "hop" across the gap formed by the channel.

In certain embodiments, the first cell comprises at least one first groove and/or the second cell comprises at least one second groove.

That is, in certain embodiments, the first cell comprises at least one groove, or at least one first groove, the second cell comprises at least one groove, or at least one second groove, or the first cell comprises at least one groove, or at least one first groove, and the second cell comprises at least one groove, or at least one second groove.

The term "groove" may be used to define a depression, an indentation, an etch or the like in the substrate. The or each groove may differ to a channel in depth or aspect ratio. For example, a groove may have a depth that is smaller than a channel. For example, a groove may have an aspect ratio of approximately 1:1 or 1:1.1 or 1:1.2 or no greater than 1:1.2 or at least 1:1.2. For example, a groove may have an aspect ratio that is smaller than an aspect ratio of the channel.

In some examples, the at least one groove may comprise a single groove having parallel sections adjoined at opposing edges, thereby forming a substantially repeating S-shape.

This provides the advantage that the current of the two-terminal device may be controlled by the length of the at least one first groove and/or the length of the at least one second groove. In particular, voltage addition may occur along the web direction of the at least one first and/or second groove. Thus, by increasing or decreasing the length of the at least one first and/or second groove, the output voltage of the two-terminal device may be controlled. Thus, this may provide the advantage that the two-terminal device is tuneable.

In certain embodiments, the channel transects a portion of the at least one first groove and/or the at least one second groove.

That is, the channel may transect, or intersect, one part or portion of, some of, most of, or all of the at least one first groove, the at least one second groove, or both the at least one first groove and the at least one second groove.

This provides the advantage that the at least one first and/or second groove is electrically connected across the web direction, thus allowing for voltage addition, whilst electrically isolating the at least one first groove (i.e. the first cell) from the at least one second groove (i.e. the second cell).

In certain embodiments, the first cell comprises at least one first groove and/or the second cell comprises at least one second groove, and the channel transects a portion of the at least one first groove and/or a portion of the at least one second groove.

That is, in certain embodiments, the first cell comprises at least one groove, the second cell comprises at least one second groove, or both the first cell comprises at least one first groove and the second cell comprises at least one second groove. Further, in certain embodiments, the channel transects a portion of the at least one first groove, a portion of the at least one second groove, or both a portion of the at least one first groove and a portion of the at least one second groove. The channel may transect some of, part of, most of, or all of the at least one first groove and/or the at least one second groove.

In certain embodiments, the first cell comprises a first series of grooves and/or the second cell comprises a second series of grooves.

That is, in certain embodiments, the first cell comprises a first series of grooves, the second cell comprises a second series of grooves, or the first cell comprises a first series of grooves and the second cell comprises a second series of grooves.

The first series of grooves comprises any number of grooves, and may include a first terminal groove and a second terminal groove. Each groove of the first series of grooves may extend across the transverse direction of the substrate. Each groove of the first series of grooves may extend in parallel. Any number of grooves may be provided within the first series of grooves between a first terminal groove and a second terminal groove. The first terminal groove may terminate, or form a terminus of, the first series of grooves at one end, or a first end, for example a distal end. The second terminal groove may terminate, or form a terminus of, the first series of grooves at another end, or a second end, for example a proximal end. The distal end and the proximal end denote ends of the first series of grooves across the web direction of the substrate.

The second series of grooves comprises any number of grooves, and may include a first terminal groove and a second terminal groove. Each groove of the second series of grooves may extend across the transverse direction of the substrate. Each groove of the second series of grooves may extend in parallel. Each groove of the second series of grooves may be in parallel with each groove of the first series of grooves. Any number of grooves may be provided within the second series of grooves between a first terminal groove and a second terminal groove. The first terminal groove may terminate, or form a terminus of, the second series of grooves at one end, or a first end, for example a distal end. The second terminal groove may terminate, or form a terminus of, the second series of grooves at another end, or a second end, for example a proximal end. The distal end and the proximal end denote ends of the second series of grooves across the web direction of the substrate. The first terminal groove and the second terminal groove may each be proximal to the connecting portion of the substrate.

The second terminal groove of the first series of grooves and the first terminal of the second series of grooves may be separated by, or spaced apart by, the connecting portion. That is, there may exist a connecting portion between the first series of grooves and the second series of grooves.

The first series of grooves and the second series of grooves may have a first characteristic resistance and a second characteristic resistance, respectively. The third characteristic resistance may be greater than the first characteristic resistance, the second characteristic resistance, or both the first and the second characteristic resistance. The third characteristic resistance may be equal to, or substantially equal to, the first characteristic resistance the second characteristic resistance, or both the first and the second characteristic resistance.

In some embodiments, the at least one first groove and/or the at least one second groove may be coated with a first material on a first face, may be coated with a second material on a second face and/or may be at least partially, preferably mostly or entirely, filled with a third material.

That is, a first face of the at least one first groove and/or the at least one second groove, is coated with a first material. That is, a second face of the at least one first groove and/or the at least one second groove is coated with a second material. That is, the at least one first groove and/or the at least one second groove, are at least partially filled with a third material. In certain embodiments, the groove or grooves in question are filled with a third material to the extent that the third material contacts the first material and/or the second material deposited on the first face and/or the second face.

In some embodiments, a portion of the first series of grooves and/or a portion of the second series of grooves may be coated with a first material on a first face, may be coated with a second material on a second face and/or may be at least partially, preferably mostly or entirely, filled with a third material.

That is, a first face of a portion, preferably most of or all of, the first series of grooves and/or the second series of grooves is coated with a first material. That is, a second face of a portion, preferably most of or all of, the first series of grooves and/or the second series of grooves is coated with a second material. That is, a portion, preferably most of or all of, the first series of grooves and/or the second series of grooves are at least partially filled with a third material. In certain embodiments, the groove or grooves in question are filled with a third material to the extent that the third material contacts the first material and/or the second material deposited on the first face and/or the second face.

In certain embodiments, the first face and/or the second face of the respective groove or grooves are coated with the first material and/or the second material by an off-axis directional coating process.

This provides the advantage that certain faces of the groove or grooves can be selectively coated during manufacture.

In certain embodiments, the respective groove or grooves are at least partially filled by printing a third material onto the substrate.

This provide the advantage that the two-terminal device can be manufactured more efficiently.

In certain embodiments, the first material comprises a non-insulating material.

In some embodiments, the first material comprises a conductor material, a semiconductor material, an electron transfer layer, carbon-60 (C60, also known as Buckminsterfullerene), or a combination thereof. In some examples, there may be a plurality of materials. That is, there may be at least one first material. In some examples, the semiconductor material comprises a metal oxide. In some examples, the metal oxide comprises niobium oxide, that is Nb2O5, or tin oxide, that is tin (IV) oxide, SnO2. The metal oxide may be doped with an appropriate material.

In certain embodiments, the second material comprises a non-insulating material.

In some embodiments, the second material comprises a conductor material, a semiconductor material, a hole transport layer, or a combination thereof. In some examples, there may be a plurality of materials. That is, there may be at least one second material. In some examples, the semiconductor material comprises a metal oxide. In some examples, the metal oxide comprises nickel oxide, that is nickel (II) oxide or NiO, or copper oxide, that is copper (I) oxide, Cu2O. The metal oxide may be doped with an appropriate material.

In certain embodiments, the third material comprises a capacitor material, a supercapacitor material, a dielectric material or a perovskite structured material.

It may be preferable that the third material comprises a perovskite structured material. A perovskite structured material is a material having a crystal structure corresponding to calcium titanium oxide, CaTiO3 that is, having a general chemical structure of ABX3, for example XIIA2+VIB4+ X2-3, where A and B are two different cations of different sizes, and X is an anion that chemically bonds to both A and B.

In preferred examples, the perovskite structured material has an optical bandgap between 1.1 eV and 2.5 eV.

In preferred examples, the perovskite structured material comprises an organic lead trihalide, such as methylammonium lead trichloride, tribromide or triiodide, formamidinium lead trihalide, such as formamidinium lead trichloride, tribromide or triiodide, caesium tin trihalide, such as caesium tin triiodide, or another like organic lead or tin halide combination with the general chemical structure of ABX3 as outlined above.

Perovskites are generally earth abundant and thus are inexpensive. Furthermore, perovskites are suitable for low temperature processing and manufacturing, and are also suitable for solution processing, thereby providing manufacturing benefits. Moreover, perovskites are generally highly efficient in terms of converting light energy into electrical energy.

Any combination of the first material, the second material and the third material is contemplated herein.

In certain embodiments, the channel transects a portion of the first series of grooves and/or a portion of the second series of grooves.

That is, in certain embodiments in which there is at least one resistive element comprising a channel, the channel transects, or intersects or cuts across or the like, a portion, that is one of, some of, most of or all of, the first series of grooves, the second series of grooves, or both the first series of grooves and the second series of grooves.

In certain embodiments, the first cell comprises a first series of grooves and/or the second cell comprises a second series of grooves, wherein the channel transects a portion of the first series of grooves and/or a portion of the second series of grooves.

That is, in certain embodiments in which there is at least one resistive element comprising a channel, the channel transects, or intersects or cuts across or the like, a portion, that is one of, some of, most of or all of, the at least one first groove, the at least one second groove, or both the at least one first groove and the at least one second groove.

This provides the advantage that the portion of the first series of grooves and/or the portion of the second series of grooves is or are electrically connected across the web direction, thus allowing for voltage addition, whilst electrically isolating each series of grooves (i.e. the first cell and the second cell).

In certain embodiments, the channel transects the entirety of the first series of grooves and/or the entirety of the second series of grooves.

That is, in certain embodiments, the channel transects the entirety of, that is all of or each and every one of, the first series of grooves, the second series of grooves or both the first series of grooves and the second series of grooves.

In certain embodiments, the channel transects the first series of grooves and/or the second series of grooves towards an end of each groove.

That is, in certain embodiments in which there is at least one resistive element comprising a channel, the channel transects the first series of grooves, the second series of grooves, or both the first series of grooves and the second series of grooves, towards an end of each groove. In some examples, the channel transects the first series of grooves, the second series of grooves, or both the first series of grooves and the second series of grooves, at an end of each groove. In some examples, the channel transects the groove or grooves of the first series of grooves towards a proximal end of the respective groove or grooves, and the channel transects the groove or grooves of the second series of grooves towards a distal end of the respective groove or grooves.

In certain embodiments, the channel is substantially Z-shaped having a predetermined angle.

That is, the channel may form a substantial Z-shape, for example, when viewed from above. The Z-shaped channel may comprise a first region and a second region extending substantially in parallel. The first and second channel regions may extend along the web direction of the substrate. The first channel region may transect a portion of the first series of grooves. The second channel region may transect a portion of the second series of grooves. The channel forming a substantial Z-shape may further comprise a third region extending from one end of the first region to one end of the second region. The third region may extend in the web direction of the substrate. A first predetermined angle may be formed between the first region and the third region. A second predetermined angle may be formed between the second region and the third region. The first predetermined angle may be equal to the second predetermined angle. In such cases, the Z-shaped channel may be regarded as having a predetermined angle. Alternatively, the first predetermined angle may not be equal to the second predetermined angle, in which case the Z-shaped channel may be regarded as having a first predetermined angle and a second predetermined angle.

In some embodiments, the predetermined angle is, or the first and the second predetermined angles independently are, in the range of 0 degrees to 90 degrees, excluding 0 degrees and excluding 90 degrees. In some embodiments, the predetermined angle is, or the first and second predetermined angles are, in the range of 0 degrees to 180 degrees, excluding 0 degrees and 180 degrees. In some embodiments, the predetermined angle is, or the first and the second predetermined angles independently are, between 0 degrees and 90 degrees, that is, excluding 0 degrees and 90 degrees. In some embodiments, the predetermined angle is, or the first and the second predetermined angles independently are, in the range of 30 degrees to 60 degrees, including 30 degrees or 60 degrees or including 30 degrees and 60 degrees. In some embodiments, the predetermined angle is, or the first and the second predetermined angles independently are, between 30 degrees and 60 degrees, that is excluding 30 degrees and 60 degrees. In some embodiments, the predetermined angle is, or the first and the second predetermined angles independently are, in the range of 40 degrees to 50 degrees, including 40 degrees or 50 degrees or including 40 degrees and 50 degrees. In some embodiments, the predetermined angle is, or the first and the second predetermined angles independently are, between 40 degrees and 50 degrees, that is excluding 40 degrees and 50 degrees. It may be preferable that the predetermined angle is, or the first and the second predetermined angles independently are, approximately 45 degrees In some embodiments, the predetermined angle, or the first and the second predetermined angles independently, may have a lower limit of 1 degree, 5 degrees, 10 degrees, 15 degrees, 20 degrees, 25 degrees, 30 degrees, 35 degrees, 40 degrees, 45 degrees, 50 degrees, 55 degrees, 60 degrees, 65 degrees, 70 degrees, 75 degrees, 80 degrees, 85 degrees, 90 degrees, 95 degrees, 100 degrees, 105 degrees, 110 degrees, 115 degrees, 120 degrees, 125 degrees, 130 degrees, 135 degrees, 140 degrees, 145 degrees, 150 degrees, 155 degrees, 160 degrees, 165 degrees, 170 degrees, 175 degrees, or any integer therebetween. The upper limit of the predetermined angle, or the first and the second predetermined angles independently, may be 5 degrees, 10 degrees, 15 degrees, 20 degrees, 25 degrees, 30 degrees, 35 degrees, 40 degrees, 45 degrees, 50 degrees, 55 degrees, 60 degrees, 65 degrees, 70 degrees, 75 degrees, 80 degrees, 85 degrees, 90 degrees, 95 degrees, 100 degrees, 105 degrees, 110 degrees, 115 degrees, 120 degrees, 125 degrees, 130 degrees, 135 degrees, 140 degrees, 145 degrees, 150 degrees, 155 degrees, 160 degrees, 165 degrees, 170 degrees, 175 degrees, 179 degrees or any integer therebetween. As will be recognised by the person skilled in the art, any combination of lower limit and upper limit may be used.

In other embodiments, the predetermined angle, or the first and the second predetermined angles independently, may have an upper limit of greater than 90 degrees.

During the manufacture of two-terminal devices, an off-axis directional coating process is often used, in which one face of the grooves, and the delineation feature, is selectively coated. This is particularly useful for roll-to-roll manufacture of such two-terminal devices, as the manufacturing process can be carried out as a continuous process, rather than batch process. In such cases, the opposing face of the grooves casts a shadow onto the face to be coated, such that only a portion of the face to be coated can be coated by the incoming material. This is known as the "shadowing effect". Thus, the shadowing effect governs the amount of material deposited on a face of the grooves. The shadowing effect can be modified by increasing or decreasing the angle of the off-axis directional coating.

The Z-shaped channel provides the advantage that the shadowing effect, during manufacture of two-terminal devices using such substrates, is increased, thus less material is coated at the interface between a series of grooves and a channel. Thus, the characteristic resistance of the channel, and thus the third characteristic resistance of the substrate, may be increased during the manufacturing process. This may provide the advantage that electrical shorts are prevented across the channel, and thus between the first cell and the second cell.

In certain embodiments, the at least one resistive element comprises a plurality of channels in the substrate.

That is, the at least one resistive element may comprise, may include, or may be formed by, one, more than one, or two or more, or a multiple, or a plurality, of channels in the substrate. A channel may be formed as an indentation or etch or the like in the substrate. The resistive element may comprise a channel and another type of resistive element as described herein, for example, a non-conductive electrical insulating material, a rutted-bottom or rutted-wall of the channel, or the like.

This provides the advantage that if there is an electrical short across one channel, for example created during manufacturing, another channel is present to prevent electrical connection between the first cell and the second cell. Thus, redundancy is provided by way of multiple of resistive elements in the event that one unintentionally provides an electrical short thereacross. Thus, the likelihood of an electrical short being created during manufacture may be reduced. Thus, this may provide the advantage that a more efficient and/or reliable two-terminal device may be provided.

In certain embodiments, one or more of the plurality of channels comprises a rutted-base, a rutted-wall and/or a non-conductive electrical insulator material therein.

In certain embodiments, one of, some of, most of, or all of the plurality of channels includes a rutted-based, or a rutted-wall, or a non-conductive electrical insulator material therein, or any combination thereof.

In some examples, one of, some of, most of, or all of the plurality of channels may include a rutted-bottom or a rutted-base. That is, the bottom, or the base, of one of, some of, most of, or all of the plurality of channels may be rutted. More specifically, the bottom, or the base, is jagged, uneven, undulated or the like.

Additionally or alternatively one of, some of, most of, or all of the plurality of channels may include a rutted-wall. That is, the wall of one of, some of, most of, or all of the plurality of channels may be rutted in that the wall is jagged, uneven, undulated or the like.

Additionally or alternatively, one of, some of, most of, or all of the plurality of channels may include a non-conductive electrical insulator material within the channel. The non-conductive electrical insulator may partially, mostly, or entirely fill one of, some of, most of, or all of the plurality of channels This provides the advantage that the resistance of the, or each, channel, and thus the third characteristic resistance, is increased thereby reducing the likelihood of an electrical short being formed between the first cell and the second cell. Furthermore, the third characteristic resistance may be tuned based upon the number and type of resistive elements formed as part of, or within, the or each channel.

In certain embodiments, one or more of the plurality of channels has an aspect ratio of at least 1:1.6.

That is, in certain embodiments, one of, some of, most of, or all of the plurality of channels may have an aspect ratio that may be 1:1.6 or greater than 1:1.6, for example, 1:1.8, 1:1.9, 1:2.0 or the like. The term aspect ratio is used to define a ratio between the width and the depth. Thus, an aspect ratio of at least 1:1.6 may be regarded as a ratio of 1:1.6, referring to the width:depth of one of, some of, most of, or all of the plurality of channels, or greater. That is, the depth of one of, some of, most of, or all of the plurality of channels may be greater than the width of the respective channel.

This provides the advantage that, as the aspect ratio increases, the electron transfer path between the first cell and the second cell increases. That is, the electron transfer path between the first cell and the second cell increases as a function of the aspect ratio of the channel or channels. In this way, the third characteristic resistance increases as a function of the aspect ratio of the channel or channels. In this way, the third characteristic resistance may be modified, or tuned, as a function of the aspect ratio of the channel or channels.

In certain embodiments, one or more of the plurality of channels has an aspect ratio of at least 1.6:1.

In certain embodiments, one of, some of, most of, or all of the plurality of channels may have an aspect ratio that may be 1.6:1 or greater than 1.6:1, for example, 1.8:1, 1.9:1, 2.0:1 or the like. The term aspect ratio is used to define a ratio between the width and the depth. Thus, an aspect ratio of at least 1.6:1 may be regarded as a ratio of 1.6:1, referring to the width:depth of one of, some of, most of, or all of the plurality of channels, or greater. That is, the width of one of, some of, most of, or all of the plurality of channels may be greater than the depth of the respective channel.

This provides the advantage that, as the aspect ratio increases, the electron transfer path between the first cell and the second cell increases. That is, the electron transfer path between the first cell and the second cell increases as a function of the aspect ratio of the channel or channels. In this way, the third characteristic resistance increases as a function of the aspect ratio of the channel or channels. In this way, the third characteristic resistance may be modified, or tuned, as a function of the aspect ratio of the channel or channels. In certain embodiments, the first cell comprises at least one first groove and/or the second cell comprises at least one second groove, and each channel transects the at least one first groove and/or the at least one second groove.

In certain embodiments, the first cell comprises at least one first groove, the second cell comprises at least one second groove, or both the first cell comprises at least one first groove and the second cell comprises at least one second groove. Further, in certain embodiments, more than one, some, most, each or all of the channels transect the at least one first groove, the at least one second groove or both the at least one first groove and the at least one second groove.

This provides the advantage that the third characteristic resistance is tuneable, in addition to redundancy being built into the connecting portion such that electrical shorts between the first cell and the second cell are prevented, even in the event that one of the channels fails in its electrical isolation. Furthermore, such an arrangement may prevent electrical shorts across a transection region between grooves and the terminals. That is, the channel may transect the grooves such that electrical isolation between a series of grooves and an adjacent terminal is achieved. Thus, a more efficient and/or reliable two-terminal device may be provided.

In certain embodiments, the first cell comprises a first series of grooves and/or the second cell comprises a second series of grooves, and each channel transects a portion of the first series of grooves and/or a portion of the second series of grooves.

In certain embodiments, the first cell comprises a first series of grooves, the second cell comprises a second series of grooves, or both the first cell comprises a first series of grooves and the second cell comprises a second series of grooves. As discussed above, the first and second series of grooves may have any number of grooves and may have terminal grooves. Further, in certain embodiments, more than one, some, most, each or all of the channels transect a portion, that is one, some, most, or all, of the first series of grooves, the second series of grooves or both the first series of grooves and the second series of grooves. Each channel may transect the entirety of the first series of grooves and/or the second series of grooves.

This provides the advantage that the third characteristic resistance is tuneable, in addition to redundancy being built into the connecting portion such that electrical shorts between the first cell and the second cell are prevent, even in the event that one of the channels fails in its electrical isolation. Furthermore, such an arrangement may prevent electrical shorts across a transection region between grooves and the terminals. That is, the channel may transect the grooves such that electrical isolation between a series of grooves and an adjacent terminal is achieved. Thus, a more efficient and/or reliable two-terminal device may be provided.

In certain embodiments, each channel transects the first series of grooves and/or the second series of grooves towards an end of each groove.

In certain embodiments, each channel, that is more than one, some, most or all of the channels, transects the first series of grooves, the second series of grooves, or both the first series of grooves and the second series of grooves towards an end of each respective transected groove. In some examples, each channel transects the first series of grooves and/or the second series of grooves at an end of each groove.

In certain embodiments, the plurality of channels comprises a first channel, having a first channel characteristic resistance, and a second channel, having a second channel characteristic resistance, wherein the first channel characteristic resistance and the second channel characteristic resistance provide substantially all of the third characteristic resistance.

That is, in certain embodiments, the plurality of channels comprises a first channel and a second channel. The first channel may have a first channel characteristic resistance. The second channel may have a second channel characteristic resistance. The first channel characteristic resistance and the second channel characteristic resistance, that is, a combination thereof, may provide substantially all, or all, of the third characteristic resistance.

This provides the advantage that the third characteristic resistance may be tuneable according to the characteristic resistances of the first and second channel.

In certain embodiments, the plurality of channels further comprises a third channel, having a third channel characteristic resistance, wherein the first channel characteristic resistance, the second channel characteristic resistance and the third channel characteristic resistance provide substantially all of the third characteristic resistance.

In certain embodiments, the plurality of channels comprise a first channel, a second channel and a third channel. The first channel may have a first channel characteristic resistance. The second channel may have a second channel characteristic resistance. The third channel may have a third channel characteristic resistance. The first channel characteristic resistance, the second channel characteristic resistance, and the third channel characteristic resistance that is, a combination thereof, may provide substantially all, or all, of the third characteristic resistance.

This provides the advantage that the third characteristic resistance can be further tuned by providing a further channel. Furthermore, the third characteristic resistance may be increased by providing an additional channel.

In certain embodiments, the channel, or each channel of the plurality of channels, is substantially Z-shaped having a predetermined angle.

In certain embodiments, each channel of the plurality of channels is substantially Z-shaped having a predetermined angle.

The Z-shaped channel or channels may include any of the features described above in relation to Z-shaped channels.

In certain embodiments, the two-terminal device further comprises:
- a first transection channel that transects each channel of the plurality of channels at their distal ends and transects the at least one first groove;
- a second transection channel that transects each channel of the plurality of channels at their proximal ends and transects the at least one second groove.

That is, in certain embodiments, the first cell comprises at least one first groove and the second cell comprises at least one second groove, and the substrate further comprises a first transection channel that transects each channel of the plurality of channels at their distal ends and transects the at least one first groove; and a second transection channel that transects each channel of the plurality of channels at their proximal ends and transects the at least one second groove.

That is, in certain embodiments, there may be provided a plurality of channels, each channel being transected at their distal ends by a first transection channel, and each channel being transected at their proximal ends by a second transection channel. The first transection channel may transect the at least one first groove. The second transection channel may transect the at least one second groove. The plurality of channels may extend across the transverse direction of the substrate. The first transection channel and the second transection channel may extend across the web direction of the substrate. The first transection channel, the second transection channel, or both the first transection channel and the second transection channel may extend perpendicularly to each channel of the plurality of channels.

This provides the advantage that electrical shorts across the end of each grooves are substantially prevented.

In certain embodiments, the first transection channel transects each channel of the plurality of channels at their distal ends and transects a portion of the first series of grooves, and/or the second transection channel transects each channel of the plurality of channels at their proximal ends and transects a portion of the second series of grooves.

In certain embodiments, the first transection channel transects the entirety of the first series of grooves, and/or the second transection channel transects the entirety of the second series of grooves. In certain embodiments, the first transection channel and/or the second transection channel transect the respective groove or grooves towards an end of each groove.

In certain embodiments, the plurality of channels comprise a first channel and a second channel, wherein the first transection channel transects the first channel and the second channel at their distal ends, and wherein the second transection channel transects the first channel and the second channel at their proximal ends.

That is, in certain embodiments, the plurality of channels comprises a first channel and a second channel. The first channel and the second channel may extend in parallel to one another. The first transection channel transects the first channel and the second channel at their distal ends. The second transection channel transects the first channel and the second channel at their proximal ends. The distal end and the proximal end may be at, or towards, opposing edges, along the transverse direction, of the substrate.

In certain embodiments, the plurality of channels further comprises a third channel, wherein the first transection channel further transects the third channel at its distal end, and wherein the second transection channel further transects the third channel at its proximal end.

That is, in certain embodiments, the plurality of channels comprises a first channel, a second channel and a third channel. The first channel, the second channel and the third channel may extend in parallel to one another. The first transection channel transects the first channel, the second channel and the third channel at their distal ends. The second transection channel transects the first channel, the second channel and the third channel at their proximal ends. The distal end and the proximal end may be at, or towards, opposing edges, along the transverse direction, of the substrate.

In certain embodiments, each channel, the first transection channel and the second transection channel form a substantial Z-shape having a predetermined angle. The substantially Z-shaped feature formed may include any of the features described above in relation to Z-shaped channels, including predetermined angles.

In accordance with another aspect of to the invention, there is provided a method of forming a two-terminal device, comprising:
- providing a substrate;
- forming a first cell within the substrate, the first cell having a first characteristic resistance;
- forming a second cell within the substrate, spaced apart from the first cell along the web direction of the substrate, the second cell having a second characteristic resistance;
- forming a first terminal and a second terminal, each terminal being formed towards or at opposing edges of the substrate across the web direction, one or each terminal being formed in electrical connection with the first cell and the second cell;
- forming a connecting portion, between the first cell and the second cell, the connecting portion having a third characteristic resistance;
- wherein the third characteristic resistance is greater than or equal to at least one of the first characteristic resistance and the second characteristic resistance, such that an electrical charge from the first or second cell is extracted at the first terminal or the second terminal in preference to transferring from the first cell to the second cell across the connecting portion.

This provides the advantage that electrical shorts between the first cell and the second cell are prevented. In particular, manufacturing defects, such as the creation of electrical shorts between the first cell and the second cell, may be minimised. Thus, a more efficient and/or reliable two-terminal device may be formed.

In certain embodiments, the step of forming a first cell comprises forming at least one first groove within the substrate.

In certain embodiments, the step of forming at least one first groove comprises forming a first series of grooves within the substrate.

The first series of grooves, which are connected in series, provides voltage addition as a function of the number of grooves within the series. Thus, this provides the advantage that the voltage of the first cell, that is the first series of grooves, can be modified, or tuned, by varying the number of grooves within the first series of grooves.

In certain embodiments, the step of forming a second cell comprises forming at least one second groove within the substrate.

In certain embodiments, the step of forming at least one second groove comprises forming a second series of grooves within the substrate The second series of grooves, which are connected in series, provides voltage addition as a function of the number of grooves within the series. Thus, this provides the advantage that the voltage of the second cell, that is the second series of grooves, can be modified, or tuned, by varying the number of grooves within the second series of grooves.

In certain embodiments, the step of forming a connecting portion further comprises the step of forming at least one resistive element within the connecting portion between the first cell and the second cell, the at least one resistive element providing the third characteristic resistance.

In certain embodiments, the at least one resistive element comprises at least one channel.

In certain embodiments, the method further comprises:
coating a first face of each groove of the first series of grooves, each groove of the second series of grooves and the or each channel with a first material;
coating a second face of each groove of the first series of grooves, each groove of the second series of grooves and the or each channel with a second material; and
at least partially filling each groove of the first series of grooves, each groove of the second series of grooves and the or each channel with a third material.

In certain embodiments, wherein the step of forming a first cell comprises forming a first series of grooves within the substrate, the step of forming a second cell comprises forming a second series of grooves within the substrate, and the step of forming a connecting portion comprises forming at least one channel within the connecting portion, the method further comprises:
coating a first face of each groove of the first series of grooves, each groove of the second series of grooves and the or each channel with a first material;
coating a second face of each groove of the first series of grooves, each groove of the second series of grooves and the or each channel with a second material; and
at least partially filling each groove of the first series of grooves, each groove of the second series of grooves and the or each channel with a third material.

In certain embodiments, the step of coating the first face with the first material and/or coating the second face with the second material comprises an off-axis directional coating process.

In certain embodiments, the step of at least partially filling the grooves and the, or each, channel with the third material comprises printing the third material over the substrate. In this way, as the third material is printed over the substrate, the third material is partially or fully printed into the, or each, groove.

In certain embodiments, the step of at least partially filling each groove of the first series of grooves and the second series of grooves comprises filling each groove with the third material thereby providing an electrical connection across each groove of the first series of grooves, and an electrical connection across each groove of the second series of grooves.

In certain embodiments, the step of at least partially filling the or each channel comprises filling the or each channel with the third material thereby providing an electrical connection across the or each channel.

In accordance with yet another aspect of the invention, there is also provided a two-terminal device, including a substrate comprising:
a first cell having a first characteristic resistance, and a second cell, spaced apart from the first cell along the web direction of the substrate, having a second characteristic resistance;
a first terminal and a second terminal, each terminal being formed towards or at opposing edges along the transverse direction of the substrate;
a connecting portion, between the first cell and the second cell, comprising a channel, the connecting portion having a third characteristic resistance;
wherein the channel has an aspect ratio of at least 1:1.6 such that third characteristic resistance is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

That is, the third characteristic resistance may be tuned as a function of the depth of the channel. That is, a deeper channel may provide a larger electron transfer path, and thus a higher third characteristic resistance. As discussed above, this prevents electrical shorts.

In accordance with yet another aspect of the invention, there is also provided a two-terminal device, including a substrate comprising:
at least one first groove having a terminal groove or a terminal portion, the at least one groove having a first characteristic resistance, and at least one second groove having a terminal groove or a terminal end, spaced apart from the at least one first groove along the web direction of the substrate, having a second characteristic resistance;
a first terminal and a second terminal, each terminal being formed towards or at opposing edges along the transverse direction of the substrate;
a connecting portion, between the terminal groove or terminal portion of the at least one first groove and the terminal groove or terminal portion of the at least one second groove, comprising a channel, the connecting portion having a third characteristic resistance;
wherein the channel has an aspect ratio that greater than, preferably between 20% and 50% greater than, an aspect ratio of at least one of the terminal groove or terminal portion of the at least one first groove and the terminal groove or terminal portion of the at least one second groove, such that the third characteristic resistance is greater than or equal to at least one of the first characteristic resistance and the second characteristic resistance, such that electrical charge is extracted from the at least one first groove and the at least one second groove at the first terminal and the second terminal in preference to electrical charge transfer from the terminal groove or terminal portion of the at least one first groove to the terminal groove or terminal portion of the at least one second groove across the connecting portion.

That is, the third characteristic resistance may be tuned as a function of the depth of the channel with respect to the adjacent grooves. That is, a channel having a larger, for example 20% to 50% larger, aspect ratio than the adjacent grooves may provide a larger electron transfer path, and thus a higher third characteristic resistance. As discussed above, this prevents electrical shorts.

In accordance with yet another aspect of the invention, there is also provided a two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a channel, the connecting portion having a third characteristic resistance;

wherein the channel includes a rutted-base, a rutted-wall and/or a non-conductive electrical insulator therein, such that the third characteristic resistance is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

That is, the channel may include a rutted-based, a rutted-wall, a non-conducive electrical insulator therein or any combination thereof. This may provide tuneability of the third characteristic resistance.

In accordance with yet another aspect of the invention, there is also provided a two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a plurality of channels, wherein the plurality of channels each have a channel resistance, a combination of the channel resistances forming a third characteristic resistance;

wherein the third characteristic resistance that is greater than or equal to at least one of the first characteristic resistance and the second characteristic resistance, such that an electrical charge in the first or second cell is extracted at the first terminal or the second terminal in preference to transferring from the first cell to the second cell across the connecting portion.

That is, there may be a plurality of channels formed within the connecting portion. This may provide redundancy in the event that one of the plurality of channels fails in its electrical isolation of the first cell and the second cell. Thus, electrical shorts may be prevented between the first cell and the second cell during manufacture of the two-terminal device.

In accordance with yet another aspect of the invention, there is also provided a two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a plurality of channels, wherein the plurality of channels each have a channel resistance, a combination of the channel resistances forming a third characteristic resistance;

wherein the third characteristic resistance is equal to one of the first characteristic resistance or the second characteristic resistance, and greater than the other of the first characteristic resistance and the second characteristic resistance, such that electrical charge is extracted from the first cell and the second cell at the first terminal and the second terminal in preference to electrical charge transfer from the first cell to the second cell across the connecting portion.

As will be clear to a person skilled in the art, any combination of features discussed above or below may be used, provided that such features are not mutually incompatible. By way of an example illustrating this point, the skilled person would recognise that the first cell could comprise at least one groove, and the second cell could comprise a series of grooves. By way of a further example illustrating this point, the skilled person would recognise that any number of resistive elements and any type of resistive elements could be used within the connecting portion, for example, one or more channels in combination with one or more peaks of the substrate, or the like.

Certain terminology is used in the following description for convenience only and is not limiting. The words 'right', 'left', 'lower', 'upper', 'front', 'rear', 'upward', 'down' and 'downward' designate directions in the drawings to which reference is made and are with respect to the described component when assembled and mounted. The words 'inner', 'inwardly' and 'outer', 'outwardly' refer to directions toward and away from, respectively, a designated centreline or a geometric centre of an element being described (e.g. central axis), the particular meaning being readily apparent from the context of the description.

Further, as used herein, the terms 'connected', 'attached', 'coupled', 'mounted' are intended to include direct connections between two members without any other members interposed therebetween, as well as, indirect connections between members in which one or more other members are interposed therebetween. The terminology includes the words specifically mentioned above, derivatives thereof, and words of similar import.

Further, unless otherwise specified, the use of ordinal adjectives, such as, "first", "second", "third" etc. merely indicate that different instances of like objects are being referred to and are not intended to imply that the objects so described must be in a given sequence, either temporally, spatially, in ranking or in any other manner.

Below, there is provided a non-exhaustive list of non-limiting examples. Any one or more of the features of these examples may be combined with any one or more features of another example, embodiment or aspect described herein, provided that they are not mutually incompatible. In particular, any one of examples 1 to 56 can be combined with any one of examples 57 to 96, provided that they are not mutually incompatible.

Example 1. A two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges of the substrate across the transverse direction, and each terminal being in electrical communication with the first cell and the second cell;

a connecting portion, between the first cell and the second cell, the connecting portion having a third characteristic resistance;

wherein the third characteristic resistance is greater than or equal to at least one of the first characteristic resistance and the second characteristic resistance, such that electrical charge is extractable from the first cell and the second cell at the first terminal and the second terminal in preference to electrical charge transfer between the first cell and the second cell across the connecting portion.

Example 2. A two-terminal device according to example 1, wherein the third characteristic resistance is greater than at least one of the first characteristic resistance and the second characteristic resistance.

Example 3. A two-terminal device according to example 2, wherein the third characteristic resistance is at least two times, preferably at least five times, most preferably at least ten times, greater than at least one of the first characteristic resistance and the second characteristic resistance.

Example 4. A two-terminal device according to any preceding example, wherein the connecting portion comprises at least one resistive element.

Example 5. A two-terminal device according to example 4, wherein the at least one resistive element comprises a peak of the substrate, a discontinuous non-insulating coating of the substrate, and/or a rutted portion of the substrate.

Example 6. A two-terminal device according to example 4 or 5, wherein the at least one resistive element comprises a channel in the substrate.

Example 7. A two-terminal device according to example 6, wherein the channel comprises a rutted-base, a rutted-wall and/or a non-conductive electrical insulator material therein.

Example 8. A two-terminal device according to example 6 or 7, wherein the channel has an aspect ratio of at least 1:1.6.

Example 9. A two-terminal device according to example 8, wherein the channel has an aspect ratio of at least 1:2.

Example 10. A two-terminal device according to any preceding example, wherein the first cell comprises at least one first groove and/or the second cell comprises at least one second groove.

Example 11. A two-terminal device according to example 10, wherein the first cell comprises a first series of grooves and/or the second cell comprises a second series of grooves.

Example 12. A two-terminal device according to example 10, when dependent upon any one of examples 6 to 9, wherein the channel transects a portion of the at least one first groove and/or a portion of the at least one second groove.

Example 13. A two-terminal device according to example 11, when dependent upon example 10 and any one of examples 6 to 9, wherein the channel transects a portion of the first series of grooves and/or a portion of the second series of grooves.

Example 14. A two-terminal device according to example 13, wherein the channel transects the entirety of the first series of grooves and/or the entirety of the second series of grooves.

Example 15. A two-terminal device according to example 13 or example 14, wherein the channel transects the first series of grooves and/or the second series of grooves towards an end of each groove.

Example 16. A two-terminal device according to any one of examples 6 to 15, wherein the channel is substantially Z-shaped having a predetermined angle.

Example 17. A two-terminal device according to example 4, wherein the at least one resistive element comprises a plurality of channels in the substrate.

Example 18. A two-terminal device according to example 17, wherein one or more of the plurality of channels comprises a rutted-base, a rutted-wall and/or a non-conductive electrical insulator therein.

Example 19. A two-terminal device according to example 17 or 18, wherein one or more of the plurality of channels has an aspect ratio of at least 1:1.6.

Example 20. A two-terminal device according to example 17 or 18, wherein one or more of the plurality of channels has an aspect ratio of at least 1.6:1.

Example 21. A two-terminal device according to any one of examples 17 to 20, wherein the first cell comprises at least one first groove and/or the second cell comprises at least one second groove.

Example 22. A two-terminal device according to example 21, wherein the first cell comprises a first series of grooves and/or the second cell comprises a second series of grooves.

Example 23. A two-terminal device according to example 21, when dependent upon any one of examples 17 to 20, wherein each channel transects the at least one first groove and/or the at least one second groove.

Example 24. A two-terminal device according to example 22, when dependent upon example 21 and any one of examples 17 to 20, wherein each channel transects a portion of the first series of grooves and/or a portion of the second series of grooves.

Example 25. A two-terminal device according to example 24, wherein each channel transects the entirety of the first series of grooves and/or the entirety of the second series of grooves.

Example 26. A two-terminal device according to example 24 or example 25, wherein each channel transects the first series of grooves and/or the second series of grooves towards an end of each groove.

Example 27. A two-terminal device according to any one of examples 17 to 26, wherein the plurality of channels comprises a first channel, having a first channel characteristic resistance, and a second channel, having a second channel characteristic resistance, wherein the first channel characteristic resistance and the second channel characteristic resistance provide substantially all of the third characteristic resistance.

Example 28. A two-terminal device according to example 27, wherein the plurality of channels further comprises a third channel, having a third channel characteristic resistance, wherein the first channel characteristic resistance, the second channel characteristic resistance and the third channel characteristic resistance provide substantially all of the third characteristic resistance.

Example 29. A two-terminal device according to any one of examples 17 to 28, wherein each channel of the plurality of channels is substantially Z-shaped having a predetermined angle.

Example 30. A two-terminal device according to example 21, further comprising:
- a first transection channel that transects each channel of the plurality of channels at their distal ends and transects the at least one first groove;
- a second transection channel that transects each channel of the plurality of channels at their proximal ends and transects the at least one second groove.

Example 31. A two-terminal device according to example 22, further comprising:
- a first transection channel that transects each channel of the plurality of channels at their distal ends and transects a portion of the first series of grooves; and
- a second transection channel that transects each channel of the plurality of channels at their proximal ends and transects a portion of the second series of grooves.

Example 32. A two-terminal device according to example 31, wherein the first transection channel transects the entirety of the first series of grooves, and wherein the second transection channel transects the entirety of the second series of grooves.

Example 33. A two-terminal device according to example 31 or example 32, wherein the first transection channel and/or the second transection channel transect the grooves towards an end of each groove.

Example 34. A two-terminal device according to any one of examples 30 to 33, wherein the plurality of channels comprise a first channel and a second channel, wherein the first transection channel transects the first channel and the second channel at their distal ends, and wherein the second transection channel transects the first channel and the second channel at their proximal ends.

Example 35. A two-terminal device according to example 34, wherein the plurality of channels further comprises a third channel, wherein the first transection channel further transects the third channel at its distal end, and wherein the second transection channel further transects the third channel at its proximal end.

Example 36. A two-terminal device according to any one of examples 30 to 35, wherein each channel, the first transection channel and the second transection channel form a substantial Z-shape having a predetermined angle.

Example 37. A two-terminal device according to any preceding example, wherein the two-terminal device is an optoelectronic device.

Example 38. A method of forming a two-terminal device, comprising:
- providing a substrate;
- forming a first cell within the substrate, the first cell having a first characteristic resistance;
- forming a second cell within the substrate, spaced apart from the first cell along the web direction of the substrate, the second cell having a second characteristic resistance;
- forming a connecting portion, between the first cell and the second cell, the connecting portion having a third characteristic resistance;
- wherein the third characteristic resistance is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

Example 39. A method according to example 38, wherein the step of forming a first cell comprises forming at least one first groove within the substrate.

Example 40. A method according to example 39, wherein the step of forming at least one first groove comprises forming a first series of grooves within the substrate.

Example 41. A method according to any one of examples 38 to 40, wherein the step of forming a second cell comprises forming at least one second groove within the substrate.

Example 42. A method according to example 41, wherein the step of forming at least one second groove comprises forming a second series of grooves within the substrate Example 43. A method according to any one of examples 38 to 42, wherein the step of forming a connecting portion further comprises the step of forming at least one resistive element within the connecting portion between the first cell and the second cell, the at least one resistive element providing the third characteristic resistance.

Example 44. A method according to example 43, wherein the at least one resistive element comprises at least one channel.

Example 45. A method according to example 44, when dependent upon examples 40, 42 and 43, further comprising:
- coating a first face of each groove of the first series of grooves, each groove of the second series of grooves and the or each channel with a first material;
- coating a second face of each groove of the first series of grooves, each groove of the second series of grooves and the or each channel with a second material; and
- at least partially filling each groove of the first series of grooves, each groove of the second series of grooves and the or each channel with a third material.

Example 46. A method according to example 45, wherein the step of coating the first face with the first material and/or coating the second face with the second material comprises an off-axis directional coating process.

Example 47. A method according to example 45 or 46, wherein the step of at least partially filling the grooves and the or each channel with the third material comprises printing the third material over the substrate.

Example 48. A method according to any one of examples 45 to 47, wherein the step of at least partially filling each groove of the first series of grooves and the second series of grooves comprises filling each groove with the third material thereby providing an electrical connection across each groove of the first series of grooves, and an electrical connection across each groove of the second series of grooves.

Example 49. A method according to any one of examples 45 to 48, wherein the step of at least partially filling the or each channel comprises filling the or each channel with the third material thereby providing an electrical connection across the or each channel.

Example 50: A two-terminal device obtainable according to any one of examples 38 to 49.

Example 51: An optoelectronic device obtainable according to any one of examples 38 to 49.

Example 52. A two-terminal device, including a substrate comprising:
- a first cell having a first characteristic resistance, and a second cell, spaced apart from the first cell along the web direction of the substrate, having a second characteristic resistance;
- a first terminal and a second terminal, each terminal being formed towards or at opposing edges along the transverse direction of the substrate;

a connecting portion, between the first cell and the second cell, comprising a channel, the connecting portion having a third characteristic resistance;

wherein the channel has an aspect ratio of at least 1:1.6 such that third characteristic resistance is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

Example 53. A two-terminal device, including a substrate comprising:

at least one first groove having a terminal groove or a terminal portion, the at least one groove having a first characteristic resistance, and at least one second groove having a terminal groove or a terminal portion, spaced apart from the at least one first groove along the web direction of the substrate, having a second characteristic resistance;

a first terminal and a second terminal, each terminal being formed towards or at opposing edges along the transverse direction of the substrate;

a connecting portion, between the terminal groove or terminal portion of the at least one first groove and the terminal groove or terminal portion of the at least one second groove, comprising a channel, the connecting portion having a third characteristic resistance;

wherein the channel has an aspect ratio that greater than, preferably between 20% and 50% greater than, an aspect ratio of at least one of the terminal groove or terminal portion of the at least one first groove and the terminal groove or terminal portion of the at least one second groove, such that the third characteristic resistance is greater than or equal to at least one of the first characteristic resistance and the second characteristic resistance, such that electrical charge is extracted from the at least one first groove and the at least one second groove at the first terminal and the second terminal in preference to electrical charge transfer from the terminal groove or terminal portion of the at least one first groove to the terminal groove or terminal portion of the at least one second groove across the connecting portion.

Example 54. A two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a channel, the connecting portion having a third characteristic resistance;

wherein the channel includes a rutted-base, a rutted-wall and/or a non-conductive electrical insulator therein, such that the third characteristic resistance is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

Example 55. A two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a plurality of channels, wherein the plurality of channels each have a channel resistance, a combination of the channel resistances forming a third characteristic resistance;

wherein the third characteristic resistance that is greater than or equal to at least one of the first characteristic resistance and the second characteristic resistance, such that electrical charge is extracted from the first cell and the second cell at the first terminal and the second terminal in preference to electrical charge transfer from the first cell to the second cell across the connecting portion.

Example 56. A two-terminal device, including a substrate comprising:

a first cell having a first characteristic resistance, and a second cell, spaced apart from the first cell along the web direction of the substrate, having a second characteristic resistance;

a first terminal and a second terminal, each terminal being formed towards or at opposing edges along the transverse direction of the substrate;

a connecting portion, between the first cell and the second cell, comprising a plurality of channels, wherein the plurality of channels each have a channel resistance, a combination of the channel resistances forming a third characteristic resistance;

wherein the third characteristic resistance is equal to one of the first characteristic resistance or the second characteristic resistance, and greater than the other of the first characteristic resistance and the second characteristic resistance, such that electrical charge is extracted from the first cell and the second cell at the first terminal and the second terminal in preference to electrical charge transfer from the first cell to the second cell across the connecting portion.

Example 57: A substrate for a two-terminal device, comprising: a first series of grooves and a second series of grooves, each groove having a proximal end and a distal end across the transverse direction of the substrate, and a channel transecting a portion of the first series of grooves and a portion of the second series of grooves towards the proximal end of each groove, and wherein the depth of each groove tends towards the depth of the channel in a transection region towards the proximal end of each groove.

Example 58: A substrate according to example 57, wherein the depth of each groove tends non-linearly towards the depth of the channel.

Example 59: A substrate according to example 58, wherein the depth of each groove tends gradually towards the depth of the channel.

Example 60: A substrate according to example 58 or example 59, wherein the transection region is substantially arcuate.

Example 61: A substrate according to example 57, wherein each groove tends linearly towards the depth of the channel.

Example 62: A substrate according to example 61, wherein the depth of each groove tends linearly towards the depth of the channel at an angle of between 0° and 90°, excluding 0° and 90°, formed with respect to an axis extending along the elongate base of each groove.

Example 63: A substrate according to any one of examples 57 to 62, wherein the channel is substantially Z-shaped having a predetermined angle.

Example 64: A substrate according to any one of examples 57 to 63, wherein each groove has an aspect ratio of at least 1:1, preferably at least 1:1.2, from the distal end to the proximal end, excluding the transection region.

Example 65: A substrate according to any one of examples 57 to 64, wherein the channel has an aspect ratio of at least 1:1.6.

Example 66: A substrate according to any one of examples 57 to 65, wherein the transection region has an aspect ratio that tends from at least 1:1, preferably 1:1.2, to at least 1:1.6.

Example 67: A substrate according to any one of examples 57 to 66, wherein the channel transects each groove of the first series of grooves and/or the second series of grooves.

Example 68: A substrate according to any one of examples 57 to 67, comprising a plurality of channels.

Example 69: A substrate according to example 68, wherein each channel of the plurality of channels transects a portion of the first series of grooves and a portion of the second series of grooves towards the proximal end of each groove.

Example 70: A substrate according to example 68, wherein each channel of the plurality of channels transects each groove of the first series of grooves and each groove of the second series of grooves towards the proximal end of each groove.

Example 71: A substrate according to any one of examples 68 to 70, wherein each channel of the plurality of channels is substantially Z-shaped having a predetermined angle.

Example 72: A substrate according to example 68, further comprising:
  a first transection channel transecting each channel of the plurality of channels at their distal ends, the first transection channel transecting the entirety the first series set of grooves towards the proximal end of each groove; and
  a second transection channel transecting each channel of the plurality of channels at their proximal ends, the second transection channel transecting the entirety of the second series of grooves towards the proximal end of each groove.

Example 73: A substrate according to example 72, wherein the first transection channel, the plurality of channels, and the second transection channel substantially form a Z-shape having a predetermined angle.

Example 74: A substrate according to example 63, example 71 or example 73, wherein the predetermined angle is between approximately 0 degrees and approximately 90 degrees, preferably between approximately 30 degrees and approximately 60 degrees.

Example 75: A substrate according to example 74, wherein the predetermined angle is between approximately 40 degrees and approximately 50 degrees, preferably approximately 45 degrees.

Example 76: A two-terminal device comprising the substrate of any one of examples 57 to 75.

Example 77: A two-terminal device according to example 76, wherein the two-terminal device is an optoelectronic device.

Example 78: A method of forming a substrate for a two-terminal device, comprising:
  providing a web of flexible material; and
  forming a first series of grooves within the web of flexible material;
  forming a second series of grooves within the web of flexible material;
  forming a channel between the first series of grooves and the second series of grooves within the web of flexible material, the channel transecting a portion of the first and second series of grooves towards a proximal end of each groove,
  wherein the step of forming a channel includes forming a depth of each groove that tends towards the depth of the channel at the proximal end of each groove.

Example 79: A method according to example 78, wherein the first series of grooves, the second series of grooves and the channel are formed as a unitary step.

Example 80: A method according to example 78 or example 79, wherein the step of forming a first series of grooves within the web of flexible material comprises embossing the web of flexible material to form the first series of grooves.

Example 81: A method according to any one of examples 78 to 80, wherein the step of forming a second series of grooves within the web of flexible material comprises embossing the web of flexible material to form the second series of grooves.

Example 82: A method according to any one of examples 78 to 81, wherein the step of forming a channel within the web of flexible material comprises embossing the web of material to form the channel.

Example 83: A method according to any one of examples 80 to 82, wherein the step of embossing comprises:
  providing one or more shims having at least one protrusion corresponding to at least one of the first series of grooves, the second series of grooves and the channel;
  coating a surface of the web of flexible material with a UV-curable coating;
  engaging the at least one protrusion of the or each shim with the coated web of flexible material;
  at least partially UV curing the UV-curable coating; and
  removing the at least one protrusion of the or each shim from the coated web of flexible material before the UV-curable coating has fully cured.

Example 84: A method according to example 83, wherein the shim is a master shim comprising at least one protrusion corresponding to the first series of grooves, at least one protrusion corresponding to the second series of grooves, and at least one protrusion corresponding to the channel.

Example 85: A method according to example 84, wherein the master shim is a Nickel-plated master shim.

Example 86: A method according to any one of examples 83 to 85, wherein the or each shim is formed as a cylindrical stamping roll.

Example 87: A method according to any one of examples 83 to 85, wherein the or each shim is formed as a stamping plate.

Example 88: A method of forming a two-terminal device, comprising:
  forming a substrate according to a method of any one of examples 78 to 87;

coating a first face of first series of grooves, the second series of grooves and the channel with at least one first material;

coating a second opposing face of the first series of grooves, the second series of grooves and the channel with at least one second material; and at least partially filling the channel with a third material.

Example 89: A method according to example 88, wherein the step of coating the first face with the at least one first material and coating the second face with the at least one second material is before the step of at least partially filling the channel with the third material.

Example 90: A method according to example 88 or example 89, wherein the step of coating the first face with at least one first material and/or coating the second face with at least one second material comprises an off-axis directional coating process.

Example 91: A method according to any one of examples 88 to 90, wherein the step of at least partially filling the channel with a third material comprises printing the third material over the substrate.

Example 92: A method according to any one of examples 88 to 91, wherein the at least one first material comprises a non-insulating material.

Example 93: A method according to any one of examples 88 to 92, wherein the at least one second material comprises a non-insulating material.

Example 94: A method according to any one of examples 88 to 93, wherein the third material comprises a capacitor material, a supercapacitor material, or a perovskite.

Example 95: A substrate obtainable by the method of any one of examples 78 to 87.

Example 96: A two-terminal device obtainable by the method of any one of examples 88 to 94.

Other examples will be apparent from the aforementioned summary of invention and the detailed description noted below.

BRIEF DESCRIPTION OF THE SEVERAL VIEWS OF THE DRAWING

In the accompanying drawings, which form a part of the specification and are to be read in conjunction therewith in which like reference numerals are used to indicate like or similar parts in the various views:

FIG. 1 illustrates an electrical diagram of a two-terminal device in accordance with the prior art;

FIG. 2 illustrates (a) an electrical diagram of a two-terminal device in accordance with the invention and (b) an enlarged view of a portion of the electrical diagram of (a);

DETAILED DESCRIPTION OF THE INVENTION

Figure 3:
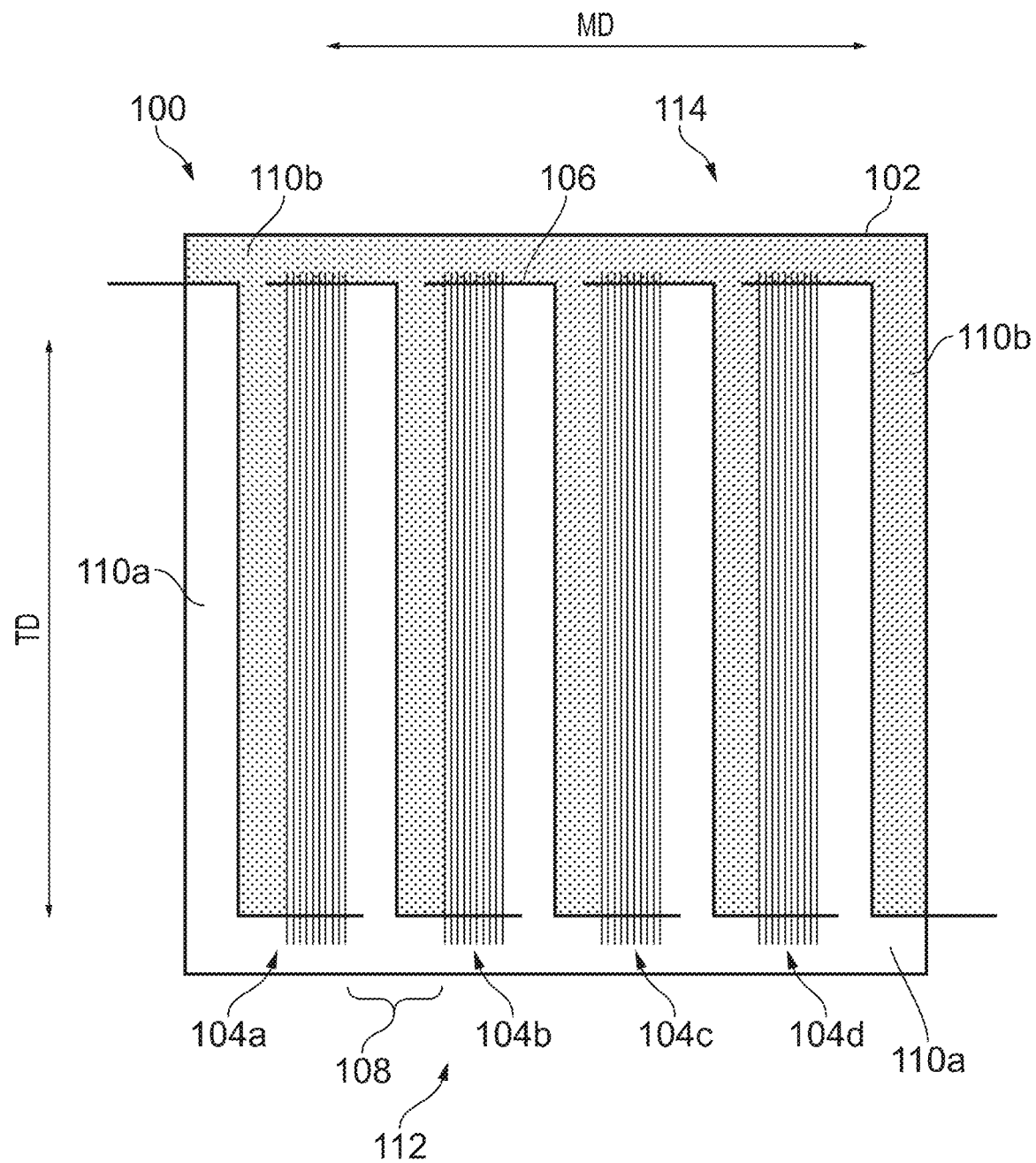
FIG. 3 illustrates a plan view of a substrate in accordance with one embodiment of the invention.

Like reference numerals are used to depict like features throughout.

Various modifications to the detailed designs are described above are envisaged. For example, any number of grooves within any number of series of grooves may be used. Equally, any number of delineation features, such as channels, transection channels or the like may be used. Moreover, any combination of such delineation features may be used.

It will be clear to a person skilled in the art that features described in relation to any of the embodiments described above can be application interchangeably between the different embodiments. The embodiments described above are examples to illustrate various features of the invention.

Throughout the description and claims of this specification, the words "comprise" and "contain" and variations of them mean "including but not limited to", and they are not intended to (and do not) exclude other moieties, additives, components, integers or steps. Through the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect embodiment, or example described herein unless incompatible therewith. All of the features disclosed in this specification (including any accompanying claims, abstract or drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

FIGS. 2(a) and 2(b) illustrate an example of a two-terminal device 50 having a substrate, in accordance with the present invention. The substrate includes a first cell 54a, a second cell 54b and a third cell 54c. The first, second and third cells 54a, 54b, 54c may be photovoltaic cells as shown in FIGS. 2(a) and 2(b). In this specific example, the first, second and third cells 54a, 54b, 54c are formed as a first series of grooves 54a, a second series of grooves 54b and a third series of grooves 54c. Each series of grooves 54a, 54b, 54c includes a plurality of grooves.

As shown in FIGS. 2(a) and 2(b), grooves are connected in series with one another to form a first series of grooves 54a. Likewise, grooves are connected in series to form a second series of grooves 54b, and further grooves are connected in series to form a third series of grooves 54c. In this way, the grooves of a respective series of grooves 54a, 54b, 54c is first connected in series to form each of the respective series of grooves 54a, 54b, 54c, and then each series of grooves 54a, 54b, 54c is connected in parallel to one another. Thus, the two-terminal device 50 of FIGS. 2(a) and 2(b) differs from that of the prior art as illustrated in FIG. 1.

The two-terminal device 50 of FIGS. 2(a) and 2(b) provides the advantage that bypass diodes, which are typically required in conventional substrates such as those illustrated in FIG. 1, are not necessary. Instead, grooves are placed in series relatively close to one another, in some examples with a spacing of approximately 0.1 mm or less between each groove, such that each groove within a series of grooves 54a, 54b, 54c experiences substantially, or exactly, the same lighting conditions, in use. Moreover, since each series of grooves 54a, 54b, 54c is connected in parallel, shading of grooves of an individual series of grooves 54a, 54b, 54c has a less significant impact on the overall performance of the device. Thus, the prerequisite of bypass diodes is negated in the present invention.

Furthermore, as shown in FIGS. 2(a) and 2(b), the two-terminal device 50 includes a first connecting portion including a first delineation feature 56a, and a second connecting portion including a second delineation feature 56b. The first delineation feature 56a is provided between the first series of grooves 54a and the second series of grooves 54b. the second delineation feature 54b is provided between the second series of grooves 54b and the third series of grooves 54c. Any number of grooves may be present in any number of series of grooves 54a, 54b, 54c having any number of delineation features 56a, 56b therebetween, as described herein. Further, the delineation feature 56a, 56b may take any appropriate form as discussed further herein.

Each series of grooves 54a, 54b, 54c provides an electrical connection between a first electrical connection 58 and a second electrical connection 60. The first electrical connection 58 is a positive electrical connection and the second electrical connection 60 is a negative electrical connection in the depicted embodiment. Alternatively, the first electrical connection 58 may be a negative electrical connection and the second electrical connection 60 may be a positive electrical connection. The positive and negative electrical connections 58, 60 may be connected to respective terminals, for example, positive and negative busbars 62, 64 of the two-terminal device 50. In this way, positive electrical charge is carried to the positive busbar 62 and negative electrical charge is carried to the opposing negative busbar 64. The busbars 62, 64 may be connected to another electrical element, such as a capacitor or the like.

As described herein, the delineation features typically serve to provide an electrical disconnection, or provide electrical isolation, between adjacent series of grooves. However, as described herein, this is oftentimes not possible, and so an electrical short occurs across one or more of the delineation features during manufacture of such devices. In this case, the inventors have surprisingly found that conductive delineations features 56a, 56b, that is delineation features that provide an electrical connection thereacross, can be modelled upon a resistor in parallel with a reverse-biased diode, as shown in FIG. 2(a). In this way, each delineation feature 56a, 56b provides a resistance such that the electrical pathway from a terminal groove of a series of grooves 54a, 54b, 54c to its adjacent electrical connection 58, 60 is favoured over the electrical pathway across the delineation feature 56a, 56b. Thus, electrical charge is extractable at positive and negative busbars 62, 64 in preference to electrical charge transfer across the delineation feature 56a, 56b, that is, a short circuit across the delineation feature 56a, 56b.

Furthermore, the inventors have surprisingly found that if the delineation feature 56a, 56b is conductive, said delineation feature 56a, 56b provides charge blocking and substantive electrical isolation between adjacent series of grooves simultaneously. That is, the delineation feature 56a, 56b provides charge blocking in the same orientation that would be used for a bypass diode. In this way, a conductive delineation feature 56a, 56b protects the adjacent series of grooves 54a, 54b, 54c from reverse bias damage, that is, from electrical charge flowing in a direction that is opposite to the flow of electrical charge across each groove within the series of grooves 54a, 54b, 54c. For example, referring to FIG. 2(b), the delineation feature 56a prevents electrical charge flowing from positive electrical connection 58, connected to positive busbar 62, through the delineation feature 56a and towards the grooves and the negative electrical connection 60, connected to the negative busbar 64. Thus, it has been found, much to the surprise of the inventors, that not only does a conductive delineation feature 56a, 56b allow for charge extraction as in non-conductive delineation features, but also that a conductive delineation feature 56a, 56b can provide protection against reverse bias damage.

FIG. 3 illustrates a plan view of a two-terminal device 100 comprising a substrate 102. The substrate 102 has a surface comprising a plurality of series of grooves 104a-104d. In particular, the substrate 102 comprises a first series of grooves 104a, a second series of grooves 104b, a third series of grooves 104c and a fourth series of grooves 104d. Further series of grooves may be provided in the machine direction MD of the substrate 102. Each groove of the series of grooves 104a-104d generally run in parallel to one another across the transverse direction TD of the substrate 102, extending from a proximal end, for example, proximal to a first terminal 112 as described below, to a distal end, for example, distal to the first terminal 112 as described below. A channel 106 is provided between each series of grooves 104a-104d.

The two-terminal device 100 may be an optoelectronic device, such as a solar photovoltaic cell. Such a two-terminal device 100 includes a mixture of interdigitated (parallel connected) and cascaded (series connected) grooves 104a-104d. The operating voltage of such a two-terminal device 100 can be controlled by changing the number of series of grooves 104a-104d. Increasing the number of series of grooves 104a-104d increases the operating voltage of the two-terminal device 100. Such a two-terminal device 100 can be operated in parallel or a combination of series and parallel arrangement. It may be an advantage of the two-terminal device 100 that this removes the need for extra process steps to be used to connect the cascaded groove structures in series to achieve the desired output voltage.

The channel 106 physically separates the cascaded (series connected) grooves 104a-104d. The channel 106 enables the cascaded grooves 104a-104d to be connected in parallel via electrical connection to first and second terminals 112, 114. In this way, it is possible to extract the desired electric charge generated at the voltage designed by the number of cascaded groove structures 104a-104d.

The channel 106, also referred to as the delineation or structural delineation feature, first crosses the first series of grooves 104a towards one end of the substrate 102 and then crosses a spacer 108 between the first series of grooves 104a and the second series of grooves 104b, and subsequently crosses the second series of grooves 104b towards the opposite edge of the substrate 102. Since many of these channels 106 are used, each series of grooves, 104a, 104b for example, are crossed toward each edge by elements of two successive individual channels 106, as shown in FIG. 3. The channel 106 crosses towards an end of each groove of the series of grooves 104a, 104b, 104c, 104d. However, in other embodiments, the channel 106 may terminate an end, i.e. cross at an end, of each groove of the series of grooves 104a, 104b, 104c, 104d.

Together, the spacers 108 and channels 106 divide the substrate 102 into a first area 110a and a second area 110b. The first area 110a carries a positive charge and the second area 110b carries a negative charge. The first area 110a terminates at a first or positive terminal 112 at one edge of the substrate 102, and the second area 110b terminates at a second or negative terminal 114 at the other, opposite, edge of the substrate 102, referring to the transverse direction TD. The first area 110a provides an electrical connection of the first groove of each series of grooves 104a-104d to the first terminal 112. The second area 110b provides an electrical connection of the last groove of each series of grooves 104a-104d to the second terminal 114. Thus, a two-terminal device 100 having a first terminal 112 and a second terminal 114 is formed.

Figure 4:
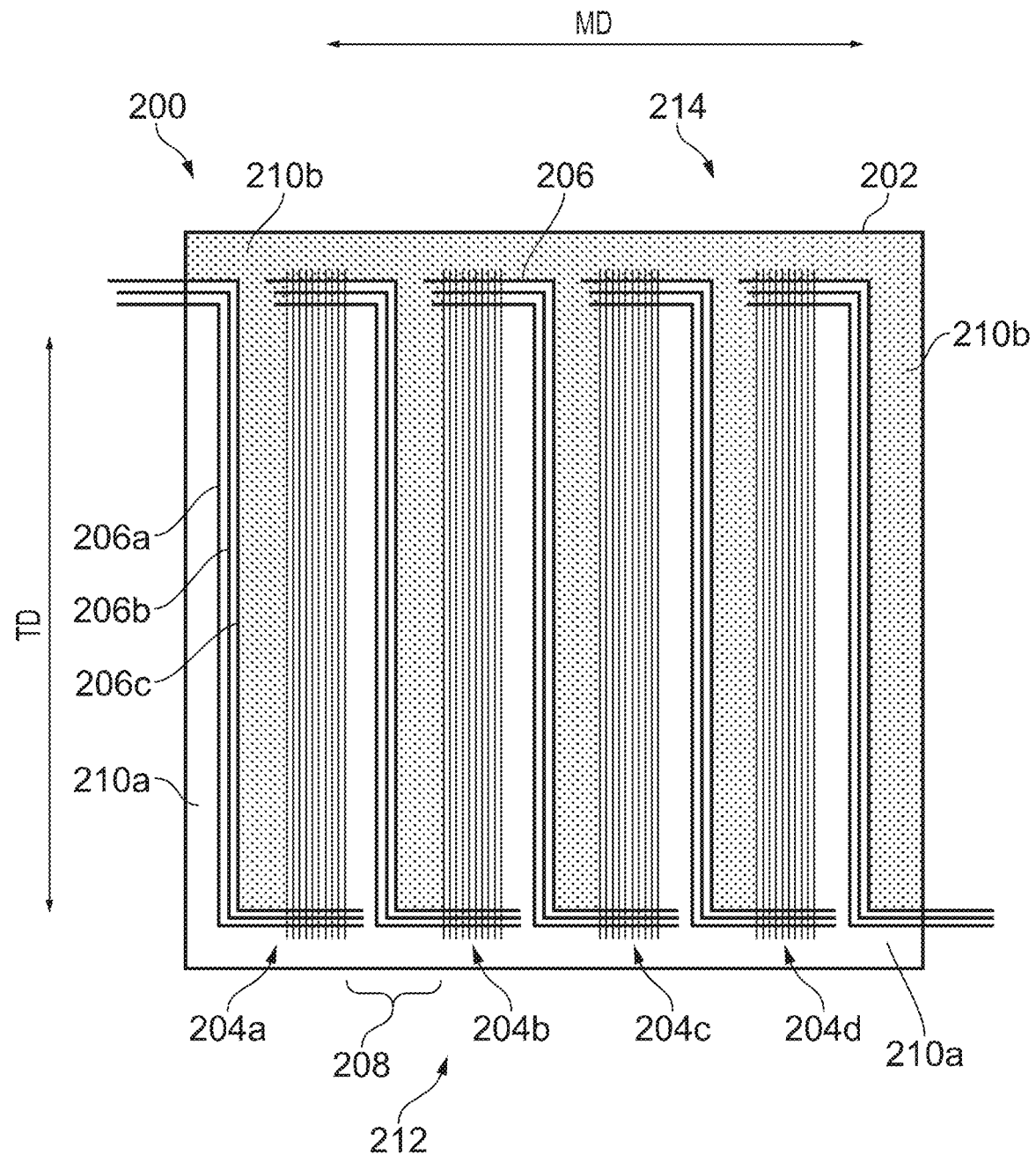
FIG. 4 illustrates a plan view of a substrate in accordance with one embodiment of the invention.

FIG. 4 illustrates a plan view of another two-terminal device 200 comprising a substrate 202. The substrate 202 has a surface comprising a plurality of series of grooves 204a-204d. In particular, the substrate 202 comprises a first series of grooves 204a, a second series of grooves 204b, a third series of grooves 204c and a fourth series of grooves 204d. Further series of grooves may be provided in the machine direction MD of the substrate 202. Each groove of the series of grooves 204a-204d generally run in parallel to one another across the transverse direction TD of the substrate 202, extending from a proximal end, for example, proximal to a first terminal 212 as described below, to a distal end, for example, distal to the first terminal 212 as described below. A channel 206, in this case a plurality of channels 206a-206c, is provided between each series of grooves 204a-204d.

The two-terminal device 200 may be an optoelectronic device, such as a solar photovoltaic cell. Such a two-terminal device 200 includes a mixture of interdigitated (parallel connected) and cascaded (series connected) grooves 204a-204d. The operating voltage of such a two-terminal device 200 can be controlled by changing the number of series of grooves 204a-204d. Increasing the number of series of grooves 204a-204d increases the operating voltage of the two-terminal device 200. Such a two-terminal device 200 can be operated in parallel or a combination of series and parallel arrangement. It may be an advantage of the two-terminal device 200 that this removes the need for extra process steps to be used to connect the cascaded groove structures in series to achieve the desired output voltage.

Each channel of the plurality of channels 206a-206c physically separates the cascaded (series connected) grooves 204a-204d. Each of the plurality of channels 206a-206c enables the cascaded (series connected) grooves 204a-204d to be electrically connected in parallel to first and second terminals 212, 214. In this way, it is possible to extract the desired electric charge generated at the voltage designed by the number of cascaded groove structures 204a-204d.

The first channel 206a, also referred to as the first delineation or structural delineation feature, first crosses the first series of grooves 204a towards one end of the substrate 202 and then crosses a space 208 between the first series of grooves 204a and the second series of grooves 204b, and subsequently crosses the second series of grooves 204b towards the opposite edge of the substrate 202. Since many of these channels are used, each series of grooves, 204a, 204b for example, are crossed toward each edge by elements of two successive individual channels, as shown in FIG. 4. The first channel 206a crosses towards an end of each groove of the series of grooves 204a, 204b, 204c, 204d. However, in other embodiments, the first channel 206a may terminate an end, i.e. cross at an end, of each groove of the series of grooves 204a, 204b, 204c, 204d.

The second channel 206b, like the first channel 206a, first crosses the first series of grooves 204a towards one end of the substrate 202 and then crosses a spacer 208 between the first series of grooves 204a and the second series of grooves 204b, and subsequently crosses the second series of grooves 204b towards the opposite edge of the substrate 202. The third channel 206c crosses the first series of grooves 204a, the spacer 208, and the second series of grooves 204b, in the same manner as the first channel 206a and the second channel 206b.

It may be advantageous to use a plurality of channels 206a-206c to mitigate the likelihood of an electrical short forming across the interface between the first series of grooves 204a and the second series of grooves 204b, that is, across the plurality of channels 206a-206c. Thus, a plurality of channels 206a-206c ensure a more efficient and reliable two-terminal device 200.

Together, the spacers 208 and channels 206 divide the substrate 202 into a first area 210a and a second area 210b. The first area 210a carries a positive charge and the second area 210b carries a negative charge. The first area 210a terminates at a first or positive terminal 212 at one edge of the substrate 202, and the second area 210b terminates at a second or negative terminal 214 at the other, opposite, edge of the substrate 202, referring to the transverse direction TD. The first area 210a provides an electrical connection of the first groove of each series of grooves 204a-204d to the first terminal 212. The second area 210b provides an electrical connection of the last groove of each series of grooves 204a-204d to the second terminal 214. Thus, a two-terminal device 200 having a first terminal 212 and a second terminal 214 is formed.

Figure 5:
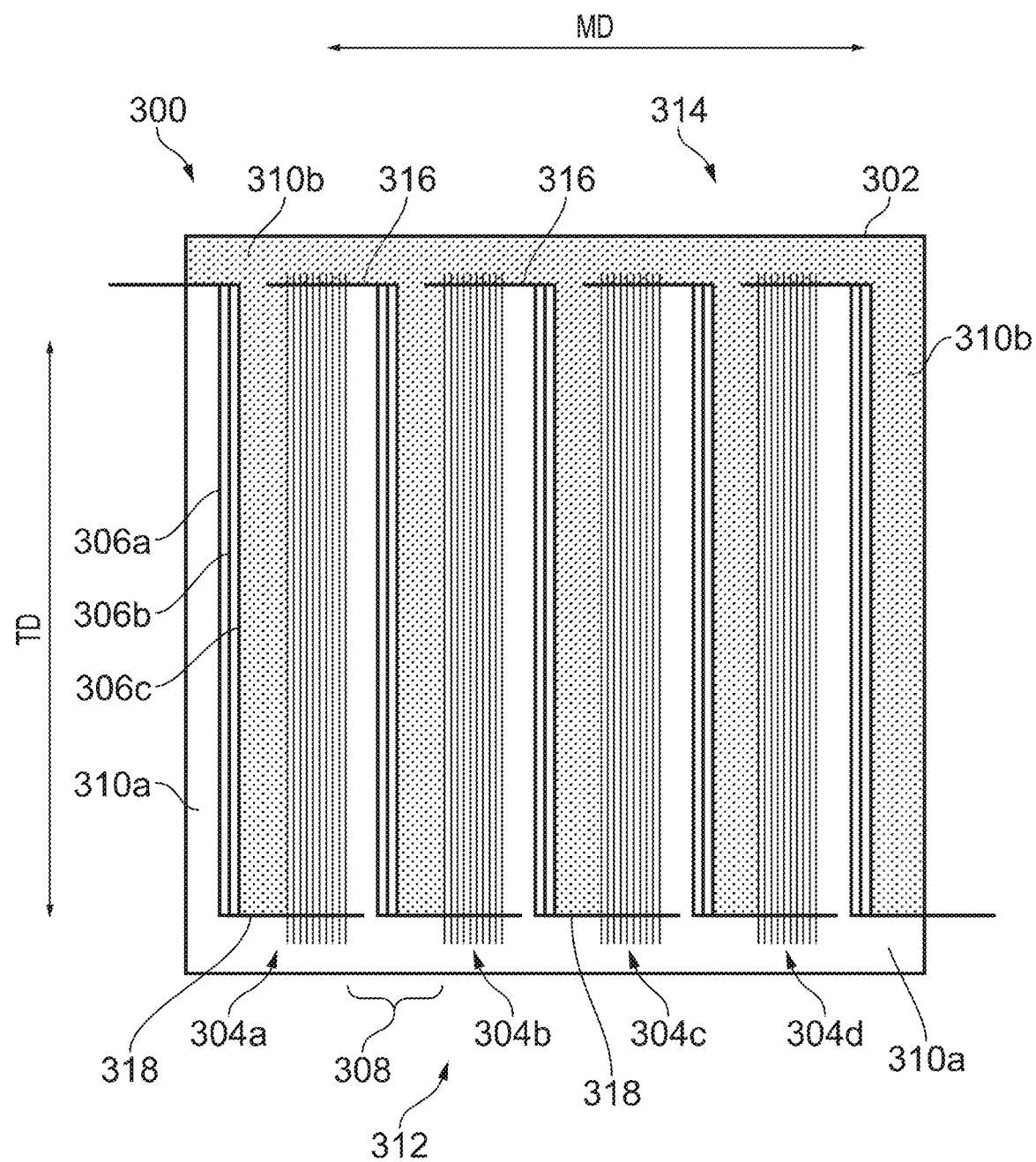
FIG. 5 illustrates a plan view of a substrate in accordance with one embodiment of the invention.

FIG. 5 illustrates a plan view of yet another two-terminal device 300 comprising a substrate 302. The substrate 302 has a surface comprising a plurality of series of grooves 304a-304d. In particular, the substrate 302 comprises a first series of grooves 304a, a second series of grooves 304b, a third series of grooves 304c and a fourth series of grooves 304d. Further series of grooves may be provided in the machine direction MD of the substrate 302. Each groove of the series of grooves 304a-304d generally run in parallel to one another across the transverse direction TD of the substrate 302, extending from a proximal end, for example, proximal to a first terminal 312 as described below, to a distal end, for example, distal to the first terminal 312 as described below. A delineation feature (306a, 306b, 306c, 316, 318) is provided between each series of grooves 304a-304d.

The two-terminal device 300 may be an optoelectronic device, such as a solar photovoltaic cell. Such a two-terminal device 300 includes a mixture of interdigitated (parallel connected) and cascaded (series connected) grooves 304a-304d. The operating voltage of such a two-terminal device 300 can be controlled by changing the number of series of grooves 304a-304d. Increasing the number of series of grooves 304a-304d increases the operating voltage of the two-terminal device 300. Such a two-terminal device 300 can be operated in parallel or a combination of series and parallel arrangement. It may be an advantage of the two-terminal device 300 that this removes the need for extra process steps to be used to connect the cascaded groove structures in series to achieve the desired output voltage.

The delineation features (306a, 306b, 306c, 316, 318) physically separates the cascaded (series connected) grooves 304a-304d. The delineation features enables the cascaded (series connected) grooves 304a-304d to be connected in parallel via electrical connection to first and second terminals 312, 314, In this way, it is possible to extract the desired electric charge generated at the voltage designed by the number of cascaded groove structures 304a-304d.

The delineation feature comprises a plurality of channels, specifically a first channel 306a, a second channel 306b and a third channel 306c. Each channel 306a-306c is connected at their distal ends to a first transection channel 316, and connected at their proximal ends to a second transection channel 318. The first and second transection channels 316, 318 form part of the delineation feature and may be substantially channel-like, or may be further channels. The first and second transection channels 316, 318 generally connect to each channel 306a-306c perpendicularly at their respective ends. The first transection channel 316 first crosses the first series of grooves 304a towards one end of the substrate 302 and then crosses a spacer 308 between the first series of grooves 304a and the second series of grooves 304b, and subsequently crosses the second series of grooves 304b towards the opposite edge of the substrate 302. Since many of these delineation features are used, each series of grooves, 304a, 304b for example, are crossed toward each edge by elements of two successive transection channels 316, 318, as shown in FIG. 5. The delineation feature, specifically transection channels 316, 218 crosses towards an end of each groove of the series of grooves 304a, 304b, 304c, 304d. However, in other embodiments, the transection channels 316, 318 may terminate an end, i.e. cross at an end, of each groove of the series of grooves 304a, 304b, 304c, 304d.

It may be advantageous to use a plurality of channels 306a-306c between the series of grooves to mitigate the likelihood of an electrical short forming across the interface between the first series of grooves 304a and the second series of grooves 304b, that is, across the delineation feature. Furthermore, the described arrangement, specifically of transection channels 316, 318 at each end of each channel 306a-306c, may provide for an easier manufacture of such efficient and reliable substrates.

Together, the spacers 308 and the plurality of channels 306a-306c divide the substrate 302 into a first area 310a and a second area 310b. The first area 310a carries a positive charge and the second area 310b carries a negative charge. The first area 310a terminates at a first or positive terminal 312 at one edge of the substrate 302, and the second area 310b terminates at a second or negative terminal 314 at the other, opposite, edge of the substrate 302, referring to the transverse direction TD. The first area 310a provides an electrical connection of the first groove of each series of grooves 304a-304d to the first terminal 312. The second area 310b provides an electrical connection of the last groove of each series of grooves 304a-304d to the second terminal 314. Thus, a two-terminal device 300 having a first terminal 312 and a second terminal 314 is formed.

Figure 6:
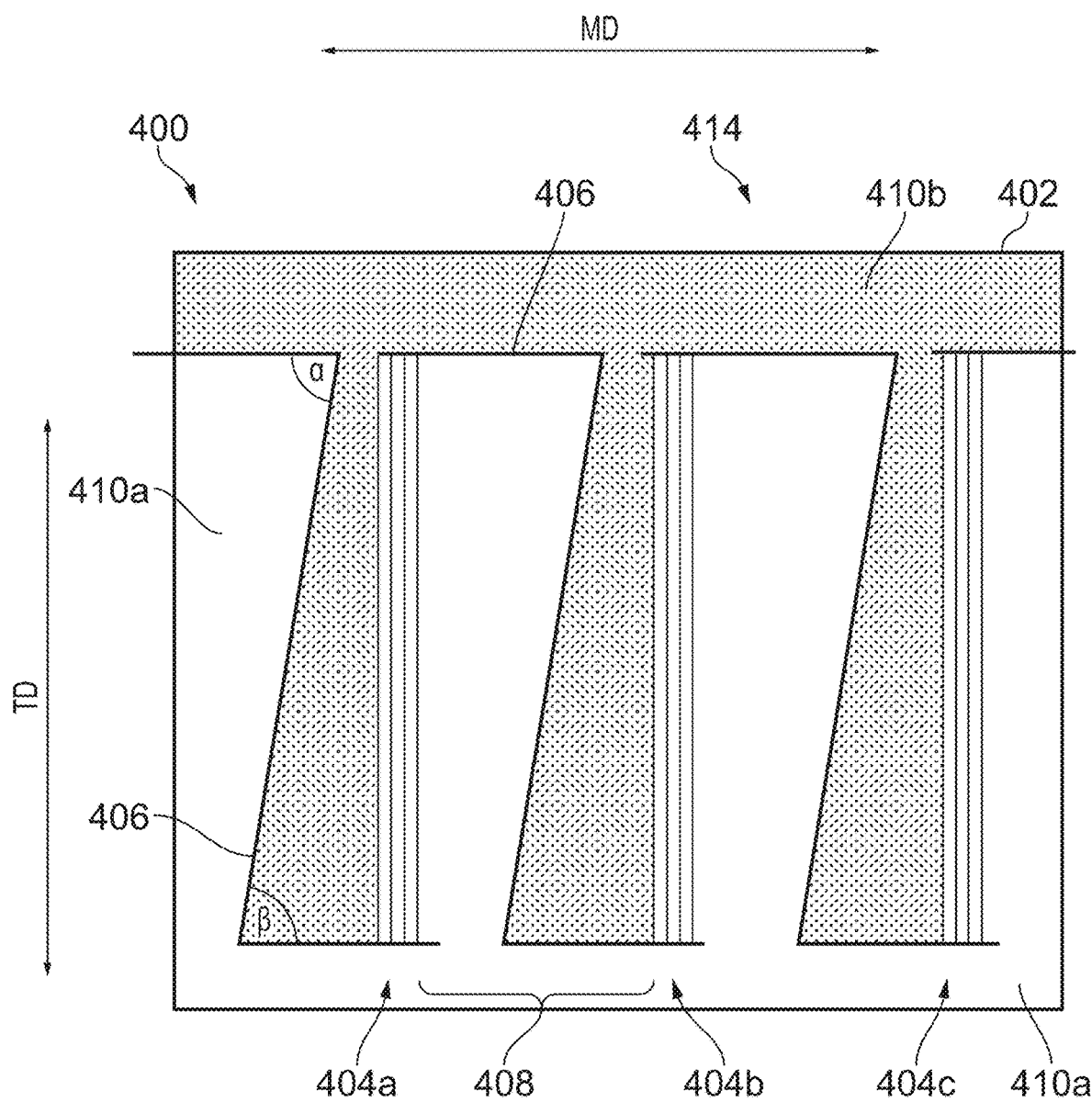
FIG. 6 illustrates a plan view of a substrate in accordance with one embodiment of the invention.

FIG. 6 illustrates a plan view of yet another two-terminal device 400 comprising a substrate 402. The substrate 402 has a surface comprising a plurality of series of grooves 404a-404c. In particular, the substrate 402 comprises a first series of grooves 404a, a second series of grooves 404b, and a third series of grooves 404c. Further series of grooves may be provided in the machine direction MD of the substrate 402. Each groove of the series of grooves 404a-404c generally run in parallel to one another across the transverse direction TD of the substrate 402, extending from a proximal end, for example, proximal to a first terminal 412 as described below, to a distal end, for example, distal to the first terminal 412 as described below. A channel 406 is provided between each series of grooves 404a-404c.

The two-terminal device 400 may be an optoelectronic device, such as a solar photovoltaic cell. Such a two-terminal device 400 includes a mixture of interdigitated (parallel connected) and cascaded (series connected) grooves 404a-404c. The operating voltage of such a two-terminal device 400 can be controlled by changing the number of series of grooves 404a-404c. Increasing the number of series of grooves 404a-404c increases the operating voltage of the two-terminal device 400. Such a two-terminal device 400 can be operated in parallel or a combination of series and parallel arrangement. It may be an advantage of the two-terminal device 400 that this removes the need for extra process steps to be used to connect the cascaded groove structures in series to achieve the desired output voltage.

The channel 406 physically separates the cascaded (series connected) grooves 404a-404c. The channel 406 enables the cascaded grooves 404a-404c to be connected in parallel via electrical connection to first and second terminals 412, 414. In this way, it is possible to extract the desired electric charge generated at the voltage designed by the number of cascaded groove structures 404a-404c.

The channel 406, also referred to as a delineation feature or structural delineation feature, comprises first region, extending along the machine direction MD, a second region extending along the machine direction MD and substantially parallel to the first region, and a third region therebetween extending along the transverse direction TD and connecting the first region to the second region. The channel 406 first crosses the first series of grooves 404a towards one end of the substrate 402 and then crosses a spacer 408 between the first series of grooves 404a and the second series of grooves 404b, and subsequently crosses the second series of grooves 404b towards the opposite edge of the substrate 402. Since many of these channels 406 are used, each series of grooves, 404a, 404b for example, are crossed toward each edge by elements of two successive channels 406, as shown in FIG. 6. The channel 406 terminates, i.e. crosses at, an end of each groove of the series of grooves 404a, 404b, 404c. However, in other embodiments, the channel 406 may cross towards an end, i.e. it may not terminate an end, of each groove of the series of grooves 404a, 404b, 404c.

Moreover, the channel 406 are substantially Z-shaped in the depicted embodiment. As shown in FIG. 6, a first predetermined angle, a, is formed between the first region of the channel 406 and the third region of the channel 406. A second predetermined angle, B, is formed between the second region of the channel 406 and the third region of the channel 406. In this example, $\alpha=\beta$, however, in other examples, $\alpha \neq \beta$. In this specific example, $\alpha$ and $\beta$ are approximately 70 degrees. $\alpha$ and $\beta$ may have a different value in other examples, for example, any value between 1 degree and 179 degrees.

It may be desirable to use a Z-shaped channel 406 as this can be advantageous during the manufacture of such substrates. As described further below, such substrates are coated using off-axis directional coating methods. Thus, by providing an angle between the various regions of the channel 406, the shadowing effect is increased, thereby providing regions of the channel 406 that are not coated with material. In this way, the likelihood of a short circuit across the channel 406 is mitigated, as described further below.

Together, the spacers 408 and the channels 406 divide the substrate 402 into a first area 410a and a second area 410b. The first area 410a carries a positive charge and the second area 410b carries a negative charge. The first area 410a terminates at a first or positive terminal 412 at one edge of the substrate 402, and the second area 410b terminates at a second or negative terminal 414 at the other, opposite, edge of the substrate 402, referring to the transverse direction TD. The first area 410a provides an electrical connection of the first groove of each series of grooves 404a-404c to the first terminal 412. The second area 410b provides an electrical connection of the last groove of each series of grooves 404a-404c to the second terminal 414. Thus, a two-terminal device 400 having a first terminal 412 and a second terminal 414 is formed.

Figure 7A:
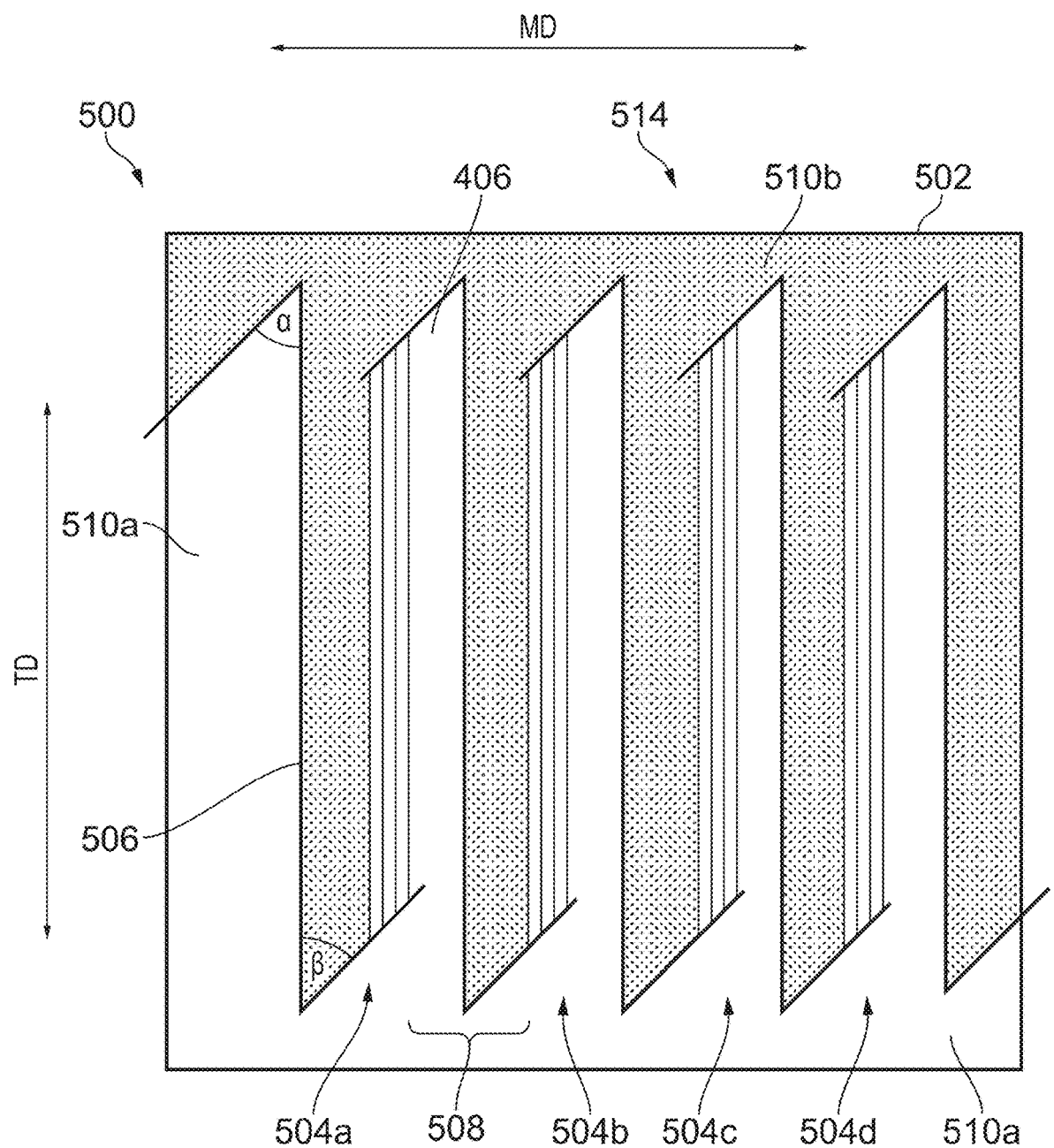
FIG. 7 illustrates (a) a plan view of a substrate in accordance with one embodiment of the invention and (b) a plan view of another substrate in accordance with one embodiment of the invention.
Figure 7B:
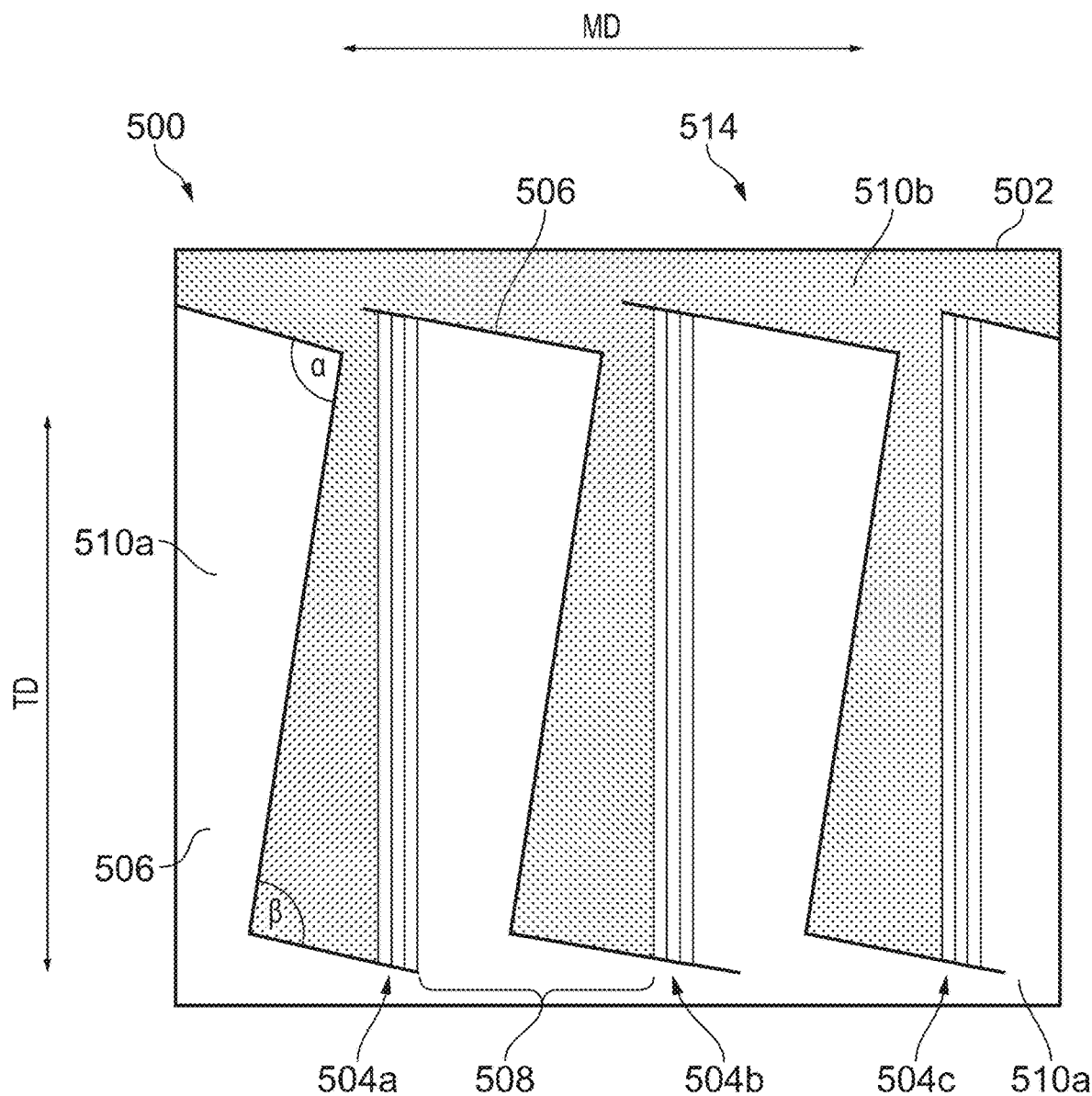

FIGS. 7(a) and 7(b) illustrates a plan view of yet another two-terminal device 500 comprising a substrate 502. The two-terminal device 500 of FIGS. 7(a) and 7(b) is similar in construction to the two-terminal device of FIG. 6. That is, the two-terminal device 500 includes a substrate 502, a plurality of series of grooves 504a-504d, a channel 506, a spacer 508, a first area 510a carrying a positive charge, a second area 510b carrying a negative charge, and first and second terminals 512, 514. These features are described in relation to FIG. 6 and are not discussed further here.

The two-terminal device 500 of FIGS. 7(a) and 7(b) differs from FIG. 6 in that the first and second predetermined angles $\alpha$, $\beta$ are formed differently. In FIG. 6, the third region of the channel 406 is angled and the first and second regions are substantially perpendicular to the series of grooves 404a-404c. However, as shown in FIG. 7(a), in the present example of the two-terminal device 500, the third region of the channel 506 extends substantially in parallel to the series of grooves 504a-504d, and the first and second regions are formed at an angle with respect to the third region. In the depicted example, $\alpha=\beta$, however, in other examples, $\alpha \neq \beta$. In this specific example, $\alpha$ and $\beta$ are approximately 45 degrees. In some examples (not shown), $\alpha$ and $\beta$ may be greater than 90 degrees, for example, up to, but not including, 180 degrees. As shown in FIG. 7(b), the delineation feature may take any shape, having any angle, disposed in any appropriate manner on the substrate.

It may be desirable to use a Z-shaped channel 506 as this can be advantageous during the manufacture of such substrates. As described further below, such substrates are coated using off-axis directional coating methods. Thus, by providing an angle between the various regions of the channel 506, the shadowing effect is increased, thereby providing regions of the channel 506 that are not coated with material. In this way, the likelihood of a short circuit across the channel 506 is mitigated, as described further below. Moreover, the Z-shaped channel 506 may be preferred as it allows for a more efficient use of space between the series of grooves 504a-504d.

Figure 8A:
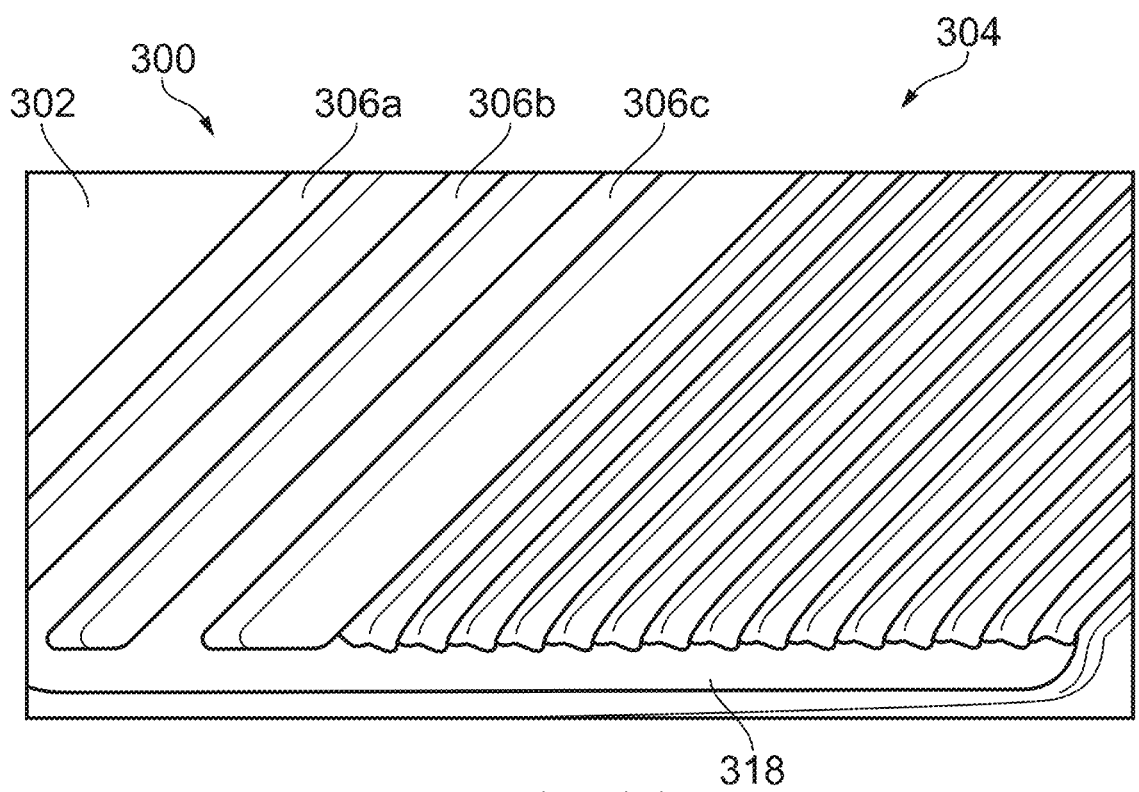
FIG. 8 illustrates (a) an enlarged top view of the substrate of FIG. 5, (b) an enlarged perspective view of the substrate of FIG. 5, (c) another enlarged top view of the substrate of FIG. 5, and (d) an enlarged perspective view of the transection region of the substrate of FIG. 5.
Figure 8B:
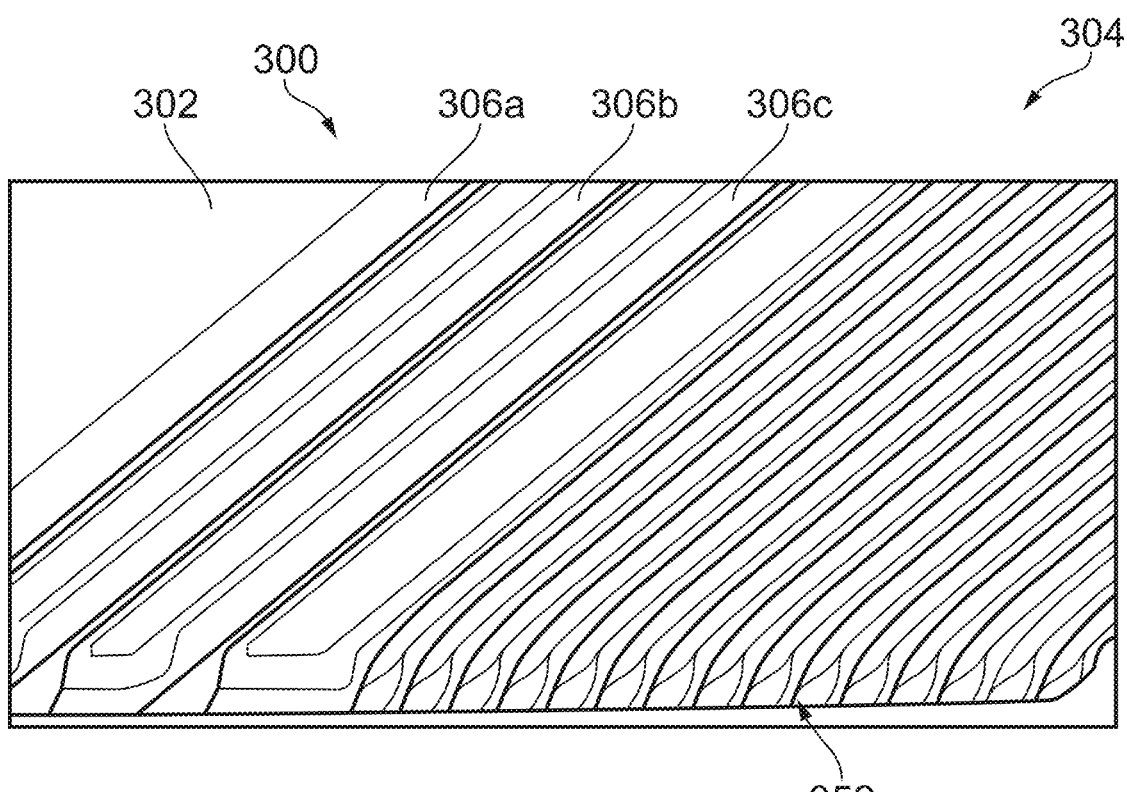
Figure 8C:
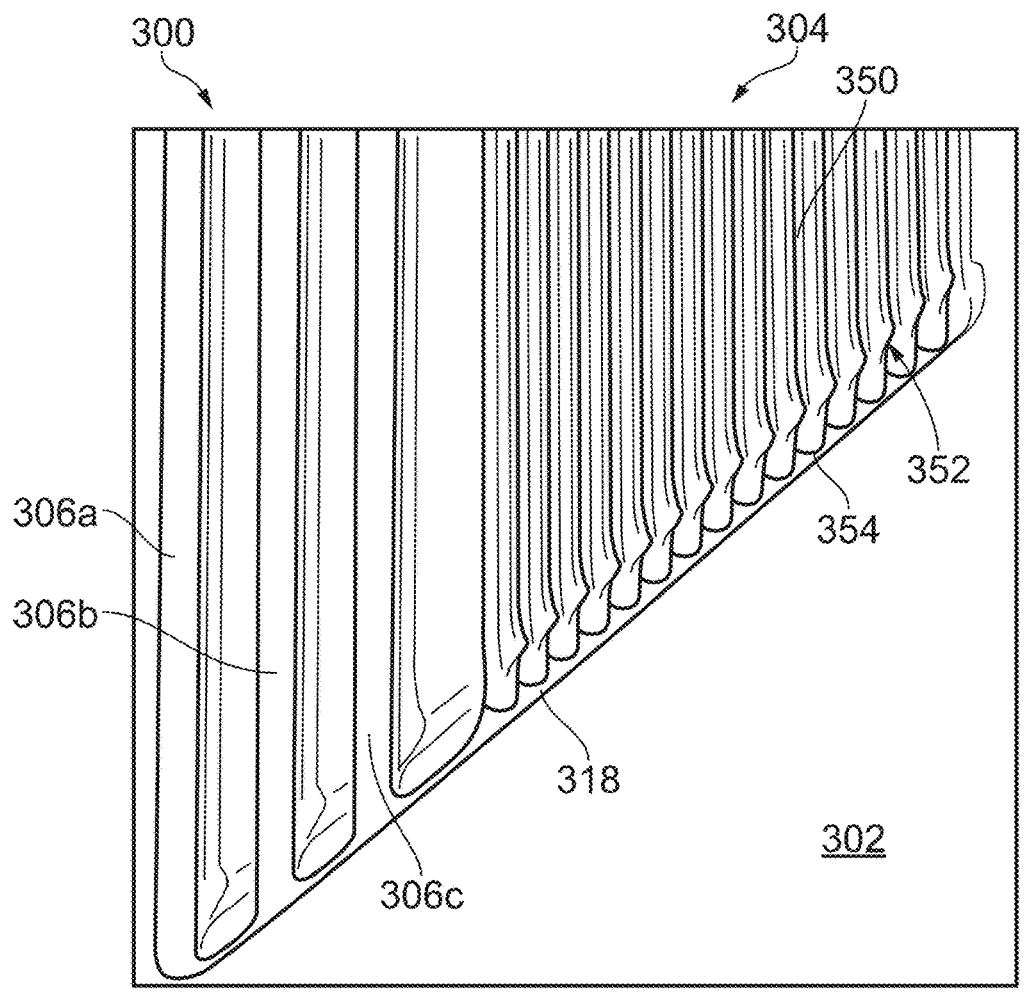
Figure 8D:
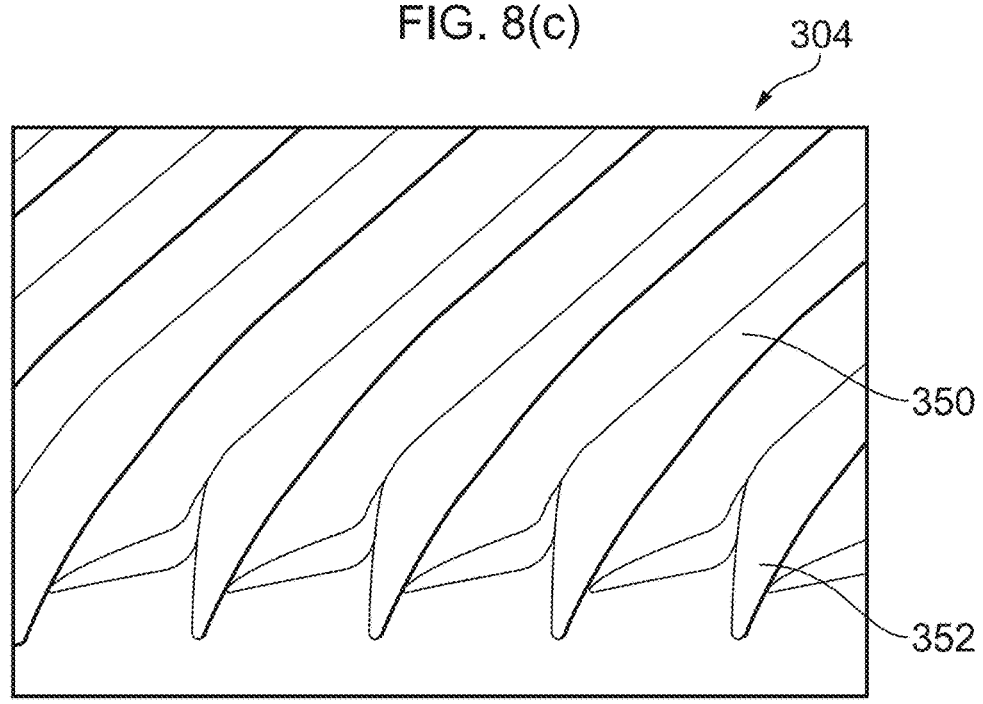

FIGS. 8(a) to 8(d) illustrate various views of the two terminal device 300 as shown in FIG. 5. Like numerals denote like features in FIGS. 8(a) to 8(d). As best shown in FIGS. 8(c) and 8(d), the two-terminal device 300 includes a series of grooves 304, each groove having a groove base 350. The delineation feature, specifically the transection channels 316, 318 of the delineation feature, each includes a channel base 354. As can be seen in FIGS. 8(a) to 8(d), and with further reference to FIGS. 10 and 11 as discussed below, the groove base 350 has a substantially constant depth across the elongate width of the grooves 304. Additionally, the groove base 350 tends towards the channel base 354 in a transection region 352. That is, the depth of each groove of the grooves 304 tends towards the depth of the delineation feature, or channel, in this example the transection channels 316, 318, within a transection region 352. This is described in further detail below, with reference to FIGS. 10 and 11.

Figure 9A:
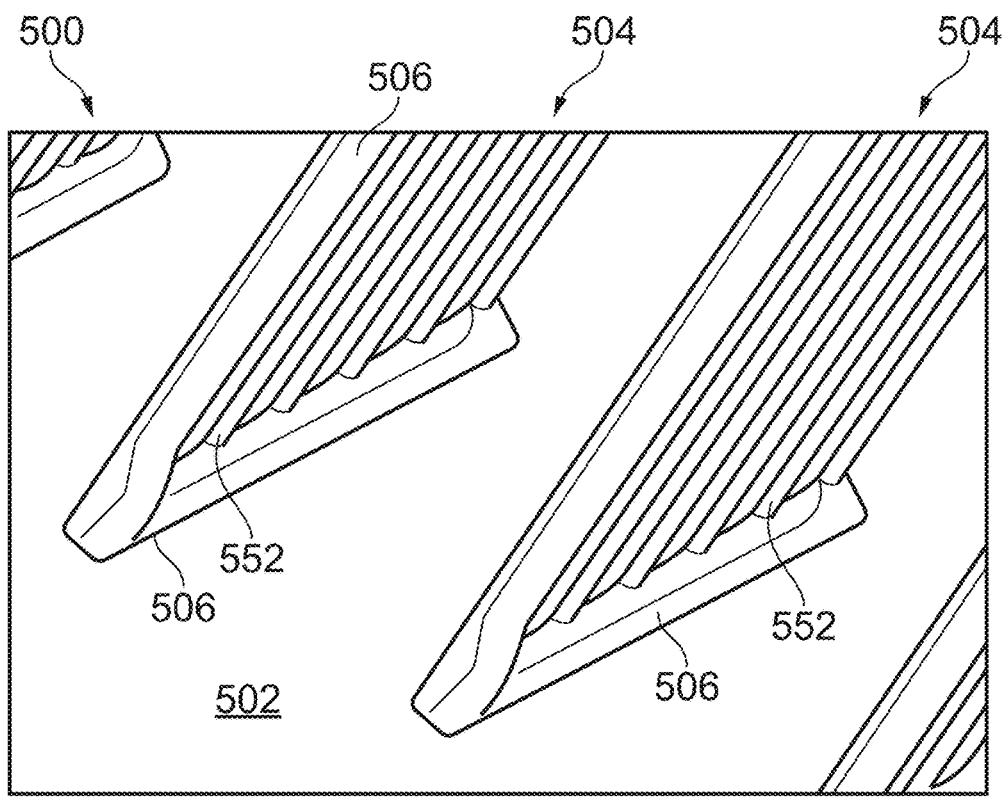
FIG. 9 illustrates (a) an enlarged perspective view of the substrate of FIG. 7(a), and (b) an enlarged perspective view of the transection region of the substrate of FIG. 7(a)
Figure 9B:
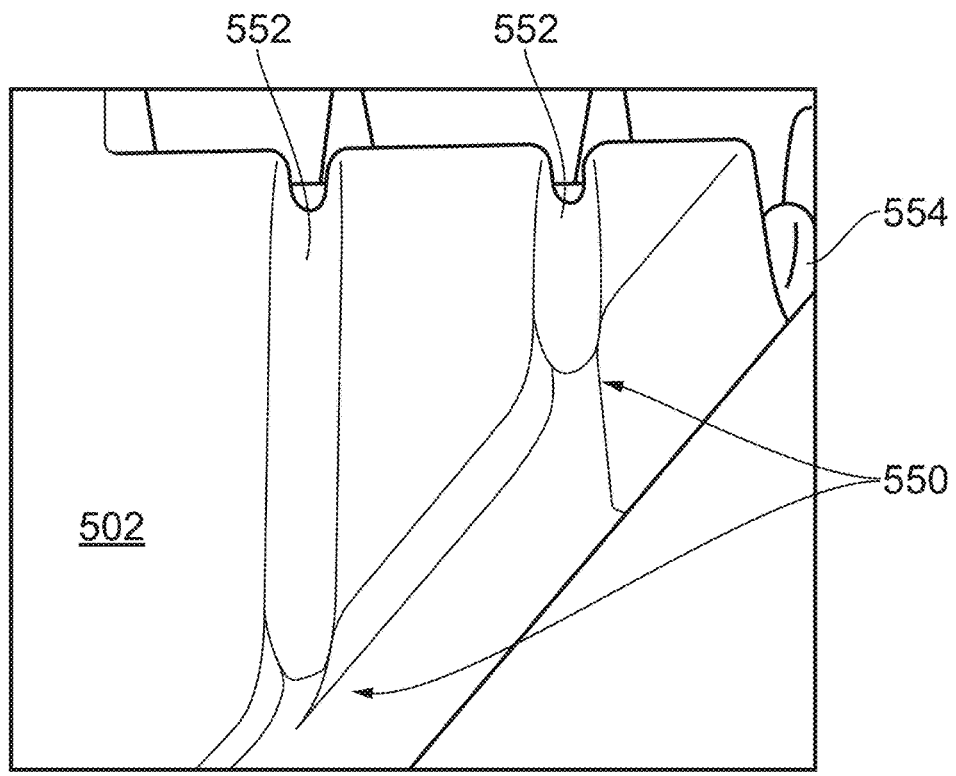

FIGS. 9(a) and 9(b) illustrate various views of the two-terminal device 500 as shown in FIG. 7(a). Like numerals denote like features in FIGS. 9(a) and 9(b). The two-terminal device 500 includes a series of grooves 504, each groove having a groove base 550. The delineation feature, specifically the channel 506, includes a channel base 554. As best shown in FIG. 9(b), and with further reference to FIGS. 10 and 11 as discussed below, the groove base 550 has a substantially constant depth across the elongate width of the grooves 504. Additionally, the groove base 550 tends towards the channel base 554 in a transection region 552. That is, the depth of each groove of the grooves 504 tends towards the depth of the delineation feature, in this example, the channel 506, within a transection region 552. This is described in further detail below, with reference to FIGS. 10 and 11.

Figure 10:
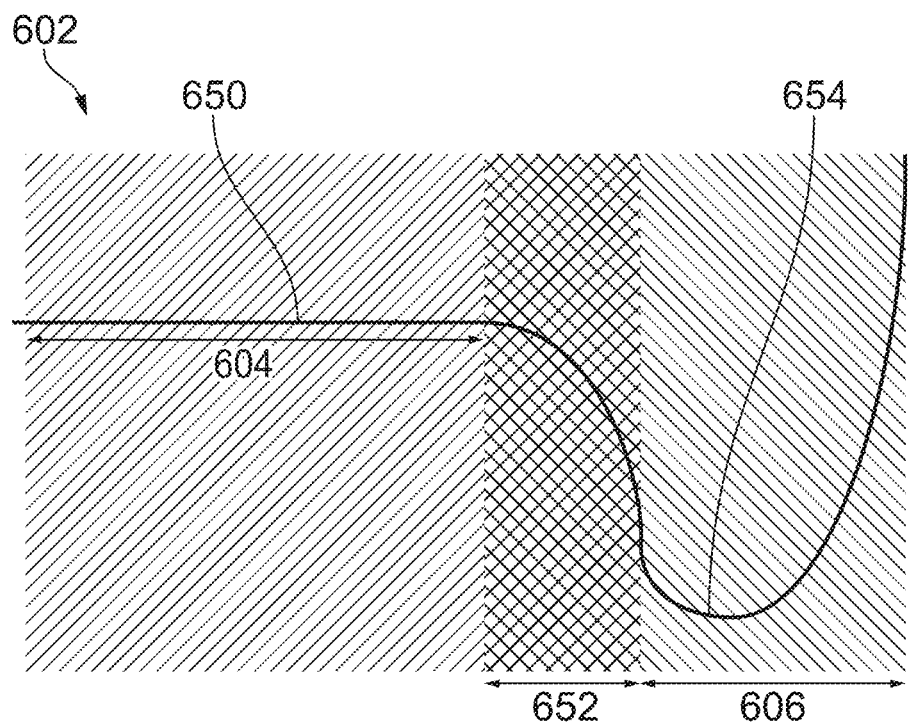
FIG. 10 illustrates a cross-sectional view of a groove, a transection region and a channel of a substrate in accordance with one embodiment of the invention.

FIG. 10 illustrates a cross-sectional view of one example of a transection region between a groove and a channel that can be applied to any of the examples discussed herein. Specifically, FIG. 10 shows a substrate 602 having a groove 604 of a series of grooves, and a channel 606. The channel 606 transects the groove 604 at its proximal end. The groove 604 includes a groove base 650, and the channel 606 includes a channel base 654.

The groove 604, specifically the groove base 650, tends towards the channel 606, specifically the channel base 654, in a transection region 652. The transection region 652 has a transection region base 656 that is substantially arcuate in the example shown. That is, the transection region base 656 has a variable depth as it tends from the groove base 650 to the channel base 654. The variable depth is non-linear in the depicted example.

Figure 11:
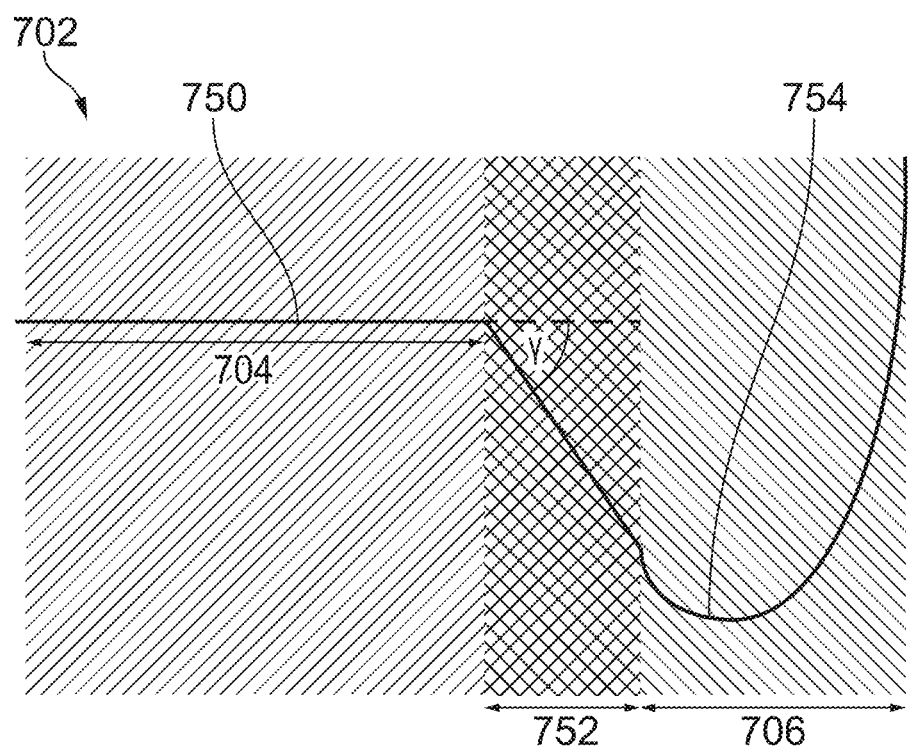
FIG. 11 illustrates a cross-sectional view of a groove, a transection region and a channel of a substrate in accordance with one embodiment of the invention.

FIG. 11 illustrates another example of a transection region between a groove and a channel that can be applied to any of the examples discussed herein. Specifically, FIG. 11 shows a substrate 702 having a groove 704, of a series of grooves, and a channel 706. The channel 706 transects the groove 704 at its proximal end. The groove 704 includes a groove base 750, and the channel 706 includes a channel base 754.

The groove 704, specifically the groove base 750, tends towards the channel 706, specifically the channel base 754, in a transection region 752. The transection region 752 has a transection region base 756 that is substantially linear, or straight, in the example shown. That is, the transection region base 756 has a variable depth as it tends from the groove base 750 to the channel base 754. The variable depth is linear in the depicted example.

As shown in FIG. 11, the linear transection region 752 forms an angle γ with respect to an imaginary axis, formed as a continuation of the groove base 750. The angle γ is shown as approximately 45 degrees in the depicted example. However, other angles may be used.

Figure 12:
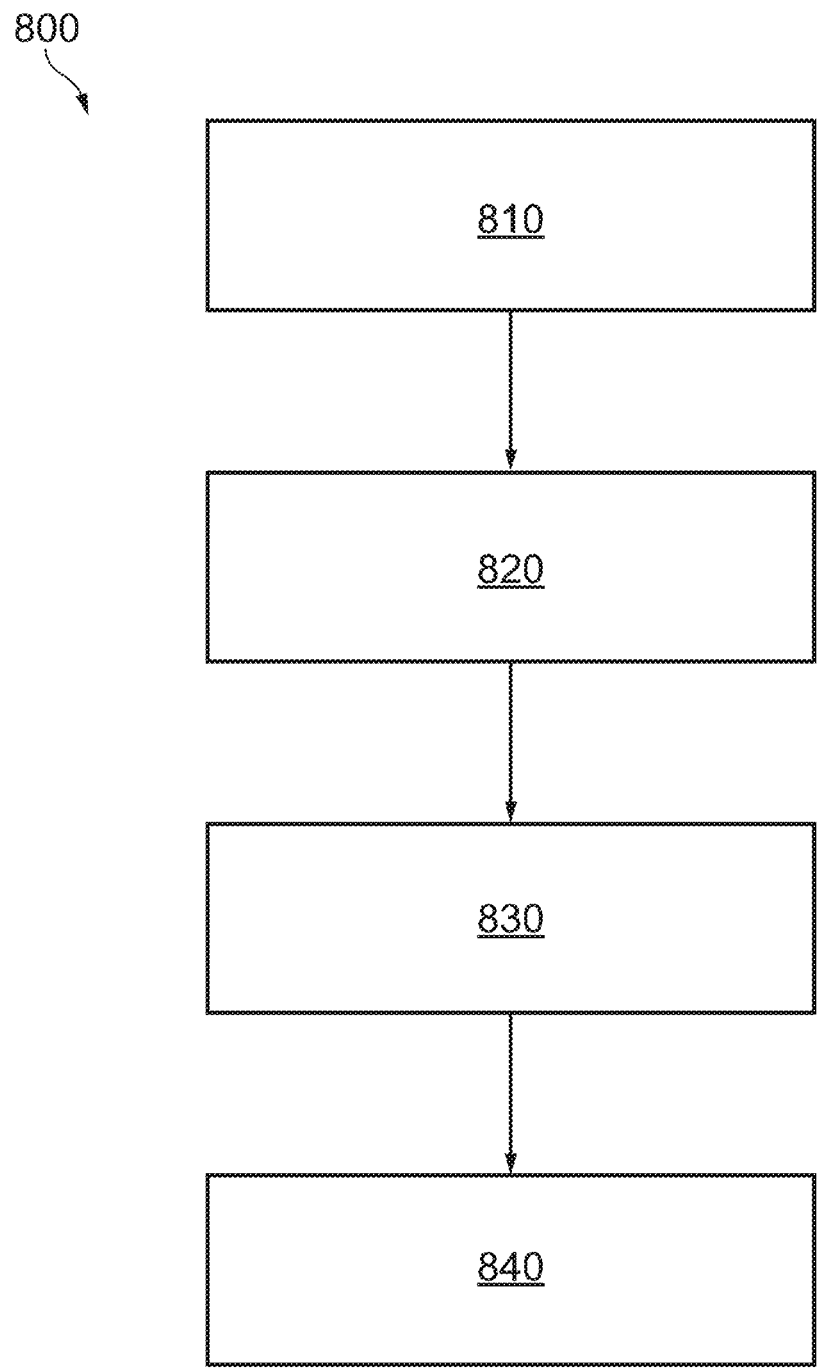
FIG. 12 illustrates a method of forming a substrate in accordance with one embodiment of the invention.

FIG. 12 illustrates a method 800 of forming a substrate as described herein. The method 800 includes the step of providing 810 a web of flexible material, forming 820 a first series of grooves within the web of flexible material, forming 830 a second series of grooves within the web of flexible material, and forming 840 a channel between the first series of grooves and the second series of grooves within the web of flexible material.

The respective steps 810, 820, 830, 840 may be carried out sequentially, that is in an order. For example, the steps 810, 820, 830, 840 may be carried out in the order as described in FIG. 12. Alternatively, the steps 810, 820, 830, 840 may be carried out in any other order. For example, the step of forming 840 the channel may take place between forming 820 the first series of grooves and forming 830 the second series of grooves. Further, two or more, or all, of steps 810, 820, 830, 840 may be carried out simultaneously, or concurrently, that is at the same time. For example, the steps of forming 820 the first series of grooves, forming 830 the second series of grooves, and forming 840 the channel may all take place simultaneously.

The step of forming 840 the channel further includes forming the channel such that the channel transects a portion of the first series of grooves and the second series of grooves towards a proximal end of each groove. Furthermore, the step of forming 840 the channel includes forming a depth of each groove that tends towards the depth of the channel at the proximal end of each groove.

Figure 13:
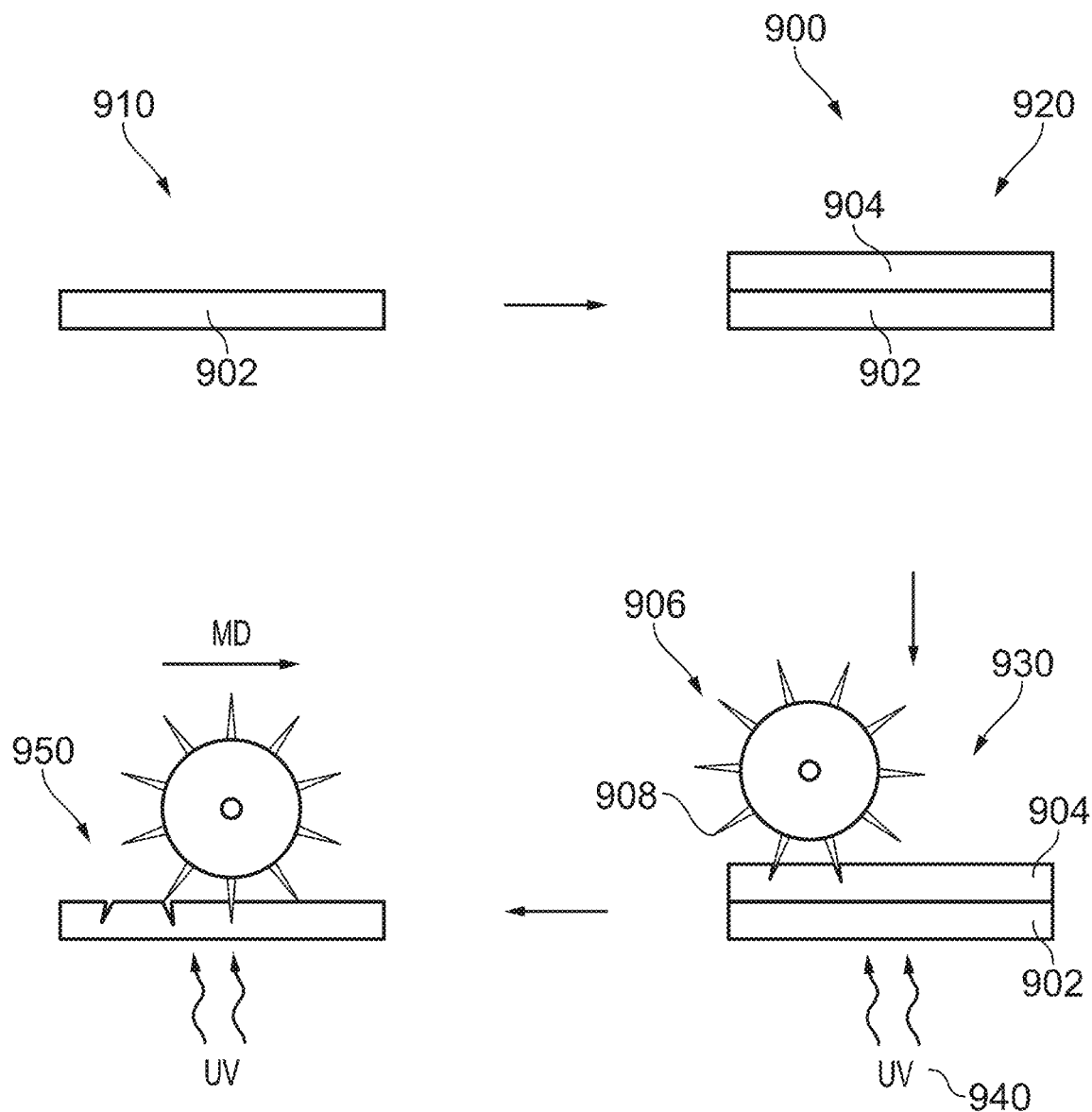
FIG. 13 illustrates a method of forming a substrate in accordance with one embodiment of the invention.

In some examples, one or more of the steps of forming 820 a first series of grooves, forming 830 a second series of grooves and forming 840 a channel therebetween includes an embossing process, as described in relation to FIG. 13.

FIG. 13 illustrates a specific method 900 of forming a substrate as described herein. The method 900 may be a specific example of the method 800 of FIG. 12, for example, the method 900 may represent an embossing process. The method 900 starts by providing 910 a web of flexible material 902. The method 900 also includes the step of coating 920 the web of flexible material 902 with a UV-curable composition, thereby forming a UV-curable coating 904 on at least one surface of the web of flexible material 902. The method may also include the step of engaging 930 the coated web of flexible material (902, 904) with a shim, shown in this particular example as a master shim being a cylindrical stamping roll 906. In other examples, there may be a plurality of shims, a single master shim, or a stamping plate formed as one or more of the plurality of shims or as the single master shim. That is, the skilled person would recognise that the shim need not be a master shim, nor need it be a cylindrical stamping roll 906. In the example shown, the cylindrical stamping roll 906 includes a series of protrusions 908. The protrusions 908 correspond to the first series of grooves, the second series of grooves and the channel, as described further below.

As the protrusions 908 engage the coated web of flexible material (902, 904), the UV-curable coating 904 is at least partially UV-cured 940 during the engagement step 930. The protrusions 908 are then removed 950 from the coated web of flexible material (902, 904). As the protrusions 908 are removed 950, the coated web of flexible material (902, 904) is caused to be drawn towards the protrusions 908 of the cylindrical stamping roll 906 as they are removed 950, due to the partial UV-curing of the UV-curable coating 904. However, since the UV-curable coating 904 is only partially UV-cured, that is not fully cured, the coated web of flexible material (902, 904) then relaxes as the protrusions 908 of the cylindrical stamping roll 906 are fully removed. In this way, the transection region between the first series of grooves or the second series of grooves and the channel is first caused to be drawn upwardly, towards the cylindrical stamping roll 906, and then relaxes, such that the transection region is formed in a manner such that the depth of the grooves tends towards the depth of the channel, as described above.

The cylindrical stamping roll 906 is continually rolled 960 across the machine direction MD of the coated web of flexible material (902, 904). Thus, the process is repeated along the machine direction MD. It may also be desirable to cut the formed substrate at various intervals along the machine direction MD. In such cases, the method 900 may optionally include the step of cutting the master substrate into a plurality of substrates.

Figure 14:
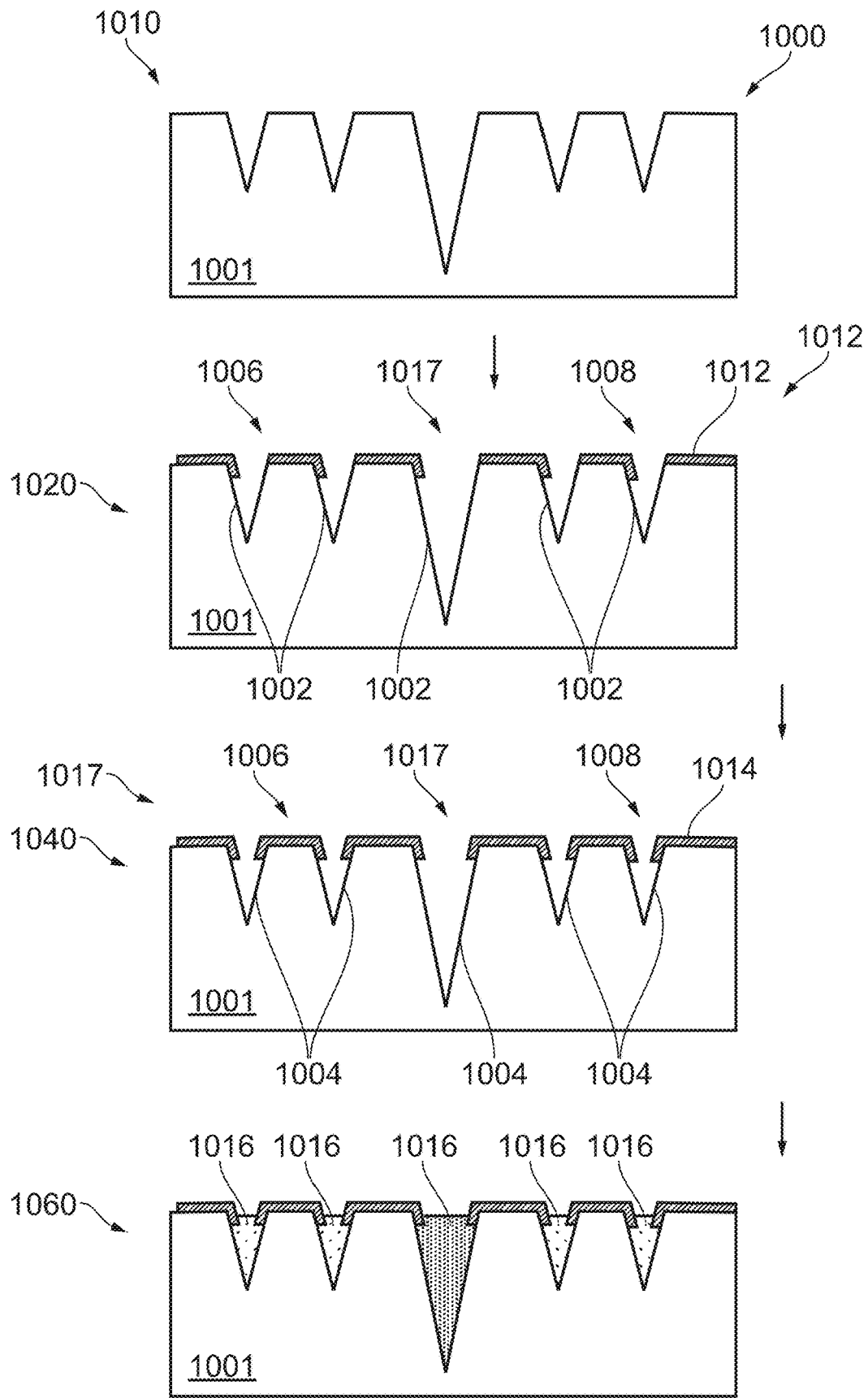
FIG. 14 illustrates a method of forming a two-terminal device in accordance with one embodiment of the invention.

FIG. 14 illustrates a method 1000 of forming a two-terminal device having a substrate as described herein. The method 1000 may be a continuation of method 800 of FIG. 12 or method 900 of FIG. 13. The method 1000 starts by providing, or forming, 1010 a substrate 1001 as described herein. The method 1000 may also include coating 1020 a first face 1002 of a first series of grooves 1006, a second series of grooves 1008 and a channel 1011 with a first material 1012. The method 1000 may also include coating 1040 a second face 1004 of the first series of grooves 1006, the second series of grooves 1008 and the channel 1010 with a second material 1014. The first material 1012 and the second 1014 may be different.

The coating steps 1020, 1040 may comprise an off-axis directional coating as best shown in FIGS. 14, and 15(a) to 15(c). That is, the coating steps 1020, 1040 may comprise coating at an angle formed with respect to the plane of the substrate 1001. As shown in FIG. 15, such an angle δ may be in the range of 30 to 70 degrees, for example approximately 45 degrees.

Figure 15A:
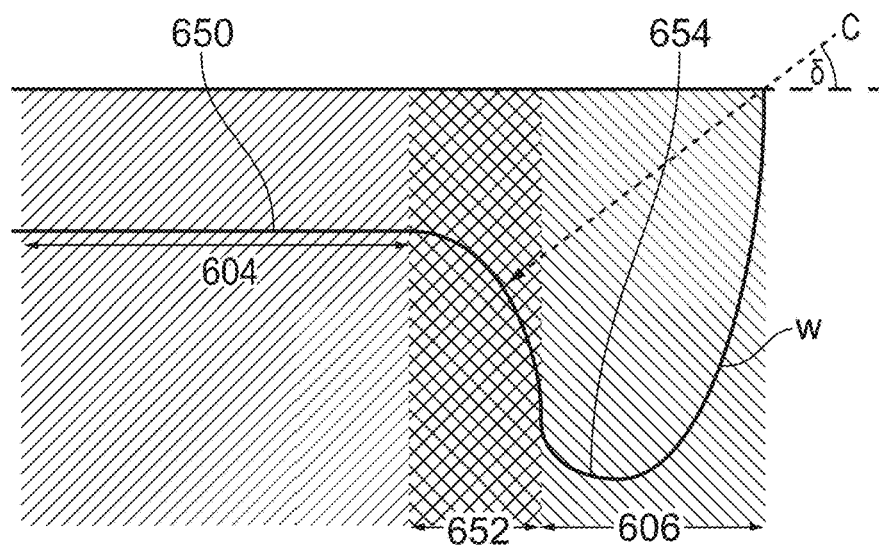
FIG. 15 illustrates a coating process of the method of FIG. 14.
Figure 15B:
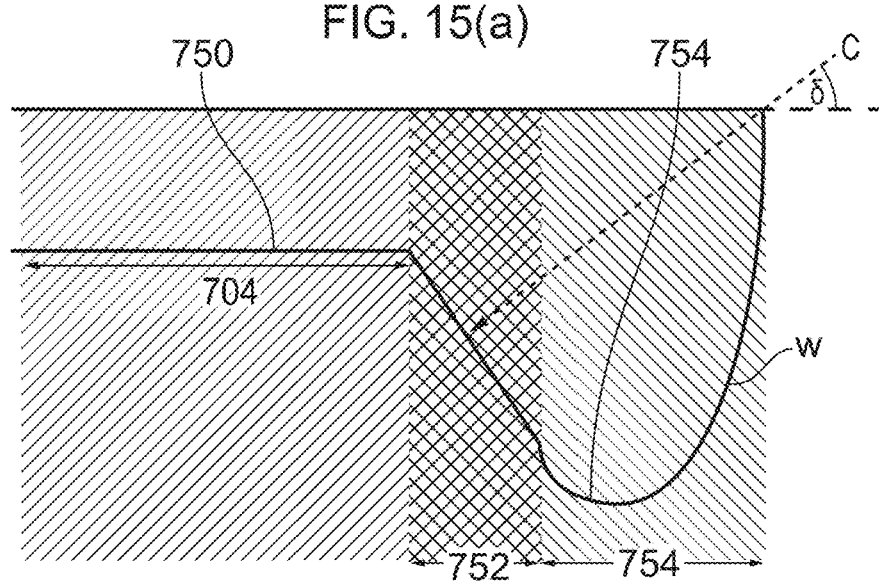
Figure 15C:
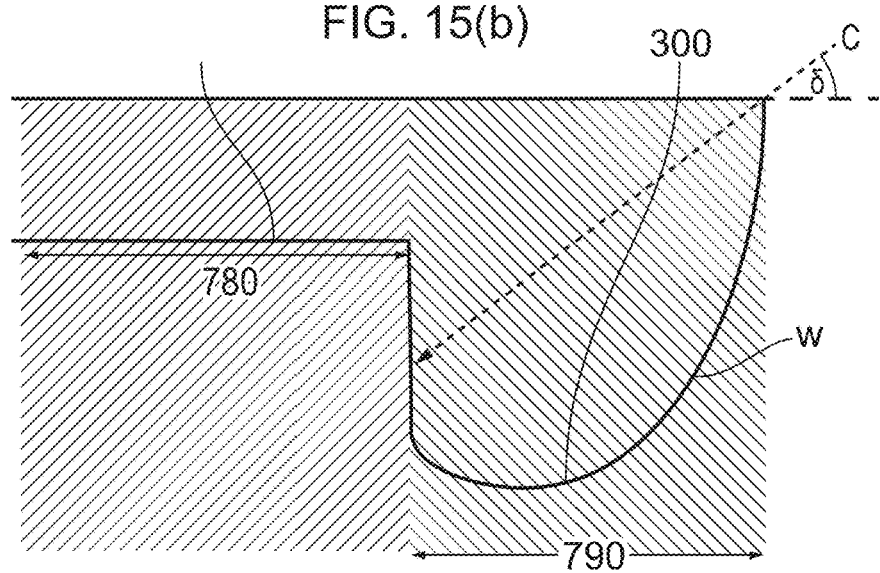

FIGS. 15(a) and 15(b) illustrate a coating process, of the substrates FIGS. 10 and 11, respectively. FIG. 15(c) further illustrates a comparison coating process without having the transection regions of FIGS. 10 and 11 as described. FIGS. 15(a) and 15(b) illustrate a coating process having an incident coating angle δ. The arrow C illustrates the incoming coating of a material. As shown, the transection region 652, 752, tending from the groove depth 650, 750 to the channel depth 654, 754, as described above, ensures that a large proportion of the transection region 652, 752, that is the region connecting the grooves 604, 704 to the channel 606, 706, is shadowed, indicated by the region below arrow C, by the wall W of the channel 606, 706 during the coating process. In this way, during the coating process, a large proportion of the transection region 652, 752 is not coated with an incoming material. Thus, once the grooves 604, 704 and the channel 606, 706 are filled with a material that allows for an electrical pathway, as described below, the lack of coated material in the transection region 652, 752 ensures that there is no electrical connection between the grooves 604, 704 and the channel 606, 706.

In comparison, referring to FIG. 15(c), without the transection regions 652, 752 that tend from the groove depth to the channel depth as described, the interface between an adjacent series of grooves 780 and the channel 790 is coated with material at the same incident coating angle δ as in FIGS. 15(a) and 15(b). That is, in the example of FIG. 15(c), the creation of an electrical short during manufacture is solely dependent upon the amount of material to be filled in the grooves 780 and the channel 790. This is known to be difficult to control. Whereas, electrical shorts are mitigated through the use of a transection region in which the groove depth tends to the channel depth, thus increasing the shadowing of the region between the grooves and the channel during manufacture.

The method 1000 further includes the step of at least partially filling 1060 the channel 1010 with a third material 1016. The third material 1016 may be different to the first material 1012 and the second material 1014. In some examples, the step of at least partially filling 1060 the channel 1010 may comprise a printing process. In addition to the channel 1010 being filled with a third material 1016, the first series of grooves 1006, the second series of grooves 1008, or both the first and second series of grooves 1006, 1008 may be at least partially filled with the same third material 1016, as shown in FIG. 14. FIG. 14 illustrates an embodiment in which the channel 1004 is filled, or completely filled, with the third material 1016.

The first material 1012, the second material 1014 and the third material 1016 vary depending on the intended use of the two-terminal device that is to be formed. For example, in some cases it may be desirable to produce a solar photovoltaic device that can supply electricity to a device. In this example, the first material 1012 may be a non-insulating material, such as a conductor or a semiconductor, the second material 1014 may be a non-insulating material, such as a conductor or a semiconductor, and the third material 1016 may be a perovskite structured material. As would be recognised by the person skilled in the art, the two-terminal device can be produced with the appropriate coatings that are suitable for the intended final use of the two-terminal device to be produced.

Figure 16:
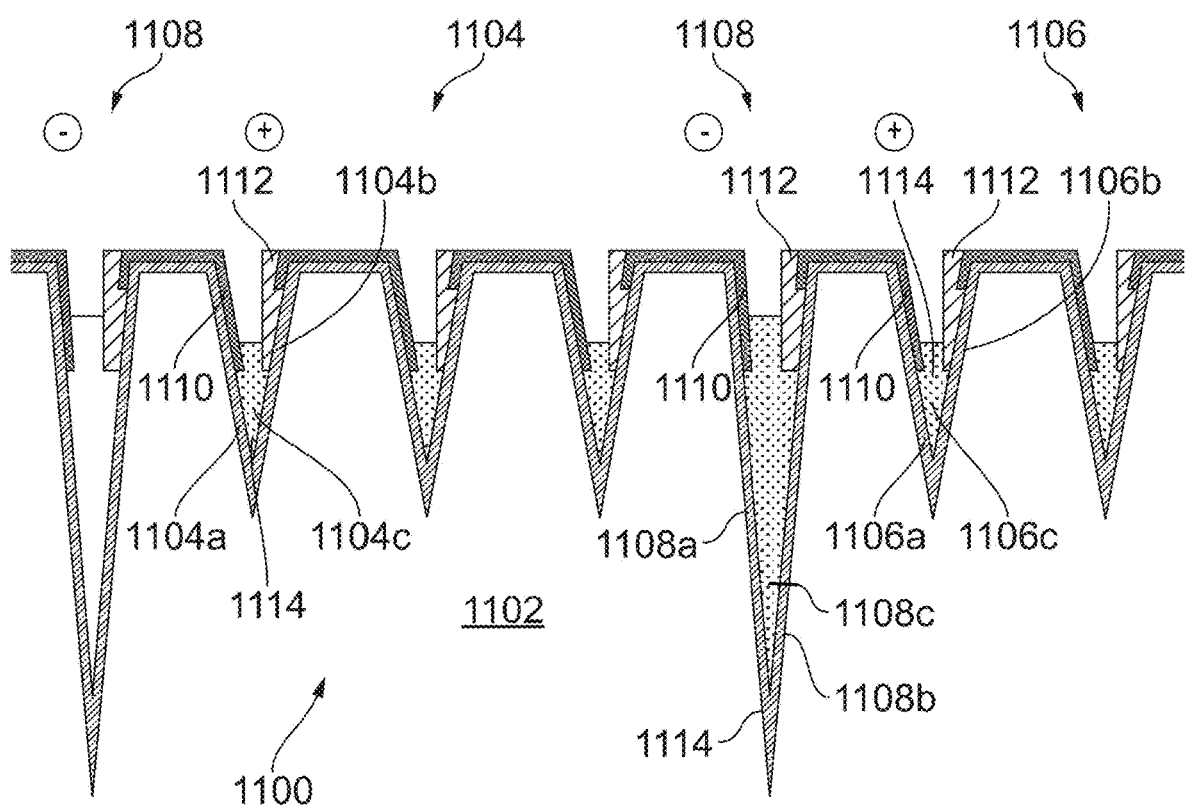
FIG. 16 illustrates a two-terminal device in accordance with one embodiment of the invention.

FIG. 16 illustrates a two-terminal device 1100 including a substrate 1102 as described herein. The substrate 1102 includes a first series of grooves 1104, a second series of grooves 1106 and a channel 1108 therebetween. The channel 1108 may have a greater depth than that of the grooves 1104, 1106, as shown.

The first series of grooves 1104 include a first face 1104a, a second, opposing, face 1104b, and a cavity 1104c therebetween. The second series of grooves 1106 include a first face 1106a, a second, opposing, face 1106b, and a cavity 1106c therebetween. The channel 1108 includes a first face 1108a, a second, opposing, face 1108b, and a cavity 1108c therebetween. The first faces 1104a, 1106a, 1108a are coated with a first material 1110. The second face 1104b, 1106b, 1108b are coated with a second material 1112. Additionally, a third material 1114 is provided within the cavities 1104c, 1106c, 1108c. As shown in FIG. 16, the cavities 1104c, 1106c of the first and second series of grooves 1104, 1106 are filled to the extent that the first material 1110 and the second material 1112 on opposing faces (1104a, 1104b and 1106a, 1106b) are in contact with the third material 1114. In this way, an electrical pathway is formed across the first series of grooves 1104 and the second series of grooves 1106.

As can be seen in FIG. 16, the cavity 1108c of the channel 1108 is filled with the third material 1114 such that the third material 1114 is in contact with the first material 1110 on the first face 1108a or the second material 1112 on the second face 1108b. Thus, an electrical pathway is provided. However, due to the nature of the substrate described herein and the methods of formation thereof, the cavity 1108c of the channel 1108 could be filled with the third material 1114 to a lesser extent. Thus, even if the cavity 1108c is filled to a large extent as shown, it would not make contact with the first material 1110 or the second material 1112 within the transection region in which the grooves 1104, 1106 meet with the channel 1108. In this way, an electrical pathway, and thus an electrical short, is prevented across the channel 1108, whilst allowing for a more simple manufacturing process.

Figure 17:
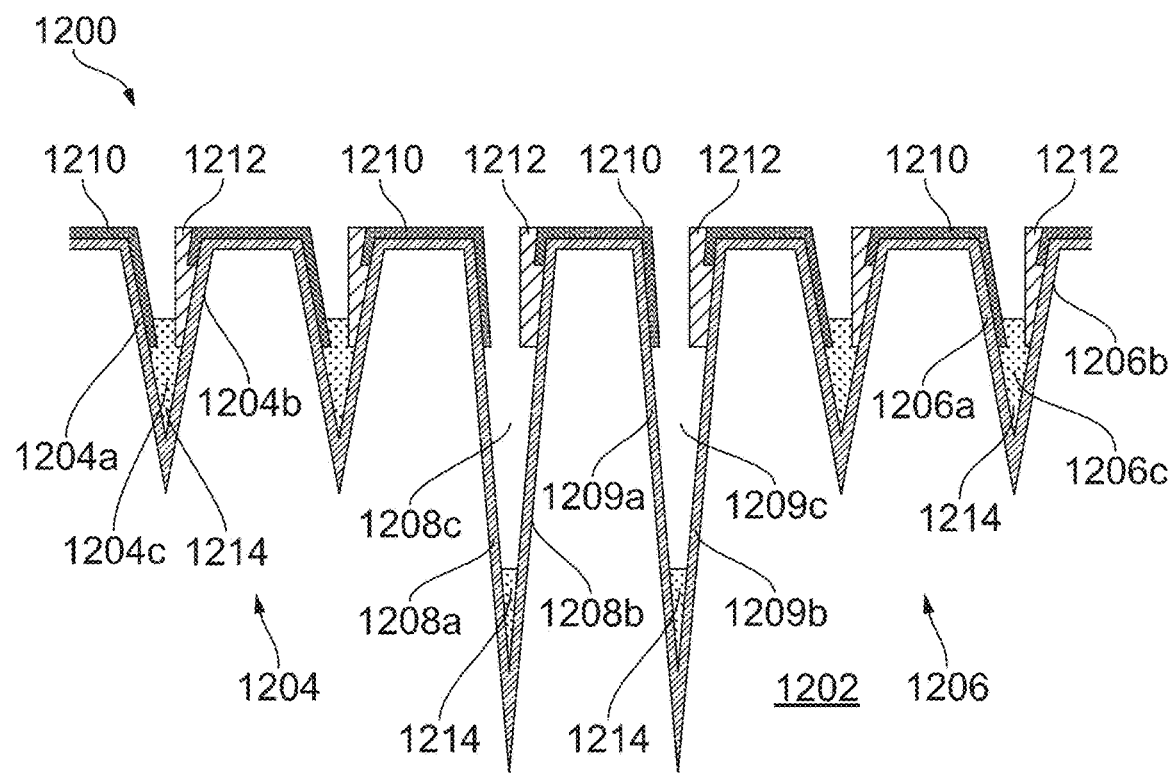
FIG. 17 illustrates a cross-section view of a two-terminal device according to one embodiment of the present invention.

FIG. 17 illustrates a two-terminal device 1200. The two-terminal device 1200 includes a substrate 1202. The substrate 1202 has a first cell and a second cell that is spaced apart from the first cell. The second cell is spaced from the first cell along the substrate 1202 along the web direction of the substrate 1202. The first cell is provided with a first series of grooves 1204. Each of the first series of grooves 1204 include a first face 1204a, a second, opposing, face 1204b, and a cavity 1204c therebetween. The second cell is provided with a second series of grooves 1206. Each of the second series of grooves 1206 include a first face 1206a, a second, opposing, face 1206b, and a cavity 1206c therebetween. A connecting portion including a first channel 1208 and a second channel 1209 is provided between the first cell and the second cell. The first channel 1208 has a first face 1208a, a second, opposing, face 1208b, and a cavity 1208c therebetween. The second channel 1209 is provided between the first channel 1208 and the second cell. The second channel 1209 has a first face 1209a, a second, opposing, face 1209b, and a cavity 1209c therebetween. In other examples, one channel 1208 is provided between the first cell and the second cell. In other additional examples, more than two channels 1208, 1209 are provided between the first cell and the second cell. The substrate 1202 is provided with a first terminal and a second terminal. The first and second terminals are formed at opposing edges of the substrate 1202 across the transverse direction of the substrate 1202. The first and second terminals are electrically connected to the first cell and the second cell in a manner similar to that described in relation to FIGS. 3 to 7. That is, the first and second terminals are in electrical communication with each of the first cell and the second cell. In some examples, one, or both, of the cavities 1208*c*, 1209*c* may be filled to the extent that the third material 1214 within those cavities 1208*c*, 1209*c* contact the first material 1210 and the second material 1212 to provide an electrical connection thereacross. However, due to the combined resistance of the channels 1208, 1209, as discussed further below, charge from the first or second cell is extracted at the first and second terminals of the device rather than being transferred across the connecting portions 1208, 1209.

The first faces 1204*a*, 1206*a*, 1208*a*, 1209*a* are coated with a first material 1210. The second faces 1204*b*, 1206*b*, 1208*b*, 1209*b* are coated with a second material 1212. Additionally, a third material 1214 is provided within the cavities 1204*c*, 1206*c*, 1208*c*, 1209*c*. The cavities 1204*c*, 1206*c* of the first and second series of grooves 1204, 1206 are filled to the extent that the first material 1210 and the second material 1212 on opposing faces (1204*a*, 1204*b* and 1206*a*, 1206*b*) are in contact with the third material 1214. This forms an electrical pathway across the first series of grooves 1204 of the first cell, and between the second series of grooves 1206 of the second cell.

The cavity 1208*c* of the first channel 1208 is partially filled with the third material 1214 such that the third material 1214 in the cavity 1208*c* does not contact the first material 1210 on the first face 1208*a* and the second material 1212 on the second face 1208*b*. No electrical pathway is provided between the third material 1214 and the first material 1210 on the first face 1208*a*. No electrical pathway is provided between the third material 1214 and the second material 1212 on the second face 1208*b*. The cavity 1209*c* of the second channel 1209 is partially filled with the third material 1214 such that the third material 1214 in the cavity 1209*c* does not contact the first material 1210 on the first face 1209*a* and the second material 1212 on the second face 1209*b*. No electrical pathway is provided between the third material 1214 and the first material 1210 on the first face 1209*a*. No electrical pathway is provided between the third material 1214 and the second material 1212 on the second face 1209*b*. The first and second channels 1208, 1209 ensure there is an electrical resistance from one side of the connecting portion to the other.

In use, the combined resistance across the first and second channels 1208, 1209, that is the resistance across the connecting portion, is greater than the resistance across the first cell. The combined resistance across the first and second channels 1208, 1209 is greater than the resistance across the second cell. More specifically, the first cell has a first characteristic resistance. The second cell has a second characteristic resistance. The combined resistance across the first and second channels 1208, 1209 is a third characteristic resistance that is greater than the first characteristic resistance across the first cell. The third characteristic resistance is greater than the second characteristic resistance across the second cell. By having a combined resistance across the first and second channels 1208, 1209 that is greater than the resistance across the first cell and the second cell, charge is extracted from the first and second terminals, rather than being transferred across between the first cell and the second cell, across the connecting portion. In this particular example, the resistance value of the first characteristic resistance and the value of the second characteristic resistance are the same. It is envisaged that in some examples, the third characteristic resistance across the connecting portion is equal to at least one of the first characteristic resistance and the second characteristic resistance. It is envisaged that more than two channels 1208, 1209 may be provided between the first cell and the second cell. By providing multiple channels between the first cell and the second cell, the combined resistance is increased with the number of channels. The space between the channels may be increased to further increase the combined resistance across the connecting portion. In this particular example, the combined resistance across the connecting portion is five times the resistance across the first cell. In this particular example, the resistance across the connecting portion is also five times the resistance across the second cell. The resistance across the first cell and across the second cell are the same in this particular example.

Figure 18:
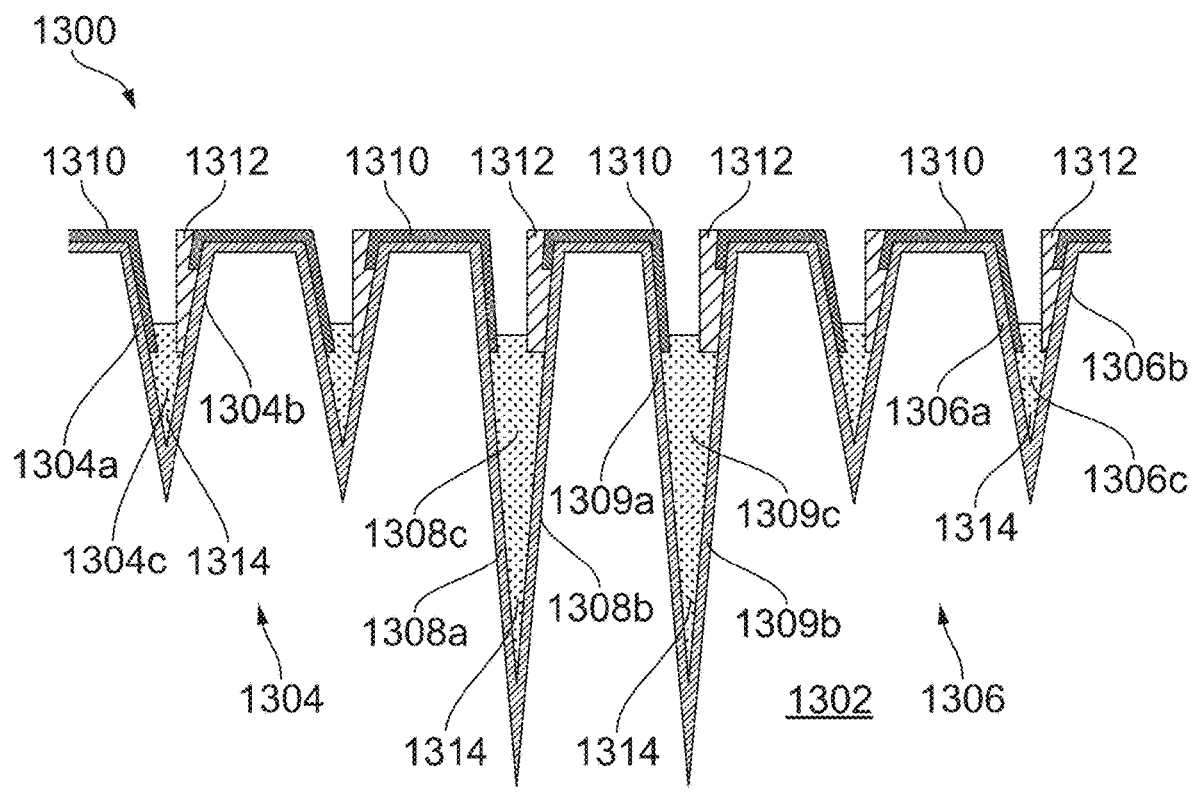
FIG. 18 illustrates a cross-section view of a two-terminal device according to another embodiment of the present invention.

FIG. 18 illustrates a two-terminal device 1300. The two-terminal device 1300 includes a substrate 1302. The substrate 1302 has a first cell 1304, a second cell 1306, a first terminal and a second terminal as previous described with reference to FIG. 17 and thus will not be described again in detail. Like numerals apply with respect to FIG. 17, except in that in FIG. 18 they begin with the digits "13" instead of "12". A connecting portion is provided between the first cell 1304 and the second cell 1306. The connecting portion includes a number of channels. In this particular example, the connecting portion is provided with two channels 1308, 1309 that are filled with the third material 1314 as described in relation to FIG. 17. As will be noted, FIG. 18 is identical to that of FIG. 17, except in that the channels within the connecting portion are filled, such that an electrical connection is made between the first material 1310 on one side of each channel, and the second material 1312 on the other side of each channel. Thus, an electrical pathway is formed thereacross.

In use, the resistance across the connecting portion is greater than the resistance across the first cell 1304. The resistance across the connecting portion is also greater than the resistance across the second cell 1306. More specifically, the first cell has a first characteristic resistance. The second cell has a second characteristic resistance. The resistance across the connecting portion is a third characteristic resistance that is greater than the first characteristic resistance across the first cell 1304. The third characteristic resistance is also greater than the second characteristic resistance across the second cell 1306. By having an arrangement where the resistance across the connecting portion is greater than the first characteristic resistance across the first cell 1304 and greater than the second characteristic resistance across the second cell 1306, charge is extracted from the first and second terminals, rather than being transferred across the first and second terminals. In this particular example, the third characteristic resistance is three times the first characteristic resistance across the first cell 1304. The third characteristic resistance is there times the second characteristic resistance across the second cell 1306. In some examples, the connecting portion is additionally provided with a resistive element (not shown) that increases the resistance across the connecting portion.

Figure 19:
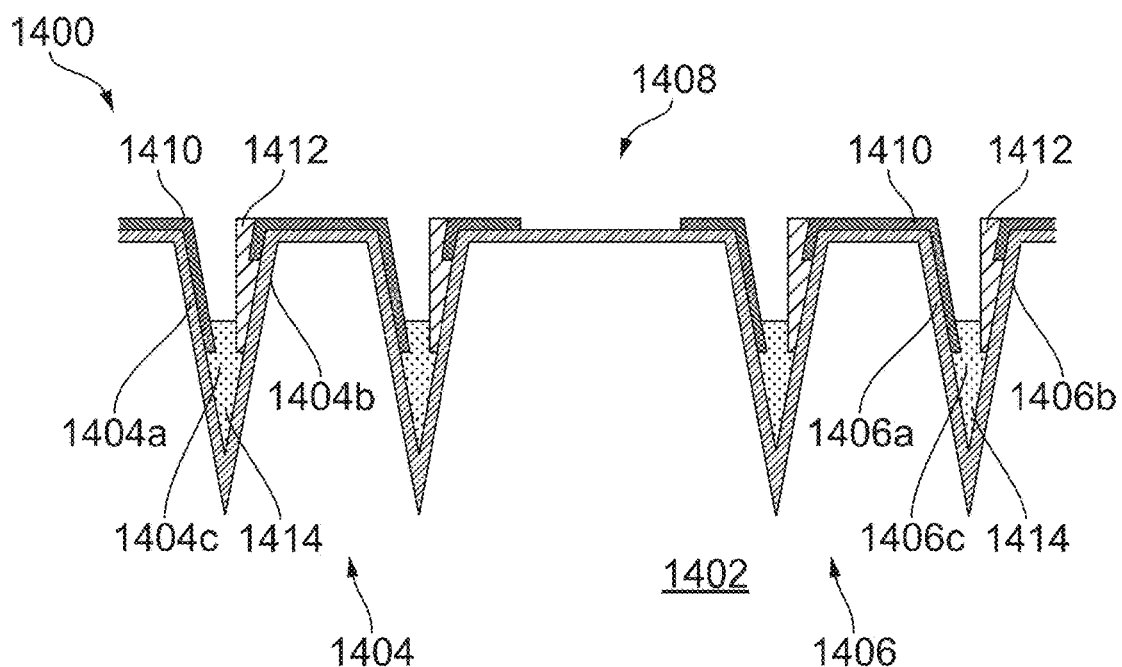
FIG. 19 illustrates a cross-section view of a two-terminal device according to a further embodiment of the present invention.

FIG. 19 illustrates a two-terminal device 1400. The two-terminal device 1400 includes a substrate 1402 that has a first cell 1404 and a second cell 1406 substantially as previously described with reference to FIG. 17, and therefore will not be described here again in detail. Substrate 1402 is provided with a first terminal and a second terminal substantially as previously described with reference to FIG. 17, and therefore will not be described here again in detail. A connecting portion 1408 is provided between the first cell 1404 and the second cell 1406. In this particular example, the connecting portion 1408 is a planar element extending from and between the first series of grooves forming the first cell 1404 and the second series of groves forming the second cell 1406. The connecting portion 1408 extends between the first cell 1404 and the second cell 1406 in the direction along the web direction of the substrate 1402. The first series of grooves include a first face 1404a, a second, opposing, face 1404b, and a cavity 1404c therebetween. The second series of grooves include a first face 1406a, a second, opposing, face 1406b, and a cavity 1406c therebetween. The first faces 1404a, 1406a are coated with a first material 1410. The second faces 1404b, 1406b are coated with a second material 1412. The second material 1412 coating the second face 1404b of the groove 1404 proximal the connecting portion 1408 partially coats the connecting portion 1408.

The first material 1410 coating the first face 1406a of the groove 1404 proximal the connecting portion 1408 partially coats the connecting portion 1408. In this way, the connecting portion 1408 provided between the first cell 1404 and the second cell 1406 is partially coated with a second material 1412 on the end of the connecting portion 1408 proximal the first cell 1404. The connecting portion 1408 provided between the first cell 1404 and the second cell 1406 is partially coated with a first material 1410 on the end of the connecting portion 1408 proximal the second cell 1406. The connecting portion 1408 is therefore provided between the first cell 1404 and the second cell 1406, partially coated with a second material 1412 on a first end proximal the first cell 1404, and is partially coated with a first material 1410 on a second end proximal the second cell 1406. The first material 1410 and the second material 1412 partially coating the connecting portion 1408 are electrically separated from one another. The connecting portion 1408 ensures an electrical resistance from one side to the other.

In use, the resistance across the connecting portion 1408 is greater than the resistance across the first cell 1404. The resistance across the connecting portion 1408 is greater than the resistance across the second cell 1406. The first cell 1404 has a first characteristic resistance. The second cell 1406 has a second characteristic resistance. The resistance across the connecting portion 1408 is a third characteristic resistance that is greater than the first characteristic resistance across the first cell 1404. The third characteristic resistance is greater than the second characteristic resistance across the second cell 1406. The arrangement of having a greater resistance across the connecting portion 1408 between the first cell 1404 and the second cell 1406 allows charge from the first or second cell to be extracted from the first and second terminals, rather than being transferred between the first cell 1404 and the second cell 1406, across the connecting portion 1408.

Figure 20:
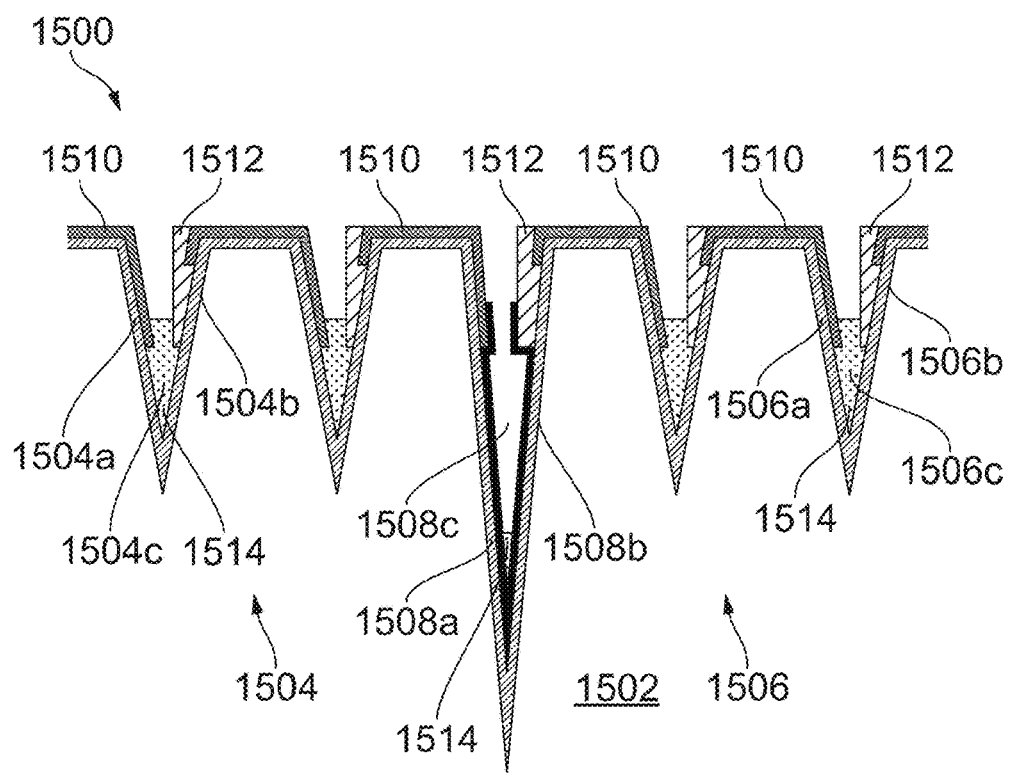
FIG. 20 illustrates a cross-section view of a two-terminal device according to another embodiment of the present invention.

FIG. 20 illustrates a two-terminal device 1500. The two-terminal device 1500 includes a substrate 1502. The substrate 1502 has a first cell 1504 and a second cell 1504 spaced apart from the first cell 1504 along the substrate 1502 along the web direction of the substrate 1502. The first cell 1504 and the second cell 1506 are as previously described with reference to FIG. 17, and therefore will not be described here again in detail. The substrate 1502 is provided with a first terminal and a second terminal as described with reference to FIG. 17, and therefore will also not be described here again in detail. A connecting portion is provided between the first cell 1504 and the second cell 1506. The connecting portion includes a channel 1508 provided with a first face 1508a, a second, opposing, face 1508b, and a cavity 1508c therebetween. The channel 1508 has a depth that is greater than the grooves of each of the first cell 1504 and the second cell 1506.

The first faces 1504a, 1506a, 1508a are coated with a first material 1510. The second faces 1504b, 1506b, 1508b are coated with a second material 1512. Additionally, a third material 1514 is provided within the cavities 1504c, 1506c, 1508c. The cavities 1504c, 1506c of the first cell 1504 and second cell 1506 respectively are filled to the extent that the first material 1510 and the second material 1512 on opposing faces (1504a, 1504b and 1506a, 1506b) are in contact with the third material 1514. This forms an electrical pathway across the first cell 1504, and across the second cell 1506.

Unlike the two-terminal device shown in FIG. 14, in which the cavity is fully filled by a material 1016, the walls, formed by faces 1508a, 1508b, of the cavity 1508c are coated with the third material 1514. The coating of the cavity 1508c is such that the third material 1514 in the cavity 1508c is electrically connected to the first material 1510 on the first face 1508a, and the second material 1512 on the second face 1508b. An electrical pathway is therefore provided between the first material 1510 on the first face 1508a of the connecting portion 1508, and the second material 1512 on the second face 1508b of the connecting portion 1508. The channel 1508 creates an electrical connection from one side to the other. That is, the channel 1508 electrically connects one side, proximal the first cell 1504, from the other side, proximal the second cell 1506.

In use, the resistance across the connecting portion is greater than the resistance across the first cell 1504. The resistance across the connecting portion is greater than the resistance across the second cell 1506. The first cell 1504 has a first characteristic resistance. The second cell 1506 has a second characteristic resistance. The resistance across the connecting portion is a third characteristic resistance that is greater than the first characteristic resistance across the first cell 1504. The third characteristic resistance is greater than the second characteristic resistance across the second cell 1506. This arrangement allows charge from the first or second cell to be extracted from the first and second terminals, rather than being transferred between the first cell 1504 and the second cell 1506, across the connecting portion 1508.

Figure 21:
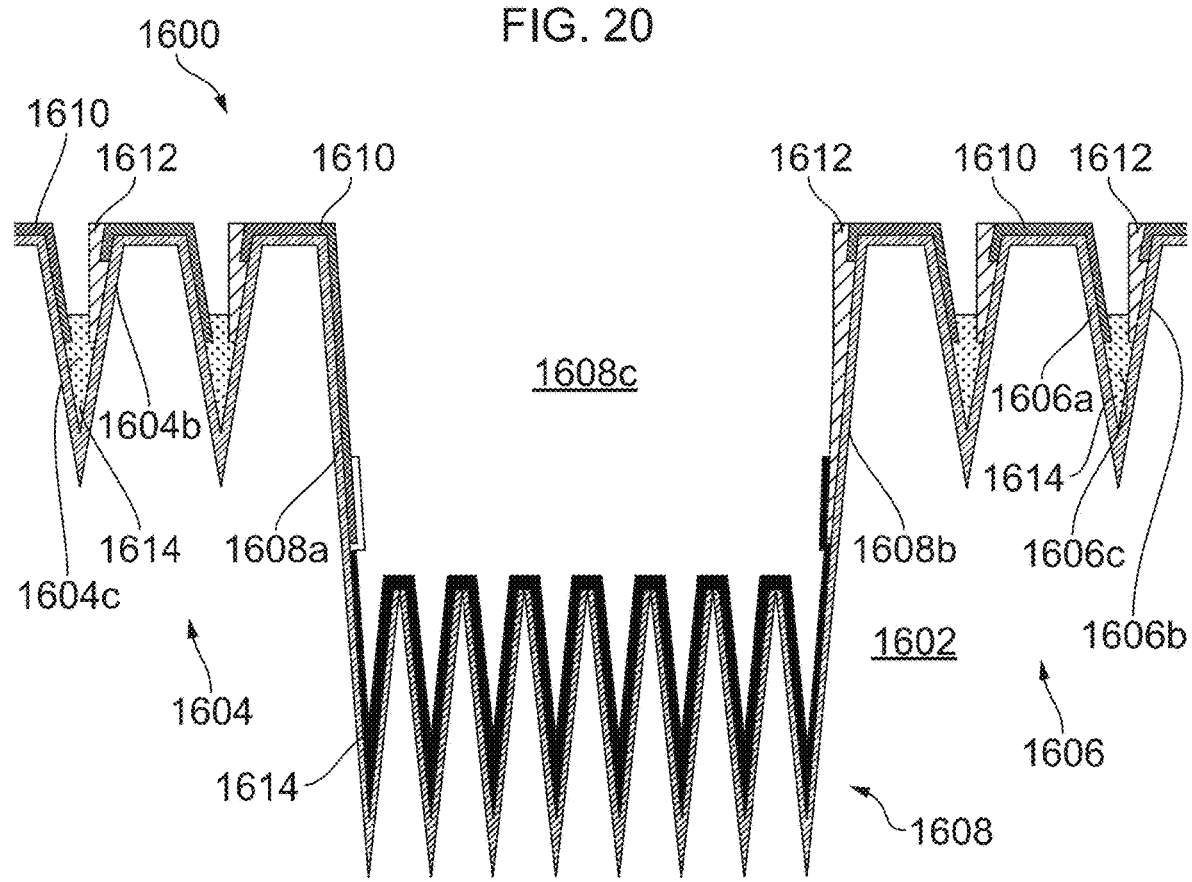
FIG. 21 illustrates a cross-section view of a two-terminal device according to a still further embodiment of the present invention.

FIG. 21 illustrates a two-terminal device 1600. The two-terminal device 1600 includes a substrate 1602 having a first cell 1604, a second cell 1606, a first terminal and a second terminal, as hereinbefore described with reference to FIG. 20, and therefore will not be described here again in detail. A connecting portion including channel 1608 is provided between the first cell 1604 and the second cell 1606. The channel 1608 is provided with a first face 1608a proximal the first cell 1604, and a second, opposing face 1608b proximal the second cell 1606. The channel 1608 is provided with a cavity 1608c between the first face 1608a and the second face 1608b. The first face 1608a of the channel 1608 and the second face 1608b of the channel 1608 extend a depth into the substrate 1602 greater than the depth of the grooves of the first cell 1604 and second cell 1606. In this particular example, the channel 1608 is substantially U-shaped, having the first face 1608a, the second face 1608b, and a bottom rutted portion. In this example, the bottom rutted portion is formed of eight undulations. The cavity 1608*c* of the channel 1608 is larger in size in comparison to the cavities 1604*c*, 1606*c* of the first cell 1604 and the second cell 1606 respectively. The greater size and the depth of the channel 1608 in comparison with the grooves of the first cell 1604 and the second 1606 provide a greater resistance across the connecting portion relative to the resistance across the first cell 1604 and the second cell 1606 respectively.

The first faces 1604*a*, 1606*a*, 1608*a* are coated with a first material 1610. The second faces 1604*b*, 1606*b*, 1608*b* are coated with a second material 1612. Additionally, a third material 1614 is provided within the cavities 1604*c*, 1606*c*, 1608*c*. The cavities 1604*c*, 1606*c* of the first cell 1604 and the second cell 1606 respectively, are filled to the extent that the first material 1610 and the second material 1612 on opposing faces (1604*a*, 1604*b* and 1606*a*, 1606*b*) are in contact with the third material 1614. This forms an electrical pathway across the grooves of the first cell 1604, and between the grooves of the second cell 1606.

In this particular example, each of the grooves of the bottom rutted portion, forming the cavity 1608*c*, is partially filled, for example coated, with the third material 1614. In this way, the third material 1614 forms a coating, or a conformed coating or a film, of the third material 1614 within the undulations of the channel 1608. Thus, the third material 1614 is in contact with the first material 1610 on the first face 1608*a*. The third material 1614 also contacts the second material 1612 on the second face 1608*b*. An electrical pathway is provided between the third material 1614 and the first material 1610 on the first face 1608*a*. An electrical pathway is provided between the third material 1614 and the second material 1612 on the second face 1608*b*. The connecting portion provides an electrical connection from one side to the other. That is, the connecting portion provides an electrical connection from one side of the connecting portion proximal the first cell 1604, to the other side of the connecting portion proximal the second cell 1606.

In use, the resistance across the connecting portion is greater than the resistance across the first cell 1604. The resistance across the connecting portion is also greater than the resistance across the second cell 1606. The first cell 1604 has a first characteristic resistance. The second cell 1606 has a second characteristic resistance. The resistance across the connecting portion has a third characteristic resistance that is greater than the first characteristic resistance across the first cell 1604. The third characteristic resistance across the connecting portion is greater than the second characteristic resistance across the second cell 1606. By having a resistance across the connecting portion that is greater than the resistance across the first cell 1604 and the second cell 1606, charge from the first or second cell is extracted from the first and second terminals, rather than being transferred across between the first cell 1604 and the second cell 1606.

Figure 22:
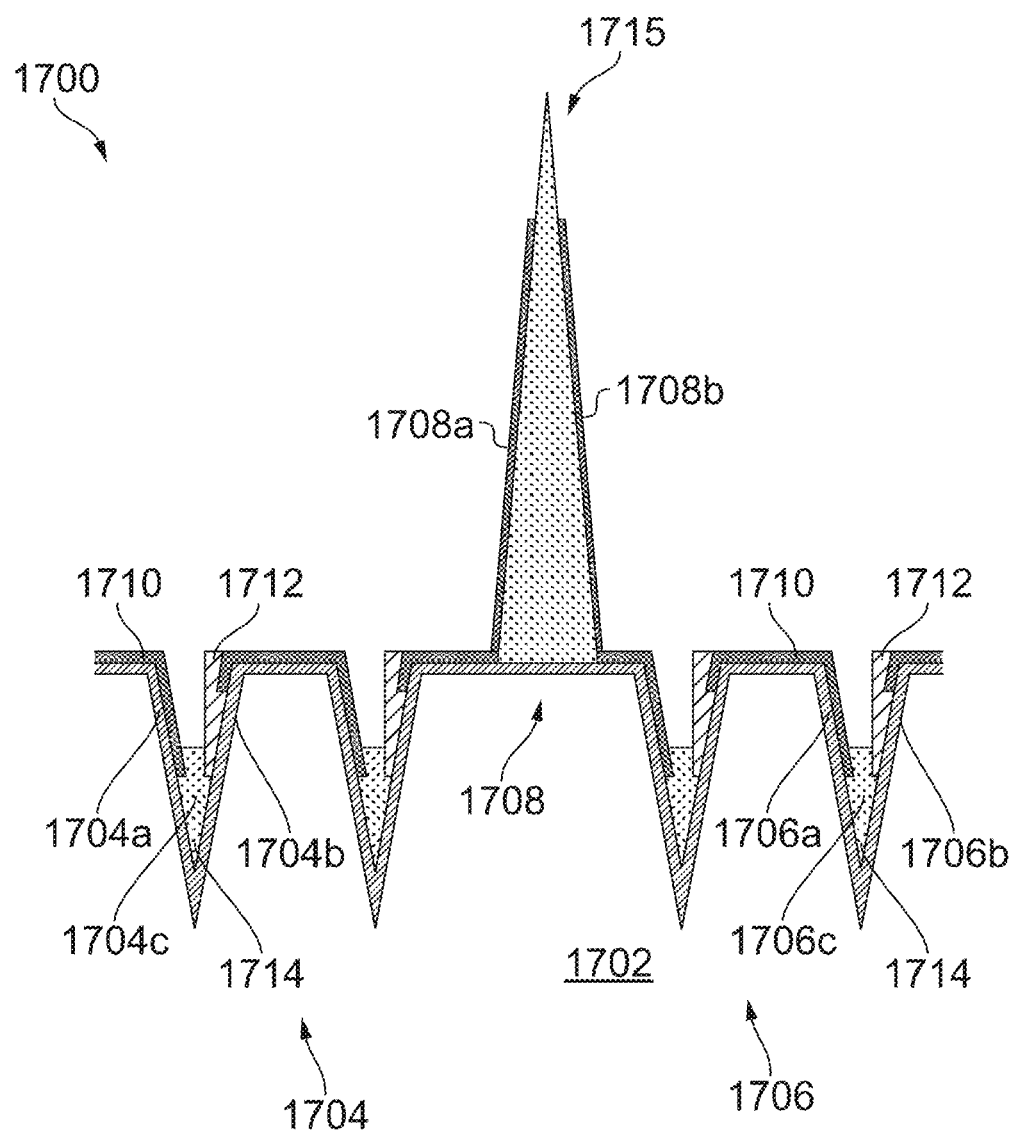
FIG. 22 illustrates a cross-section view of a two-terminal device according to another embodiment of the present invention.

FIG. 22 illustrates a two-terminal device 1700. The two-terminal device 1700 includes a substrate 1702. The substrate 1702 has a first cell 1704 and a second cell 1706 spaced apart from the first cell 1704 along the substrate 1702 along the web direction of the substrate 1702. The first cell 1704 and the second cell 1706 are as previously described with reference to FIG. 20, and therefore will not be described here again in detail. The substrate 1702 is provided with a first terminal and a second terminal. The first and second terminals are formed at opposing edges of the substrate 1702 across the transverse direction of the substrate 1702. The first and second terminals are electrically connected to the first cell 1704 and the second cell 1706. That is, the first and second terminals are in electrical communication with each of the first cell 1704 and the second cell 1706.

A connecting portion, including a peak 1708 of the substrate 1702 is provided between the first cell 1704 and the second cell 1706. The peak 1708 is provided with a first face 1708*a* and a second, opposing, face 1708*b*. In this example, the peak 1708 is directed upwards, in a direction opposite to the direction of the grooves of the first cell 1704 and the second cell 1706. The first face 1708*a* of the peak 1708 is provided on a side proximal the first cell 1704. The second face 1708*b* of the peak 1708 is provided on a side proximal the second cell 1706. The peak 1708 has a height that is greater than the depth of the grooves of each of the first cell 1704 and the second cell 1706. In this particular example, the peak 1708 is formed from a block material. having a first material disposed on the first face 1708*a* and a second material disposed on the second face 1708*b*. This first and second materials disposed thereon may be the same as the first and second material 1710, 1712 disposed on the faces 1704*a*, 1704*b*, 1706*a*, 1706*b* of the cells 1704, 1706 as described below. In particular, the first face 1708*a* may be coated with non-insulating material, such as a conductor. In particular, the second face 1708*b* may be coated with non-insulating material, such as a conductor. There may be a region between the first face 1708*a*, 1708*b* in which no material is provided, such as a gap. This may be provided by removing a portion of the materials provided on the first face 1708*a* and the second face 1708*b*. Alternatively, such a portion may be masked during manufacturing. Further, in other embodiments, the upper portion of the block material may be removed after coating the first face 1708*a* and the second face 1708*b*, thereby providing an electrical resistance, between the respective faces. In this example, the connecting portion does not have a cavity. The connecting portion includes a peak at an end distal the grooves of the first cell 1704 and the second cell 1706.

The first faces 1704*a*, 1706*a* of the first cell 1704 and second cell 1706 respectively, are coated with a first material 1710. The second faces 1704*b*, 1706*b* of the first cell 1704 and second cell 1706 respectively, are coated with a second material 1712. Additionally, a third material 1714 is provided within the cavities 1704*c*, 1706*c* of the first cell 1704 and second cell 1706 respectively. The cavities 1704*c*, 1706*c* are filled to the extent that the first material 1710 and the second material 1712 on opposing faces (1704*a*, 1704*b* and 1706*a*, 1706*b*) are in contact with the third material 1714. This forms an electrical pathway across the first cell 1704, and across the second cell 1706.

In use, the resistance across the connecting portion is greater than the resistance across the first cell 1704. The resistance across the connecting portion is greater than the resistance across the second cell 1706. The first cell 1704 has a first characteristic resistance and the second cell 1706 has a second characteristic resistance. The resistance across the connecting portion is a third characteristic resistance that is greater than the first characteristic resistance across the first cell 1704. The third characteristic resistance is greater than the second characteristic resistance across the second cell 1706. This arrangement allows charge from the first or second cell to be extracted from the first and second terminals, rather than being transferred between the first cell 1704 and the second cell 1706, across the connecting portion.

Figure 23:
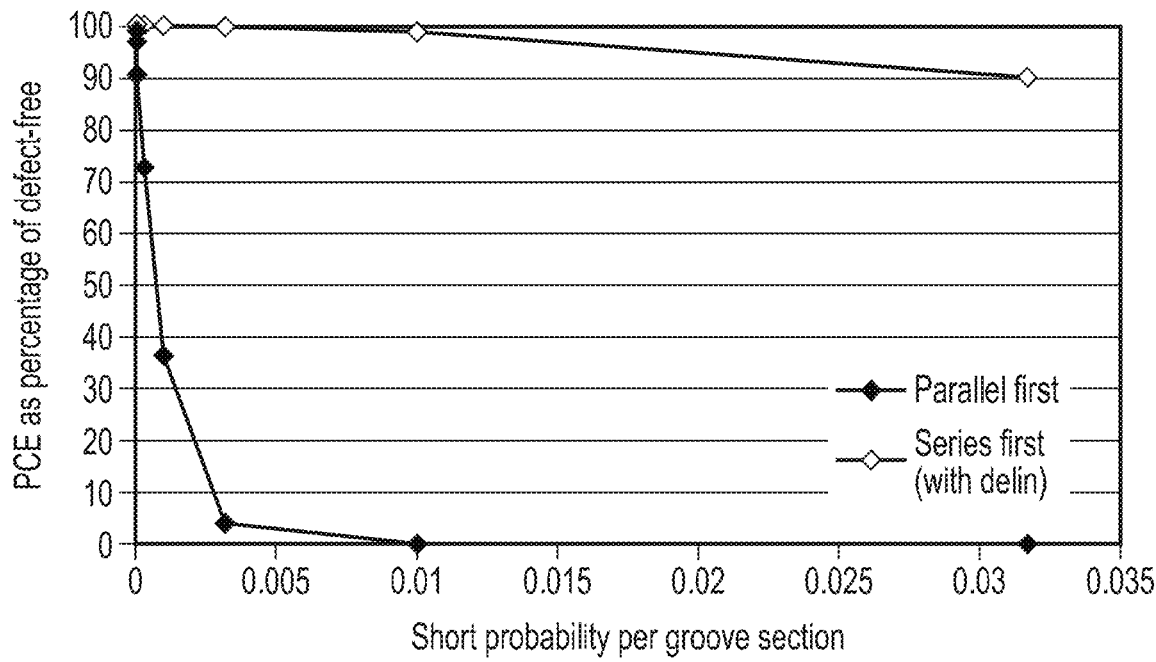
FIG. 23 illustrates a graph comparing the performances of the two-terminal device of FIG. 1 with the two-terminal device of FIGS. 2(a) and 3.

FIG. 23 illustrates a comparison between the two-terminal device described in relation to FIG. 1 ("parallel first") and the two-terminal device described in relation to FIGS. 2(*a*)

and 3 ("series first (with delin)"). FIG. 23 illustrates the performance of each device as a function of electrical short probability per groove section. The performance of a device is defined as a percentage or a fraction of incoming light energy converted into electrical energy (PCE). As can be seen in FIG. 23, the performance of the two-terminal device described in FIGS. 2(a) and 3 is far superior to that of the two-terminal device described in FIG. 1. In particular, the device of FIGS. 2(a) and 3 remains at a high operational performance even at high short probabilities per groove section. On the other hand, the operational performance of the device of FIG. 1 rapidly decreases with an increasing short probability per groove section. In this way, the two-terminal device as described herein has a superior performance over the prior art.

Figure 24:
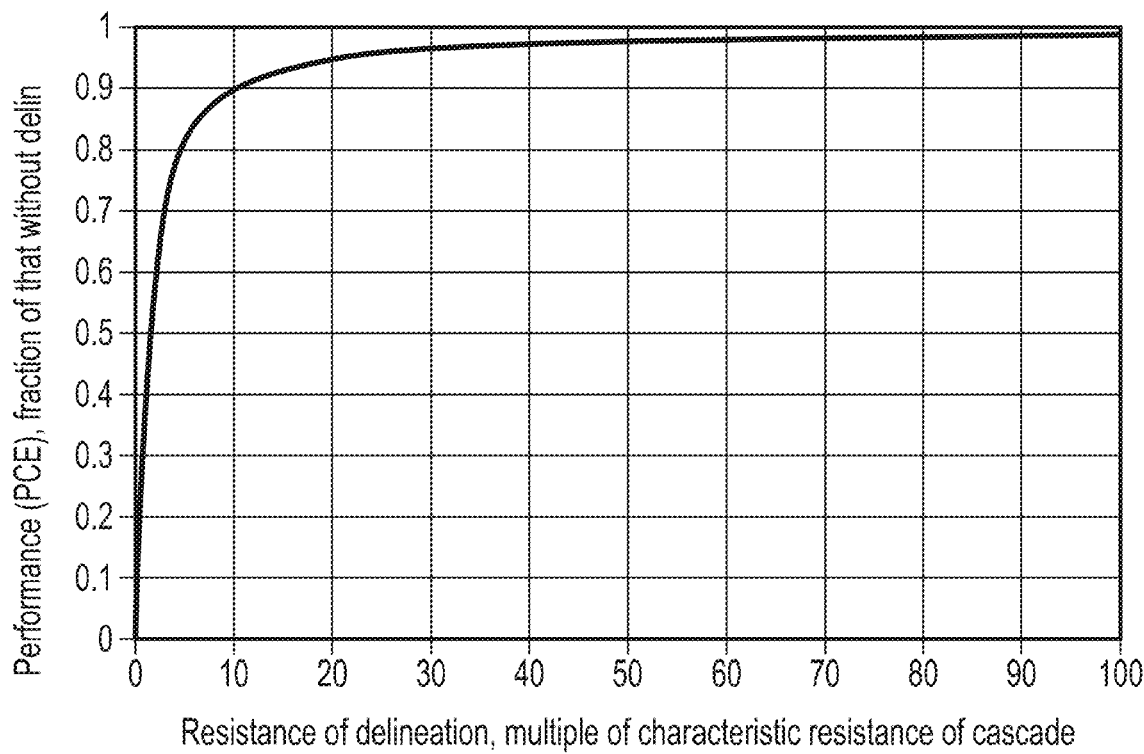
FIG. 24 illustrates a graph depicting the performance of a two-terminal device as described herein.

FIG. 24 illustrates the performance, specifically the fraction of optimal performance with respect to a two-terminal device without a delineation feature, as a function of the resistance of the delineation feature, specifically measured as a multiple of the characteristic resistance of the delineation feature with respect to the characteristic resistance of the adjacent grooves, for a two-terminal device described herein. As shown in FIG. 24, as the characteristic resistance of the delineation feature, that is the connecting portion, is increased with respect to the characteristic resistance of the adjacent grooves, the performance of the device tends towards the expected ideal performance.

Figure 25:
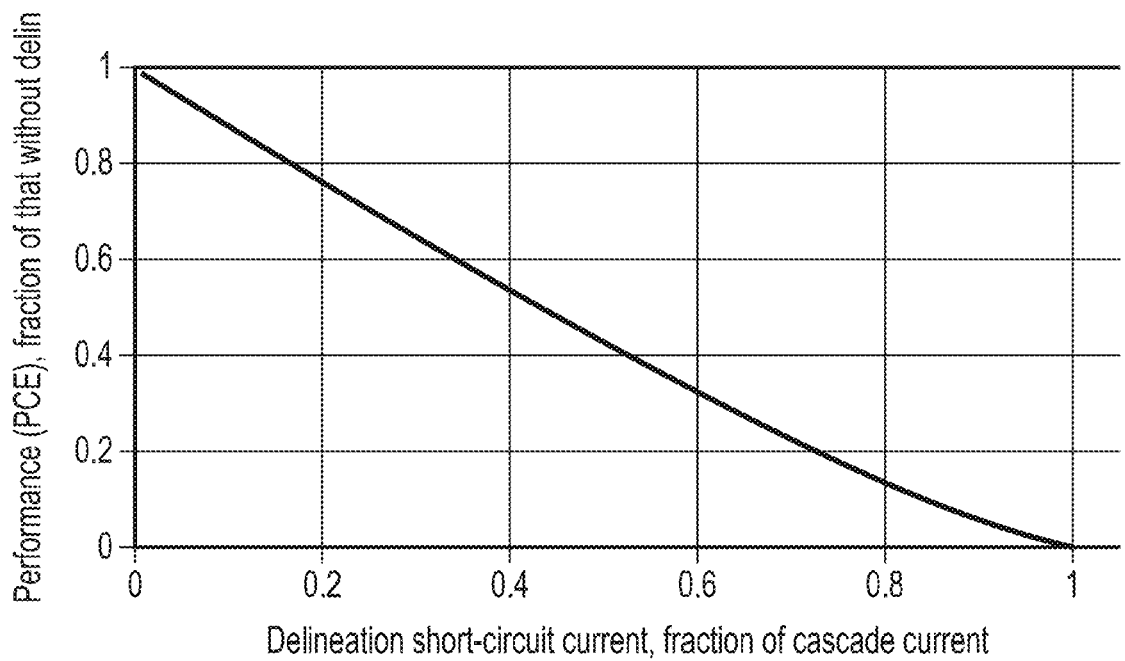
FIG. 25 illustrates yet another graph depicting the performance of a two-terminal device as described herein.

FIG. 25 illustrates the performance, specifically the fraction of optimal performance with respect to a two-terminal device without a delineation feature, as a function of the delineation short-circuit current, as a fraction of the current within a series of grooves. In particular, as described herein, the delineation feature acts as a reverse biased diode, and so the open-circuit voltage created is unimportant, as the operating voltage flows in the opposite direction. This is shown by the linear relationship between these functions, as demonstrated in FIG. 25.

It will be appreciated by persons skilled in the art that the above embodiment(s) have been described by way of example only and not in any limitative sense, and that various alterations and modifications are possible without departing from the scope of the invention as defined by the appended claims. Various modifications to the detailed designs as described above are possible, for example, variations may exist in number, shape, size, arrangement, assembly or the like. For example, any number of grooves and any number of series of grooves may be used, any number of channels, or delineation features, may be used. Further, the channel(s) may intersect the grooves at any appropriate angle and may be shaped in any appropriate way. Further, various grooves, channels, connecting portions or the like may be partially filled, filled, completely filled, or coating, as described herein. Mere reference to coating or filling in one embodiment does not preclude the possibility of filling or coating, respectively, the feature of said embodiment.

What is claimed is:

1. A two-terminal device, including a substrate comprising:
   a first cell having a first characteristic resistance, and a second cell, spaced apart from the first cell along a web direction of the substrate, having a second characteristic resistance;
   a first terminal and a second terminal, each terminal being formed towards or at opposing edges of the substrate across a transverse direction, and each terminal being in electrical communication with the first cell and the second cell;
   a connecting portion, between the first cell and the second cell, the connecting portion comprising a planar element on a surface of the substrate located between the first cell and the second cell, the connecting portion providing electrical connectivity between the first cell and the second cell, and the connecting portion having a third characteristic resistance;
   wherein the third characteristic resistance is greater than both the first characteristic resistance and the second characteristic resistance, such that an electrical charge from the first or second cell is extractable at the first terminal or the second terminal in preference to transferring between the first cell and the second cell across the connecting portion;
   wherein each of the first cell and the second cell comprises a series of grooves each including a first face and a second face, wherein the first faces are coated with a first material and the second faces are coated with a second material, and wherein the first material at least partially coats the connecting portion and the second material at least partially coats the connecting portion;
   wherein the first material and the second material at least partially coat the planar element, and wherein the planar element includes a gap between the first material and the second material.

2. The two-terminal device according to claim 1, wherein the third characteristic resistance is at least two times greater than at least one of the first characteristic resistance and the second characteristic resistance.

3. The two-terminal device according to claim 1, wherein the first material coating the connecting portion and the second material coating the connecting portion are electrically separated from one another.

4. The two-terminal device according to claim 1, wherein the connecting portion further comprises a discontinuous coating.

5. The two-terminal device according to claim 4, wherein the discontinuous coating is a non-insulating coating and forms a region of the connecting portion that is devoid of conductive material.

6. The two-terminal device according to claim 1, wherein the connecting portion further comprises at least one resistive element, wherein the at least one resistive element comprises a channel in the substrate.

7. The two-terminal device according to claim 6, wherein the channel is formed as a depression, an indentation, or an etch in the substrate.

8. The two-terminal device according to claim 7, wherein the first cell comprises a first series of grooves and the second cell comprises a second series of grooves, wherein the channel transects a portion of the first series of grooves and a portion of the second series of grooves, wherein the portion where the channel that transects the first series of grooves and the second series of grooves is located towards an end of each groove.

9. The two-terminal device according to claim 1, wherein the connecting portion further comprises at least one resistive element, wherein the at least one resistive element comprises a plurality of channels in the substrate.

10. The two-terminal device according to claim 9, wherein the first cell comprises a first series of grooves and the second cell comprises a second series of grooves, and wherein each channel of the plurality of channels transects a portion of the first series of grooves and a portion of the second series of grooves, wherein the portion where the channels transects the first series of grooves and the second series of grooves is located towards an end of each groove.

11. The two-terminal device according to claim 10, wherein the plurality of channels comprises a first channel, having a first channel characteristic resistance, a second channel, having a second channel characteristic resistance, and a third channel, having a third characteristic resistance, wherein the first channel characteristic resistance, the second channel characteristic resistance, and the third channel characteristic resistance provide substantially all of the third characteristic resistance.

12. The two-terminal device according to claim 1, wherein the first cell comprises at least one first groove and/or the second cell comprises at least one second groove, wherein the at least one first groove and/or the at least one second groove is at least partially filled with a third material, wherein the third material comprises one of a capacitor material, a supercapacitor material, a dielectric material, and/or a perovskite structured material.

13. The two-terminal device according to claim 12, wherein the at least one first groove and/or the at least one second groove is coated with a first material on a first face and/or is coated with a second material on a second face.

14. The two-terminal device according to claim 13, wherein the third material contacts the first material coated on the first face and/or the second material coated on the second face.

15. The two-terminal device according to claim 13, wherein the first material comprises at least one of a non-insulating material, a conductor material, a semiconductor material, and/or an electron transfer layer.

16. The two-terminal device according to claim 13, wherein the second material comprises at least one of a non-insulating material, a conductor material, a semiconductor material, and/or a hole transport layer.

17. The two-terminal device according to claim 12, wherein the third material comprises a perovskite structured material, and wherein the perovskite structured material has a general chemical structure of $ABX_3$, where A and B are two different cations of different sizes, and X is an anion that chemically bonds to both A and B.

18. The two-terminal device according to claim 17, wherein the perovskite structured material has an optical bandgap between 1.1 eV and 2.5 eV.

* * * * *